United States Patent
Kimura et al.

(10) Patent No.: US 8,686,774 B2
(45) Date of Patent: Apr. 1, 2014

(54) CONTROL CIRCUIT AND DATA HOLD DEVICE USING THE CONTROL CIRCUIT

(75) Inventors: Hiromitsu Kimura, Kyoto (JP); Yoshinobu Ichida, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 20 days.

(21) Appl. No.: 13/332,558

(22) Filed: Dec. 21, 2011

(65) Prior Publication Data
US 2012/0194230 A1 Aug. 2, 2012

(30) Foreign Application Priority Data
Dec. 21, 2010 (JP) ................................. 2010-284567

(51) Int. Cl.
*H03K 3/00* (2006.01)
(52) U.S. Cl.
USPC ............ 327/199; 327/215; 327/218; 327/291
(58) Field of Classification Search
USPC ......... 327/199, 202, 203, 215, 218, 219, 291; 365/145, 154
See application file for complete search history.

(56) References Cited

U.S. PATENT DOCUMENTS

| 6,314,016 B1 * | 11/2001 | Takasu | 365/145 |
| 6,650,158 B2 * | 11/2003 | Eliason | 327/203 |
| 2010/0124094 A1 * | 5/2010 | Kimura | 365/145 |

FOREIGN PATENT DOCUMENTS

| JP | 3737472 | 11/2005 |
| JP | 2009-206942 | 9/2009 |

* cited by examiner

*Primary Examiner* — Long Nguyen
(74) *Attorney, Agent, or Firm* — Fish & Richardson P.C.

(57) ABSTRACT

A control circuit 10 includes an internal clock generating portion (12), which starts generating an internal clock signal (LCLK) required by a control portion (11) to perform action when a specific signal pattern appears in a trigger signal, continually generates the internal clock signal (LCLK) at least before the control portion (11) completes predetermined processing, and then stops generating the internal clock signal (LCLK); and the control portion (11), which uses the internal clock signal (LCLK) to perform the predetermined processing.

5 Claims, 62 Drawing Sheets

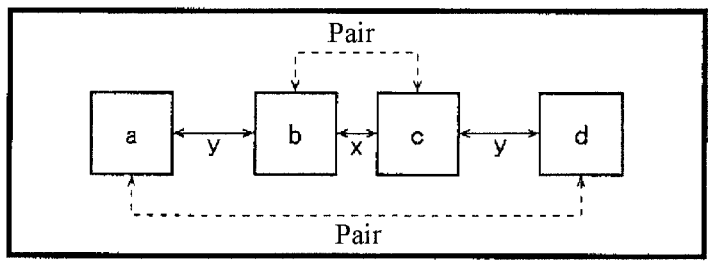
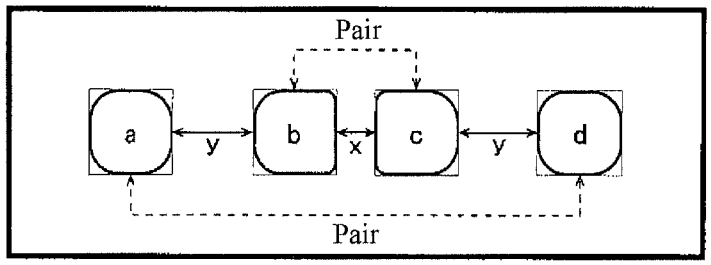
FIG. 22

(a)
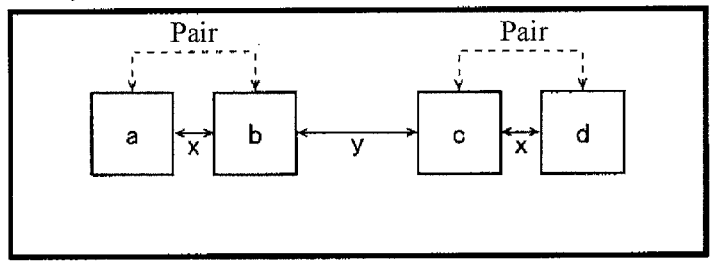
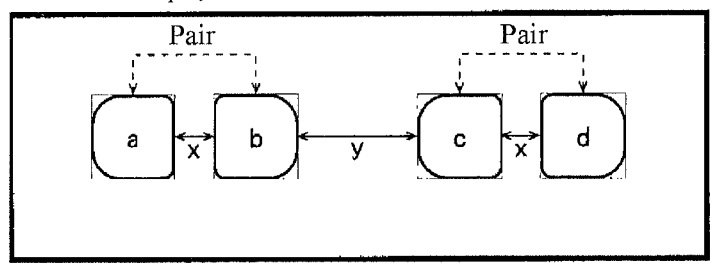
(b)
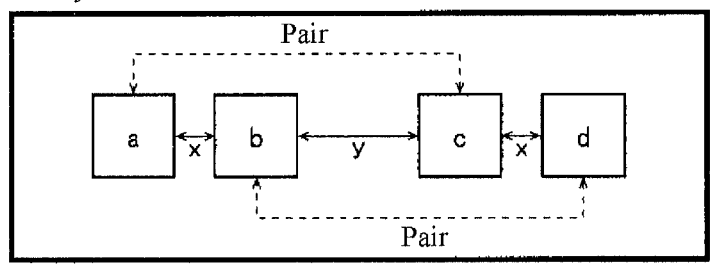
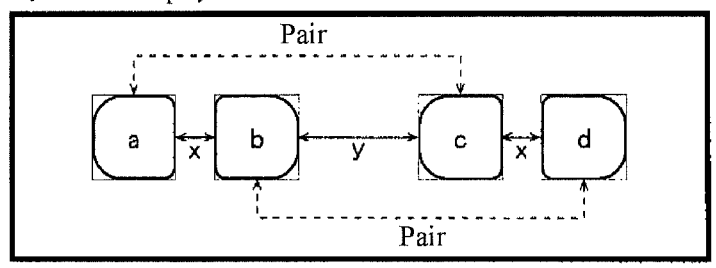
FIG. 23

(a)
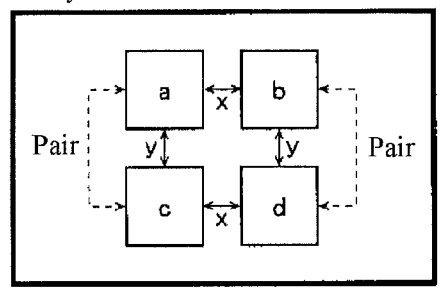 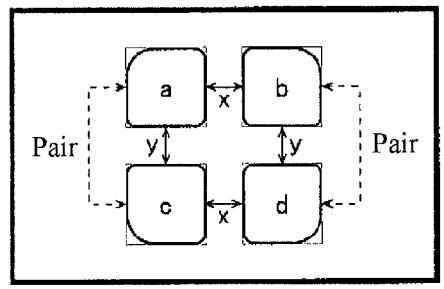
(b)
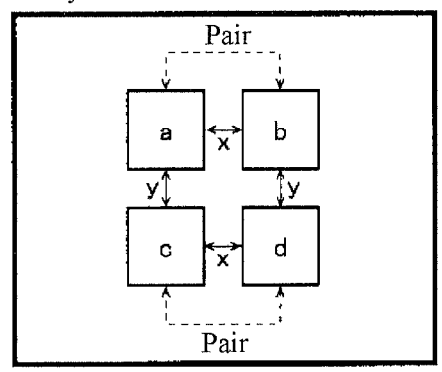 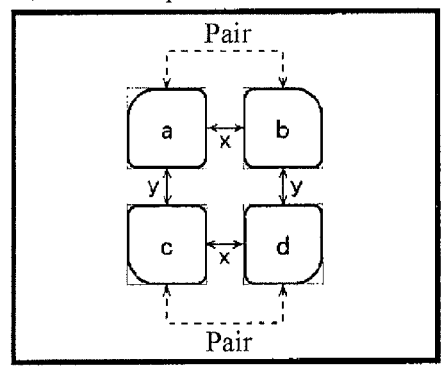
(c)
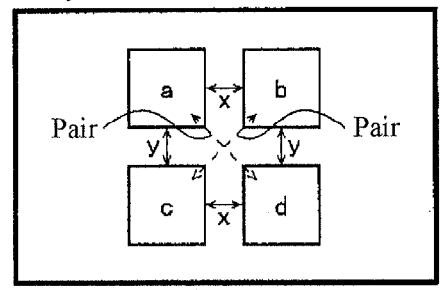 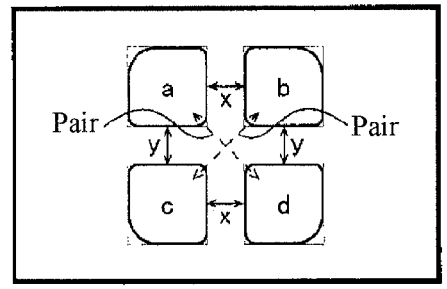
FIG. 24

| Function | Pin Name | I/O | Description |
| --- | --- | --- | --- |
| Logic Control | CP | IN | Clock |
| | D | IN | Data Input |
| | SN | IN | Preset |
| | RN | IN | Clear |
| | SD | IN | Scan Data Input |
| | SC | IN | Scan Control |
| Ferroelectrics Control | E1 | IN | Ferroelectrics Write Enable |
| | HS | IN | Data Hold |
| | SAE | IN | SA Enable |
| | FRSTU | IN | Ferroelectrics Reset (U) |
| | FRSTD | IN | Ferroelectrics Reset (D) |
| | PL1_D | IN | PL1 Digital Input |
| | PL2_D | IN | PL2 Digital Input |
| Ferroelectrics Test | TESTU | IN | PL1/ PL2 Analog Enable |
| | TESTD | IN | PL1/PL2 Analog Enable |
| | PL1U_A | IN | PL1U Analog Input |
| | PL2U_A | IN | PL2U Analog Input |
| | PL1D_A | IN | PL1D Analog Input |
| | PL2D_A | IN | PL2D Analog Input |
| Ferroelectrics Test | SO | OUT | Scan Output |
| | Q | OUT | Output |

FIG. 28

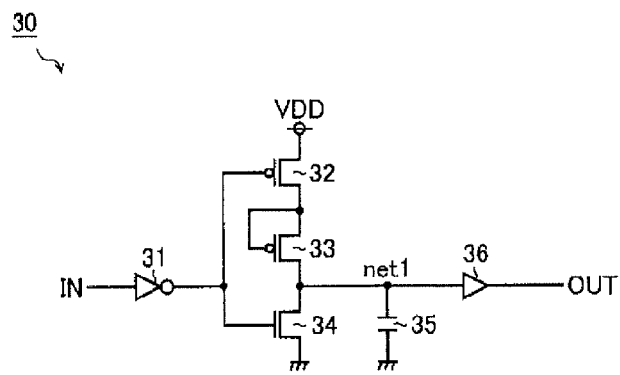
FIG. 62
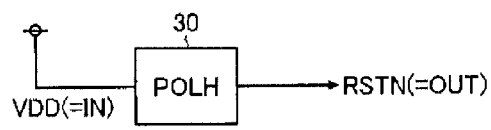
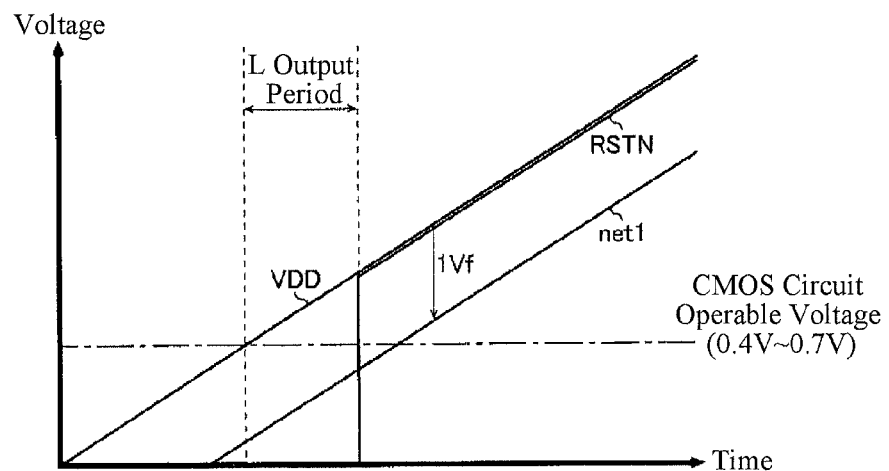
FIG. 63

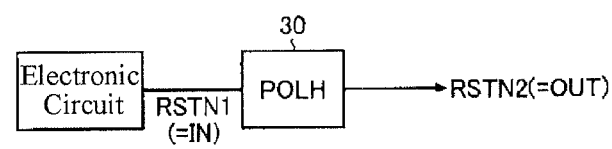
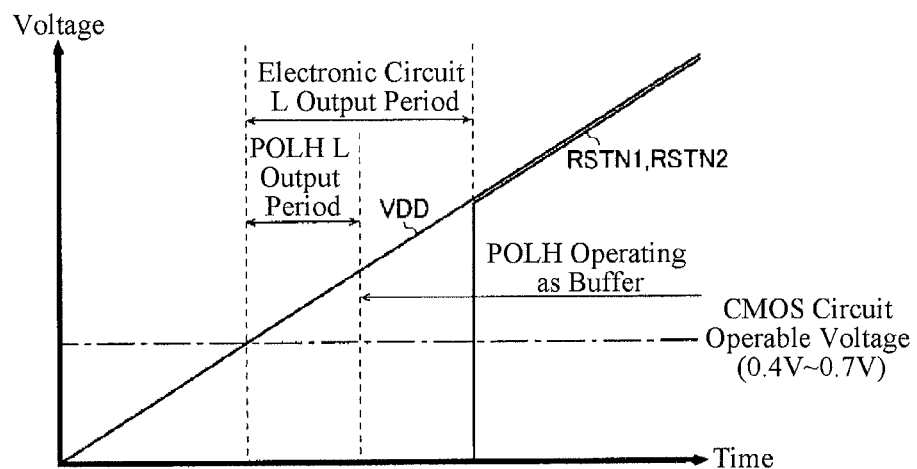
FIG. 64

CONTROL CIRCUIT AND DATA HOLD DEVICE USING THE CONTROL CIRCUIT

BACKGROUND OF THE INVENTION

1. Field of the Invention

The present invention relates to a control circuit and a data hold device using the control circuit.

2. Description of the Related Art

A data hold device used in a latch circuit such as a sequential circuit, for example, is a conventional circuit formed by connecting two inverting circuit loops in series. However, such data hold device can only hold data in a volatile manner. Thus, if the power is cut off, the data gets lost. That is, even it is powered on again, the data before power off cannot get recovered.

As a result, when using such latch circuit with the data hold device to conduct sequence process, in order to hold data, it is necessary to maintain the power on in case of interruption. This would result in electricity consumption. In addition, it has to re-run the operation process from the beginning on condition that the sequence process is interrupted for accidents such as power cut, which would result in a great loss of time.

In order to solve this problem, the applicant of the present invention has proposed and disclosed a data hold device using ferroelectric capacitor to hold data in a non-volatile manner in Patent Document 1.

FIG. 71 is a circuit diagram of an example of a conventional data hold device.

The data hold device in the drawing is formed by the connection of the signal wire (in a voltage signal form for holding data shown as the thick line part) in the storage element which includes the loop structure portion (the portion surrounded by dotted lines) having the inverter INVx and INVy to the ferroelectric element CL.

When the power is off, the voltage of the signal lines is used to set the residual polarization state of the ferroelectric element CL to write data to the ferroelectric element CL. Data can be held in a non-volatile manner even after power off by such write action.

On the other hand, when the data written into the ferroelectric element CL is read, the node N is in a floating state after power on. Voltage pulse is applied to one side of the ferroelectric element CL from the plate line PL, which makes the node N generates a voltage signal corresponding to the residual polarization state of the ferroelectric element CL. The voltage signal generated by node N perform data determination (0/1 determination) according to threshold of the inverter INVx.

In addition, other prior arts relevant to the present invention include patent document 2 given by the applicant of the present invention.

PRIOR ART DOCUMENTS

Patent Documents

Patent document 1: Specification of Japanese Patent No. 3737472

Patent document 2: Japanese Patent Laid-open Gazette No. 2009-206942

SUMMARY OF THE INVENTION

The conventional data hold devices can hold data even when the power is cut off. Therefore, they do have such an advantage.

However, in the conventional data hold device, the ferroelectric element CL executing normal operation in the storage element becomes a huge load capacitor existing on the signal lines. Thus it would cause the storage element to slow down or increase power consumption.

In addition, in the conventional data hold device, in order not to let the electric charge related to the residual polarization state of the ferroelectric element CL escape toward power lead or ground lead, the node N has to be set floating (two path switches SWx and SWy have to be opened). So among the conventional data hold devices, the drive clock signal of path switches SWx and SWy needs four kinds of clock signals (CKA/CKA/CKB/CKB), which can cause higher power consumption.

Furthermore, the conventional data hold device as shown in FIG. 71 and FIG. 72, uses capacity coupling between the ferroelectric element CL and the gate capacitance of the transistor of the inverter INVx to read out the voltage signal Vout corresponding to the residual polarization state of ferroelectric element CL. However, the capacitor (the solid line at the top right in FIG. 72) of ferroelectric element CL is a large capacitor (hundreds of F); by contrast, the gate capacitance (the solid line at the bottom right in FIG. 72) of transistor of the inverter INVx is a tiny capacitor (several F), as a result, the voltage signal Vout appears on node N is a smaller about 10~100 [mV]. With the viewpoint of element deviation, it is difficult to set the threshold of the inverter INVx to conduct 0/1 determination of reading data.

Besides, in the conventional CMOS circuits, if supply voltage drops until to 0.6 [V], a significant problem is that the supply voltage fluctuation generated as the power is turned on/off of the circuit block causes the data in the data hold device to change, namely for supply voltage fluctuation, whose margin will no longer exist.

In the non-volatility data hold device configured with ferroelectric element, the data hold action itself does not need supply voltage, and can eliminated the problem of data changing caused by supply voltage fluctuation. But with respect to the characteristics of ferroelectric element, it is hard to use 0.6 [V] supply voltage to drive ferroelectric element to write data into it. That is, when 0.6 [V] supply voltage is used to drive CMOS circuit, it is hard to use the same supply voltage to drive ferroelectric element.

On the contrary, when 3.3 [V] supply voltage is used to drive CMOS circuit, it would cause large amount of unnecessary electricity consumption to use the same supply voltage to drive ferroelectric element.

Moreover, in the conventional data hold devices, there are many issues to be discussed when the data hold devices are manufactured, for example, storage data of ferroelectric element may be damaged when the power was turned on/off; the clock input to loop structure must be stopped when store/recover data to ferroelectric element; analog characteristic assessment of ferroelectric element cannot be performed when the data hold device is configured into system and so on.

In addition, the conventional data hold devices have a built-in control circuit which is used for control data storage (backup)/recovery, but the control circuit needs an external signal for supervising data storage/recovery request all the time. So a clock suppler continuously generating a clock signal for the action of the control circuit must be set outside of the control circuit, which would cause the part number or cost to increase. Furthermore, in the conventional data hold devices, the control circuit is always performing action, which would result in such problem as the electricity consumption of the control circuit (further to result in the electricity consumption of the whole device) increase.

As for the above problems, the objective of the present invention is to provide a control circuit which can achieve the decrease of the part number of device and electricity consumption, and a data hold device using the control circuit.

In order to achieve the objective, the control circuit structure of the present invention includes: an internal clock generating portion and a control portion, the internal clock generating portion starting generating an internal clock signal required by the control portion to perform action when a specific signal pattern appears in a trigger signal, continually generating the internal clock signal at least before the control portion completes predetermined processing, and then stopping generating the internal clock signal; and the control portion using the internal clock signal to perform the predetermined processing. (the first structure).

And in the control circuit including the first structure, the control portion performs different processing on each of a plurality of signal patterns in the trigger signal (the second structure).

Besides, in the control circuit including the first or the second structure, the control portion further uses an external clock signal input externally to perform action in addition to the internal clock signal to perform action (the third structure).

Besides, in the control circuit including any one of the first to the third structure, the control portion has an action mode of outputting a control signal of a fixed value to a control object circuit unrelated to an internal state thereof (the fourth structure).

Besides, in the control circuit including any one of the first to the fourth structure, the internal clock generating portion uses a multi-segment connection structure of a logic element when generating the internal clock signal (the fifth structure).

Besides, in the control circuit including any one of the first to the fifth structure, the internal clock portion uses a loop structure of the element logic element when generating the internal clock signal (the sixth structure).

Besides, in the control circuit including any one of the first to the sixth structure, the internal clock generating portion includes a filter for filtering a specific component overlapping the trigger signal (the seventh structure).

Besides, in the control circuit including the seventh structure, the filter includes a capacitor (the eighth structure).

Besides, in the control circuit including the eighth structure, the capacitor is a ferroelectric capacitor (the ninth structure).

Besides, in the control circuit including the eighth or the ninth structure, the filter includes a discharge circuit for discharging the capacitor according to a reset signal (the tenth structure).

Besides, in the control circuit including any one of the first to the tenth structure, the internal clock generating portion includes a signal transmission control circuit for performing transmission control on the internal trigger signal (the eleventh structure).

Besides, in the control circuit including the eleventh structure, the signal transmission control is a latch circuit (the twelfth structure).

Besides, in the control circuit including the eleventh structure, the signal transmission control circuit is an OR operator (the thirteenth structure).

Besides, in the control circuit including any one of the first to the thirteenth structure, the control circuit further includes a reset portion for generating an internal reset signal. The internal reset signal is used to supervise a supply voltage and initialize the control portion and the internal clock generating portion (the fourteenth structure).

Besides, in the control circuit including the fourteenth structure, the reset portion maintains the internal reset signal at a low level during a period from the supply voltage reaching an operable voltage of a CMOS circuit to the supply voltage passing through a predetermined low level output period (the fifteenth structure).

Besides, in the control circuit including the fifteenth structure, the rest portion includes: a P-channel field effect transistor having a source connected to an applying end of the supply voltage and a gate connected to an input end of an input signal; a diode or a diode connection-type transistor, having an anode connected to a drain of the P-channel field effect transistor and a cathode connected to an output end of the internal reset signal; and an N-channel field effect transistor, having a source connected to a ground end, a gate connected to the input end of the input signal, and a drain connected to the output end of the internal reset signal (the sixteenth structure).

Besides, in the control circuit including the sixteenth structure, the reset portion further includes an inverter, the inverter is inserted between two gates of the P-channel field effect transistor and the N-channel field effect transistor and the input end of the input signal (the seventeenth structure).

Besides, in the control circuit including the sixteenth or the seventeenth structure, the reset portion further includes a capacitor; the capacitor is connected between the output end of the internal reset signal and the ground end (the eighteenth structure).

Besides, the data hold device of the present invention (the nineteenth structure) includes: a loop structure portion, holding data by using a plurality of logic gates connected in a loop form; a non-volatile storage portion, storing data held in the loop structure portion in a non-volatile manner by using hysteresis characteristic of the ferroelectric element; and a circuit separating portion, electrically separating the loop structure portion and the non-volatile storage portion; furthermore, it also includes the control circuit including any one of the first to the eighteenth structure, the control circuit generates the control signals for the loop structure portion, the non-volatile storage portion and the circuit separating portion.

Moreover, in the data hold device including the nineteenth structure, the non-volatile storage portion includes a switch element; the switch element causes short circuit between two ends of the ferroelectric element and a ground end when the supply of the data hold device is switched on/off (the twentieth structure).

Besides, in the data hold device including the twentieth structure, the data device further includes the a protection signal protection signal generating circuit; the protection signal generating circuit generates a protection signal switching on the switch element when the supply of the data hold device is switched on/off (the twenty-first structure).

Besides, in the data hold device including the twenty-first structure, the switch element is an N-channel field effect transistor; the protection signal protection signal generating circuit maintains the protection signal at a high level till the supply voltage at least reaches the operable voltage of the CMOS circuit (the twenty-second structure).

Besides, in the data hold device including the twenty-second structure, the protection signal protection signal generating circuit includes: a P-channel field effect transistor, having a source connected to an applying end of the supply voltage, a gate connected to an input end of an input signal, and a drain connected to an output end of the protection signal; and an N-channel field effect transistor, having a source connected to the ground end, a gate connected to the input end of the input signal, and a drain connected to the output end of the protection signal; and a connecting resistance of the P-channel field effect transistor is less than that of the N-channel field effect transistor. (the twenty-third structure).

The Effect of the Present Invention

According to the present invention, a control circuit is provided and the control circuit achieves the decrease of the part number and the electricity consumption, and a data hold device using the control circuit is provided.

BRIEF DESCRIPTION OF THE DRAWINGS

The invention will be described according to the appended drawings in which:

FIG. 22 illustrates a schematic diagram showing the first layout example of cell pattern.

FIG. 23 illustrates a schematic diagram showing the second layout example of cell pattern.

FIG. 24 illustrates a schematic diagram showing the third layout example of cell pattern.

FIG. 28 represents a function table showing the pin used by the data hold device of the fifth embodiment.

FIG. 62 is a circuit diagram showing one structure example of POLH circuit.

FIG. 63 is a diagram showing the first application example of the POLH circuit 30.

FIG. 64 is a diagram showing the second application example of the POLH circuit 30.

FIG. 69 represents the characteristics showing current Ip and In.

PREFERRED EMBODIMENT OF THE PRESENT INVENTION

Data Hold Device

Figure 1:
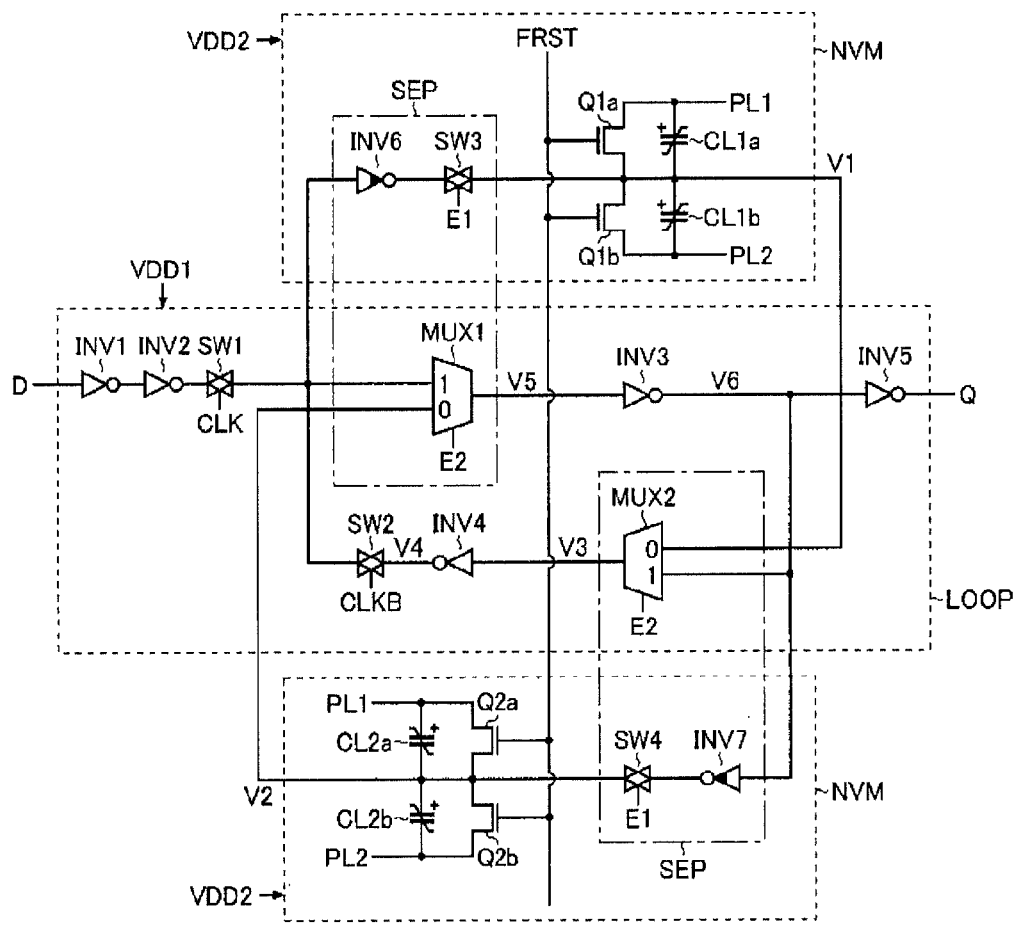
FIG. 1 is a circuit diagram showing an embodiment of the data hold device of the present invention.

FIG. 1 is a circuit diagram showing an embodiment of a data hold device in the present invention.

As shown in FIG. 1, the data hold device in this embodiment is a latch circuit including inverters INV1-INV7, path switches SW1~SW4, multiplexers MUX1 and MUX2, N-channel field effect transistors Q1a, Q1b, Q2a and Q2b, and ferroelectric elements (ferroelectric capacitors) CL1a, CL1b, CL2a and CL2b.

The input end of the inverter INV1 is connected with the applying end of a data signal (D), while the output end of the inverter INV1 is connected with the input end of the inverter INV2. The output end of the inverter INV2 is connected with the first input end (1) of the multiplexer MUX1 through the path switch SW1. The output end of the multiplexer MUX1 is connected with the input end of the inverter INV3, the output end of which is connected with the input end of the inverter INV5. The output end of the inverter INV5 is connected with the draw-out end of an output signal (Q). The first input end (1) of the multiplexer MUX2 is connected with the output end of the inverter INV3. And the output end of the multiplexer MUX2 is connected with the input end of the inverter INV4, the output end of which is connected with the first input end (1) of the multiplexer MUX1 through the path switch SW2.

Thus, the data hold device in this embodiment has a loop structure portion LOOP, namely two loop-shaped linked logic gates (inverters INV3 and INV4 in FIG. 1) are used to hold an input data signal D.

Furthermore, the loop structure portion LOOP is driven through supplying with a first supply voltage VDD1 (e.g. 0.6[V]).

The input end of the inverter INV6 is connected with the first input end (1) of the multiplexer MUX1, while the output end thereof is connected with the second input end (0) of the multiplexer MUX2 via the path switch SW3. And the input end of the inverter INV7 is connected with the first input end (1) of the multiplexer MUX2, while the output end thereof is connected with the second input end (0) of the multiplexer MUX1 via the path switch SW4.

The positive pole end of the ferroelectric element CL1a is connected with a first plate line PL1, while the negative pole end thereof is connected with the second input end (0) of the multiplexer MUX2. The transistor Q1a is connected between two ends of the ferroelectric element CL1a. And the gate of the transistor Q1a is connected with the applying end of an F reset signal FRST.

The positive pole end of the ferroelectric element CL1b is connected with the second input end (0) of the multiplexer MUX2, while the negative pole end thereof is connected with a second plate line PL2. The transistor Q1b is connected between two ends of the ferroelectric element CL1b. And the gate of the transistor Q1b is connected with the applying end of the F reset signal FRST.

The positive pole end of the ferroelectric element CL2a is connected with the first plate line PL1, while the negative pole end thereof is connected with the second input end (0) of the multiplexer MUX1. The transistor Q2a is connected between two ends of the ferroelectric element CL2a. And the gate of the transistor Q2a is connected with the applying end of the F reset signal FRST.

The positive pole end of the ferroelectric element CL2b is connected with the second input end (0) of the multiplexer MUX1, while the negative pole end thereof is connected with the second plate line PL2. The transistor Q2b is connected between two ends of the ferroelectric element CL2b. And the gate of the transistor Q2b is connected with the applying end of the F reset signal FRST.

Therefore, the data hold device in this embodiment includes a non-volatile storage portion NVM, namely the hysteresis characteristics of the ferroelectric elements (CL1a, CL1b, CL2a and CL2b) are used to store data D held in the loop structure portion LOOP in a non-volatile manner.

Furthermore, the non-volatile storage portion NVM is driven through supplying with a second supply voltage VDD2 (e.g. 1.2[V]), which is higher than the first supply voltage VDD1.

And in the structure elements, the path switch SW1 is switched on/off according to a clock signal CLK, and the path switch SW2 is switched on/off according to a reverse-clock signal CLKB (a logic reverse signal of a clock signal CLK). That is the path switch SW1 and the path switch SW2 are respectively switched on/off exclusively (complementarily).

On the other hand, the path switches SW3 and SW4 are both switched on/off according to a control signal E1. And the multiplexers MUX1 and MUX2 switch over their signal paths according to a control signal E2. That means in the data hold device in this embodiment, the multiplexers MUX1 and MUX2, the inverters INV6 and INV7, and the path switches SW3 and SW4 work as a circuit separating portion SEP for electrically separating the loop structure portion LOOP and the non-volatile storage portion NVM.

Besides, in the circuit elements forming the circuit separating portion SEP, the multiplexers MUX1 and MUX2 contained in the loop structure portion LOOP are driven through supplying with the first supply voltage VDD1, and the path switches SW3 and SW4 contained in the non-volatile storage portion NVM are driven through supplying with the second supply voltage VDD2.

In addition, the inverters INV6 and INV7 are driven through supplying with both the first supply voltage VDD1 and the second supply voltage VDD2, and work as a level shifter for shifting the voltage level of data D exchanged between the loop structure portion LOOP and the non-volatile storage portion NVM.

Figure 2:
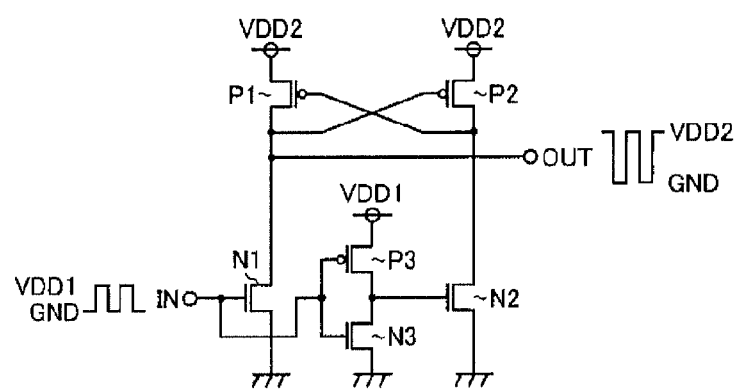
FIG. 2 is circuit diagram showing an example of the inverter INV6 (the same with inverter INV7) having a level shifting function.

FIG. 2 is a circuit diagram showing a structural example of the inverter INV6 (as well as the inverter INV7) having a level shifting function.

As shown in FIG. 2, the inverter INV6 (INV7) includes P-channel MOS field effect transistors P1~P3 and N-channel MOS field effect transistors N1~N3. The gate of the transistor N1 is connected with an input end IN, the source thereof is connected with a ground end, and the drain thereof is connected with the drain of the transistor P1 and further connected with an output end OUT. The sources of the transistors P1 and P2 are both connected with the applying end of the second supply voltage VDD2. The gate of the transistor P1 is connected with the drain of the transistor P2. The gate of the transistor P2 is connected with the drain of the transistor P1, and the drain thereof is connected with the drain of the transistor N2, the source of which is connected with the ground end. The gates of the transistors P3 and N3 are both connected with the input end IN. The source of the transistor P3 is connected with the applying end of the first supply voltage VDD1, and the drain thereof is connected with the drain of the transistor N3 and further connected with the gate of the transistor N2. And the source of the transistor N3 is connected with the ground end.

In the inverter INV6 (INV7), the transistors N1 and P2 turn to be switched on and the transistors N2 and P1 turn to be switched off when a logic signal at a high level (the first supply voltage VDD1) is input into the input end IN, so that a logic signal at a low level (the ground voltage GND) is output from the output end OUT. On the contrary, the transistors N1 and P2 turn to be switched off and the transistors N2 and P1 turn to be switched on when a logic signal at a low level (the ground voltage GND) is input into the input end, so that a logic signal at a high level (the second supply voltage VDD2) is output from the output end OUT. Namely, the inverters INV6 (INV7) increases the high-level potential thereof from the first supply voltage VDD1 to the second supply voltage VDD2 for outputting after logically reversing the logic signal input into the input end IN.

The actions of the data hold device are illustrated in following details. Additionally, signs are added for the node voltages of portions in the following illustration, namely, the voltage at the connecting node of the ferroelectric elements CL1a, CL1b is set to be V1 and the voltage at the connecting node of the ferroelectric elements CL2a and CL2b is set to be V2; the voltage at the input end of the inverter INV4 is set to be V3, and the voltage at the output end thereof is set to be V4; the voltage at the input end of the inverter INV3 is set to be V5, and the voltage at the output end thereof is set to be V6.

Figure 3:
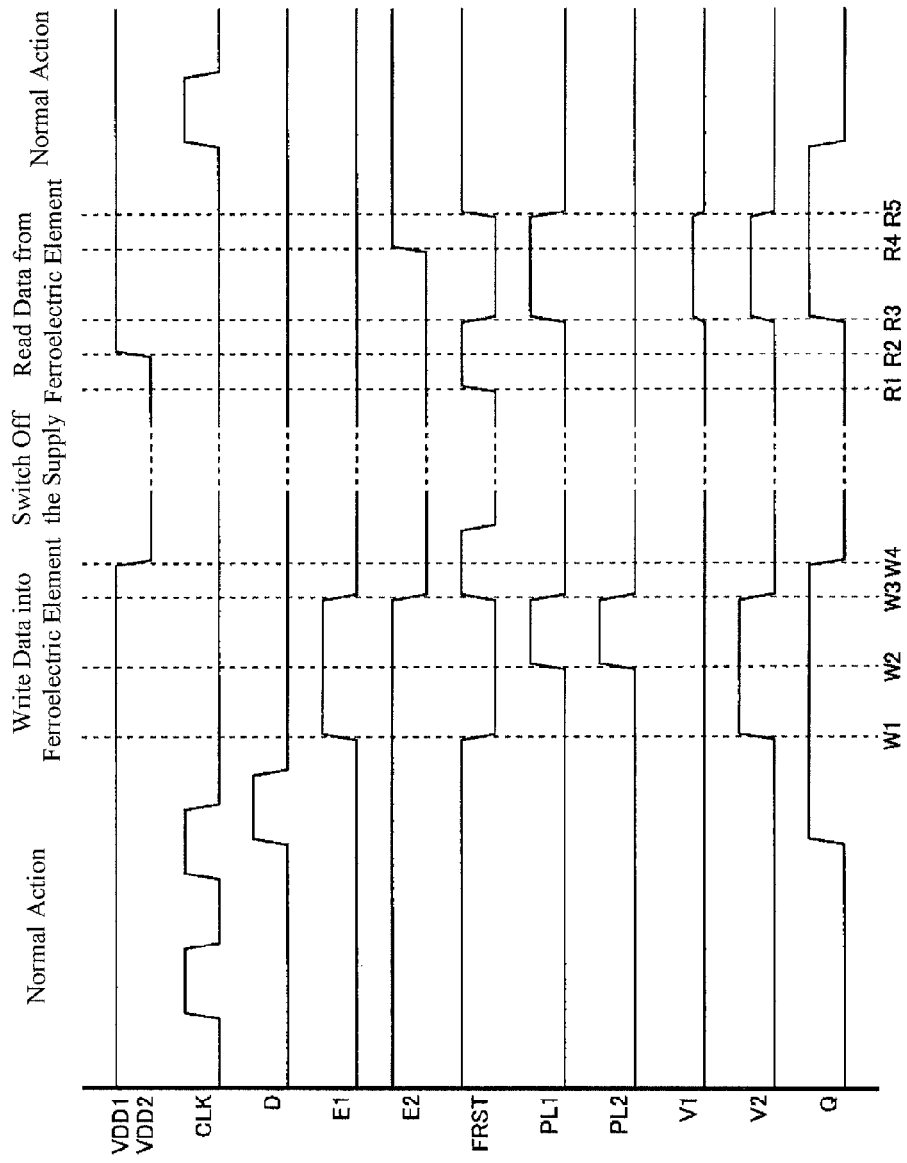
FIG. 3 is a sequence diagram showing an action of the data hold device of the present invention.

FIG. 3 is a sequence diagram for illustrating an action example of the data hold device in the present invention, which shows the voltage waveforms of the supply voltages (VDD1 and VDD2), the clock signal CLK, the data signal D, the control signal E1, the control signal E2, the F reset signal FRST, the applying voltage of the first plate line PL1, the applying voltage of the second plate line PL2, the node voltage V1, the node voltage V2 and the output signal Q from the top to the bottom.

The normal actions of the data hold device is illustrated at first.

Until the time point W1, the F reset signal FRST is "1 (high level: VDD2)", the transistors Q1a, Q1b, Q2a and Q2b are switched on, and two ends of each of the ferroelectric elements CL1a, CL1b, CL2a and CL2b are in short circuit, thus the ferroelectric elements CL1a, CL1b, CL2a and CL2b are at the state of not applying any voltage. Furthermore, the first plate line PL1 and the second plate line PL2 are both "0 (low level: GND)".

Besides, unit the time point W1, the control signal E1 is "0 (GMD)", and the path switch SW3 and the path switch SW4 are switched off, thus the data writing-in drivers (inverters INV6 and INV7) are both out of work.

Furthermore, until the time point W1, the control signal E2 is "1 (VDD1)", and the first input ends (1) of the multiplexer MUX1 and the multiplexer MUX2 are selected, so that a normal loop is formed in the loop structure portion LOOP.

Therefore, in the high-level period of the clock signal CLK, the path switch SW1 is switched on and the path switch SW2 is switched off, the data signal D is thus used as the form for the output signals Q to pass through directly. On the other hand, in the low-level period of the clock signal CLK, the path switch SW1 is switched off and the path switch SW2 is switched on, thus the data signal D at the falling edge of the clock signal CLK is the form for locking.

Figure 4:
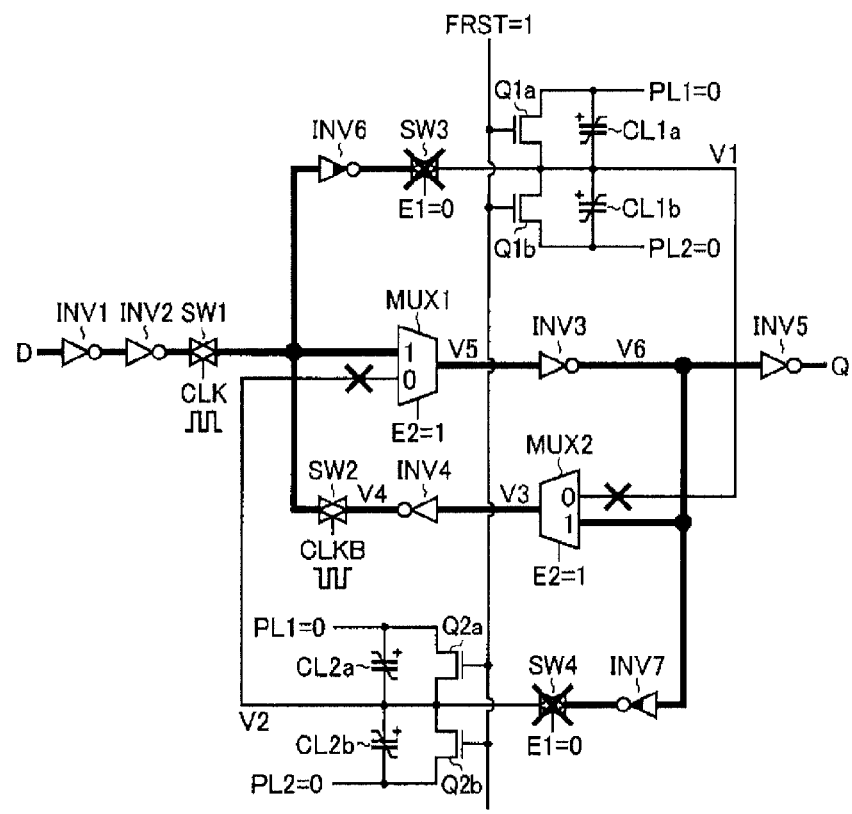
FIG. 4 is a circuit diagram showing signal path during normal action.

Additionally, FIG. 4 is a circuit diagram showing the signal path (painted by a thick line in the figure) during the normal actions.

Actions for writing data into the ferroelectric elements are illustrated as follows.

In the period from time point W1 to time point W3, the clock signal CLK is "0 (GND)", and the reverse-clock signal CLKB is "1 (VDD1)". Thus, the first path switch SW1 is switched off, while the second path switch is switched on. Therefore, the action stability for writing data into the ferroelectric elements can be improved through pre-fixing the logics of the clock signal CLK and the reverse-clock signal CLKB.

Furthermore, in the period from the time point W1 to time point W3, the F reset signal FRST is "0 (GND)", and the transistors Q1a, Q1b, Q2a and Q2b are switched off so as to turn to the state capable of applying a voltage to the ferroelectric elements CL1a, CL1b, CL2a and CL2b.

And in the period from the time point W1 to time point W3, the control signal E1 is "1 (VDD2)" and the path switch SW3 and the path switch SW4 are switched on. Thus, the data writing-in drivers (inverters INV6 and INV7) are both at work.

Besides, in the period from the time point W1 to time point W3, it is the same as before that the control signal E2 is "1 (VDD2)" and the first input ends (1) of the multiplexer MUX1 and multiplexer MUX2 are selected, thus, a normal loop is formed in the loop structure portion LOOP.

Furthermore, in the period from the time point W1 to time point W2, the first plate line PL1 and the second plate line PL2 are "0 (GND)", and in the period from the time point W2 to time point W3, the first plate line PL1 and the second plate line PL2 are "1 (VDD2)". That means the same pulse voltages are applied to the first plate line PL1 and the second plate line PL2. And the residual polarization state in the ferroelectric elements is set to be either reverse state or non-reverse state through applying the pulse voltages.

If the detailed illustration is given according to the example in FIG. 3, the output signal Q at the time point W1 is "1 (VDD1)", thus the node voltage V1 turns into "0 (GND)", and the node voltage V2 turns into "1 (VDD2)". Therefore, in the period from the time point W1 to time point W2 and in the period that the first plate line PL1 and the second plate line PL2 are "0 (GND)", the state between two ends of each of the ferroelectric elements CL1a and CL1b turns into the state of not applying voltage, that between two ends of the ferroelectric element CL2a turns into the state applied with negative-polar voltage, and that between two ends of the ferroelectric element CL2b turns into the state applied with positive-polar voltage. On the other hand, in the period from the time point W2 to time point W3 and in the period that the first plate line PL1 and the second plate line PL2 are "1 (VDD2)", the state between each of the ferroelectric elements CL2a and CL2b turns into the state of not applying voltage, that between two ends of the ferroelectric element CL1a turns into the state applied with positive-polar voltage, and that between two ends of the ferroelectric element CL1b turns into the state applied with negative-polar voltage.

Then, the residual polarization state in the ferroelectric elements is set to be either reverse state or non-reverse state through applying pulse voltages to the first plate line PL1 and the second plate line PL2. Furthermore, the residual polarization states of the ferroelectric elements CL1a and CL1b, and those of the ferroelectric elements CL2a and CL2b are respectively contrary to each other. And the residual polarization states of the ferroelectric elements CL1a and CL2a, and those of the ferroelectric elements CL1b and CL2b are respectively contrary to each other.

At the time point W3, the F reset signal FRST is "1 (VDD2)" again, so that the transistors Q1a, Q1b, Q2a and Q2b are switched on and two ends of each of the ferroelectric elements CL1a, CL1b, CL2a and CL2b are in short circuit, thus the ferroelectric elements CL1a, CL1b, CL2a and CL2b turn into the state of not applying any voltage. Meanwhile, the first plate line PL1 and the second plate line PL2 are both "0 (GND)".

And at the time point W3, the control signal E1 is "0 (GND)" again, and the path switch SW3 and the path switch SW4 are switched off, thus the data writing-in drivers (inverters INV6 and INV7) are both out of work. Besides, although it is not important, the control signal E2 is "0 (GND)" in the example in FIG. 3.

In addition, at the time point W4, the action for supplying the first supply voltage VDD1 to the loop structure portion LOOP and that for supplying the second supply voltage VDD2 to the non-volatile storage portion NVM are both stopped. At that time, the F reset signal FRST is maintained at "1 (VDD2)" from the time point W3, the transistors Q1a, Q1b, Q2a and Q2b are switched on, and two ends of each of the ferroelectric elements CL1a, CL1b, CL2a and CL2b are in short circuit. Therefore, the ferroelectric elements CL1a, CL1b, CL2a and CL2b turn to the state of not applying any voltage, so that unexpected voltage will not be applied on the ferroelectric elements CL1a, CL1b, CL2a and CL2b even under the condition of voltage change when the supply is cut off so as to avoid data change.

Figure 5:
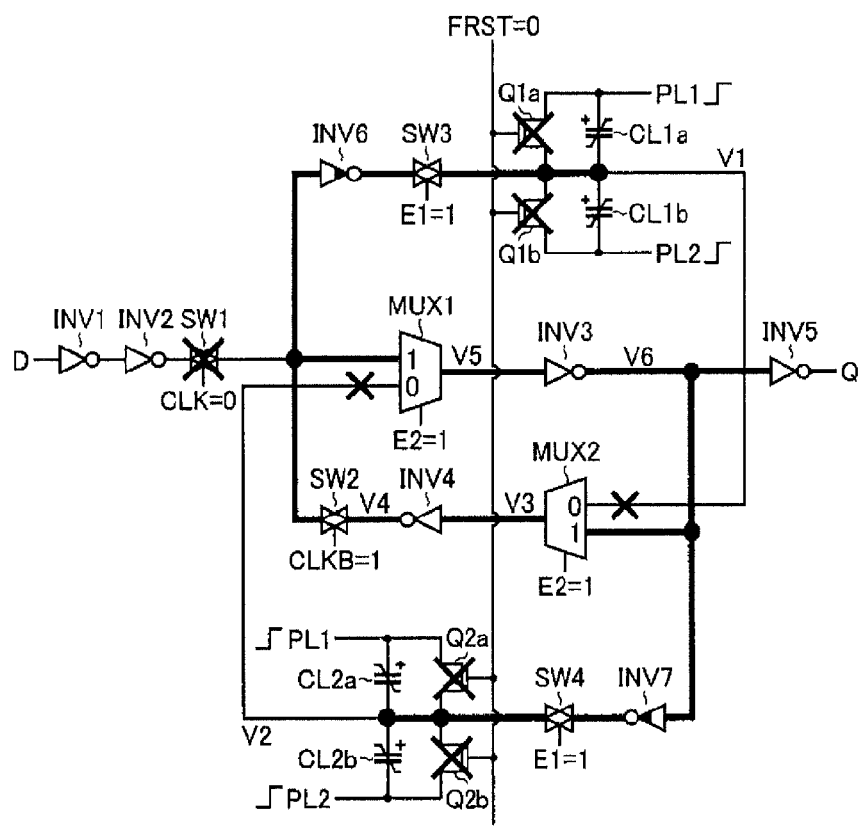
FIG. 5 illustrates a circuit diagram showing signal path during data writing action.

Besides, FIG. 5 is a circuit diagram showing the signal path (painted by a thick line in the figure) during the data writing-in action (especially from the time point W1 to time point W3).

The action for reading data from the ferroelectric elements is illustrated as follows.

During the period from the time point R1 to time point R5, the clock signal CLK is "0 (GND)", and the reverse-clock signal CLKB is "1 (VDD1)". Thus, the first path switch SW1 is switched off, while the second path switch is switched on. Then, the action stability for reading data from the ferroelectric elements is improved through pre-fixing the logics of the clock signal CLK and the reverse-clock signal CLKB.

At the time point R1, the F reset signal FRST is set to be "1 (VDD1)" at first, the transistors Q1a, Q1b, Q2a and Q2b are switched on, and two ends of each of the ferroelectric elements CL1a, CL1b, CL2a and CL2b are in short circuit. Therefore, the ferroelectric elements CL1a, CL1b, CL2a and CL2b turn into the state of not applying any voltage, so that unexpected voltage will not be applied on the ferroelectric elements CL1a, CL1b, CL2a and CL2b even under the condition of voltage change when the supply is switched on so as to avoid data change.

Furthermore, at the time point R1, the first plate line PL1 and the second plate line PL2 are both set to be "0 (low level: GND)".

At the time point R2, under the condition that the control signals E1 and E2 are both "0 (GND)" (namely, under the condition that the data writing-in drivers are out of work and the normal loop in the loop structure portion LOOP is out of work), the first supplying voltage VDD1 is connected to the loop structure portion LOOP, and the second supply voltage VDD2 is connected to the non-volatile storage portion NVM. At that time, the signal line painted by a thick line in FIG. 6 turns to be floating.

Then, at the time point R3, it turns into the state that the F reset signal FRST is "0 (GND)", the transistors Q1a, Q1b, Q2a and Q2b are switched off and it is capable of applying voltage to the ferroelectric elements CL1a, CL1b, CL2a and CL2b; on the other hand, the second plate line PL2 is maintained at "0 (GND)", and the first plate line PL1 is at "1 (VDD2)". Voltage signals corresponding to the residual polarization states in the ferroelectric elements appear as the node voltage V1 and node voltage V2 through applying the pulse voltage.

If the detailed illustration is given according to the example in FIG. 3, that appearing as the node voltage V1 is a lower voltage signal (the logic thereof is referred to as WL [Weak Low] below), and that appearing as the node voltage V2 is a higher voltage signal (the logic thereof is referred to as WH [Weak Hi] below). That is, voltage difference corresponding to the difference of the residual polarization states in the ferroelectric elements is generated between the node voltage V1 and the node voltage V2.

Meanwhile, in the period from the time point R3 to time point R4, the control signal E2 is "0 (VDD1)", and the second input ends (0) of the multiplexer MUX1 and the multiplexer MUX2 are selected, so that the logic of the node voltage turns into WL, and the logic of the node voltage V4 turns into WH. Besides, the logic of the node voltage V5 turns into WH, and the logic of the node voltage V6 turns into WL. Thus, in the period from the time point R3 to time point R4, the node voltages V1~V6 at the portions of the device are still at an unstable state (that the logic reverse in the inverter INV3 and inverter INV4 is not completed, and the output logic thereof is not assuredly turned into "0 (GND)"/"1 (VDD1)".

Then, at the time point R4, the control signal E2 is "1 (VDD1)", and the first input ends (1) of the multiplexer MUX1 and the multiplexer MUX2 are selected, so that a normal loop is formed in the loop structure portion LOOP. With the switching of the signal path, the output end (logic: WH) of the inverter INV4 is connected with the input end (logic: WH) of the inverter INV3, and the output end (logic: WL) of the inverter INV3 is connected with the input end (logic: WL) of the inverter INV4. Therefore, the signal logics (WH/WL) of the nodes will not be unmatched. Then, during the period of forming a normal loop in the loop structure portion LOOP, the inverter INV3 receives the input of logic WL and increases the output logic thereof to "1 (VDD1)", while the inverter INV4 receives the input of logic WH and decreases the output logic thereof to "0 (GND)". So, the output logic of the inverter INV3 is determined to be "0 (GND)" from the unstable logic WL, and the output logic of the inverter INV4 is determined to be "1 (VDD1)" from the unstable logic WH.

Therefore, at the time point R4, with the loop structure portion LOOP turning into a normal loop, the signal (the potential difference between the node voltage V1 and the node voltage V2) read from the ferroelectric elements is amplified by the loop structure portion LOOP so as to recover the hold data ("1 (VDD1)" in the example in FIG. 2) as an output signal Q before cutting off the supply.

Then, at the time point R5, the F reset signal FRST is "1 (VDD2)" again, the transistors Q1a, Q1b, Q2a and Q2b are switched on, and two ends of each of the ferroelectric elements CL1a, CL1b, CL2a and CL2b are in short circuit, so that the ferroelectric elements CL1a, CL1b, CL2a and CL2b turn into the state of not applying any voltage. At that time, the first plate line PL1 and the second plate line PL2 are both "0 (GND)". Therefore, the data hold device is recovered to the state which is the same as that before the time point W1, namely the normal action state.

Figure 6:
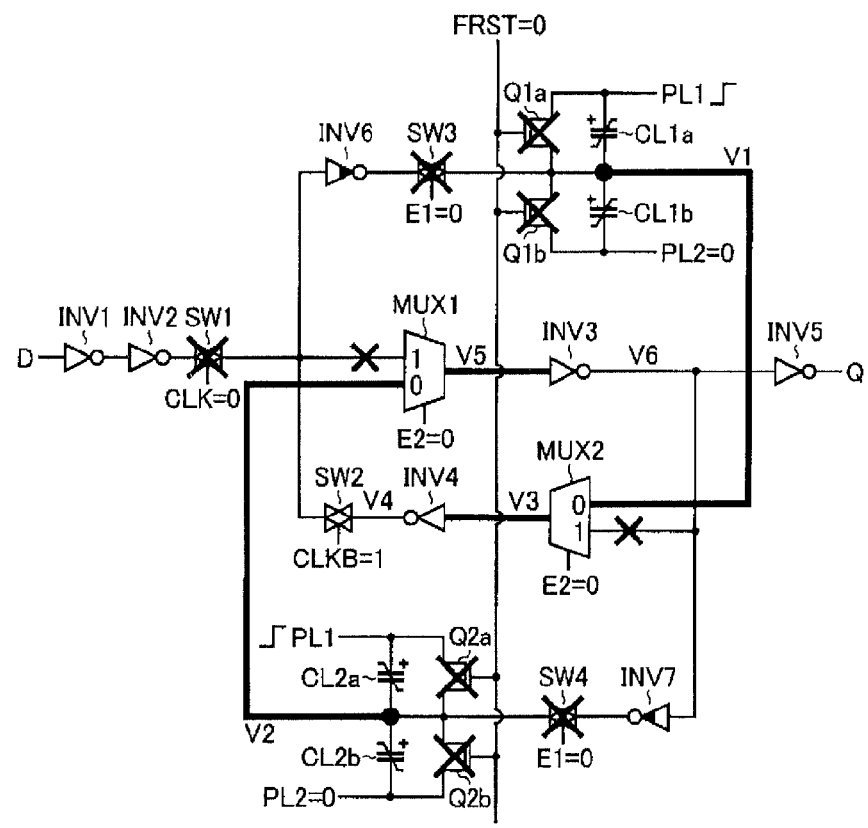
FIG. 6 illustrates a circuit diagram showing signal path during data readout action.

Furthermore, FIG. 6 is a circuit diagram showing the signal path (painted by a thick line in the figure) during the data reading action (especially from the time point R3 to time point R4).

As mentioned above, the data hold device in this embodiment is configured to include: a loop structure portion LOOP, which uses loop-shaped linked logic gates (the inverters INV3 and INV4 in FIG. 1) to hold data; a non-volatile storage portion NVM (CL1a, CL1b, CL2a, CL2b, Q1a, Q1b, Q2a and Q2b), which uses the hysteresis characteristics of the ferroelectric elements to store the data held in the loop structure portion LOOP in a non-volatile manner; and a circuit separating portion SEP (MUX1, MUX2, INV6, INV7, SW3 and SW4), which electrically separates the loop structure portion LOOP and the non-volatile storage portion NVM; and in the normal action of the data hold device, the circuit separating portion SEP maintains the voltage applied to the ferroelectric elements constant and drives the loop structure portion to act electrically.

Thus, the ferroelectric elements CL1a, CL1b, CL2a and CL2b are not directly driven from the signal line of the loop structure portion LOOP, but driven through arranging data writing-in drivers (the inverters INV6 and INV7 in FIG. 1) further working as buffers between the signal line of the loop structure portion LOOP and the ferroelectric elements CL1a, CL1b, CL2a and CL2b, so that the ferroelectric elements CL1a, CL1b, CL2a and CL2b will not turn into the load capacitance in the loop structure portion LOOP.

Besides, if the structure is to connect the path switches SW3 and SW4 with the output ends of the data writing-in drivers (the inverters INV6 and INV7), in accordance with the control signal E1, the path switches SW3 and SW4 are only switched on during writing data in, so that the ferroelectric elements CL1a, CL1b, CL2a and CL2b can be not driven during the normal action.

Additionally, the input-output paths of the multiplexers MUX1 and MUX2 are switched according to the control signal E2 during reading data, thus the logic gates (the inverters INV3 and INV4 in FIG. 1) in the loop structure portion LOOP and the switch-on/off of the ferroelectric elements CL1a, CL1b, CL2a and CL2b can be controlled. Therefore, it is unnecessary to add a clock line having a large load for setting a specific node to float, so that power consumption increase can be avoided.

And, in the data hold device in this embodiment, although it is necessary to add control signals E1 and E2, the signals are different from the always driven clock signals, and they are not driven normally, so the power consumption of the data hold device is almost not influenced.

Furthermore, in the data hold device in this embodiment, although it is necessary to add data writing-in drivers (the inverters INV6 and INV7) and multiplexers MUX1 and MUX2, the occupied space of the data hold devices in operation circuit, such as CPU [Central Processing Unit], is at most several percentages, which substantially does not have the area increase influence to the entirety of the operation circuit.

So, according to the data hold device in this embodiment, the ferroelectric elements are not unnecessarily driven in the normal action, so that the high speed and low power consumption at the same level as the volatile data hold device can be realized.

That means, it is capable of processing as the same as the volatile data hold device, the storage elements of existing circuit can be partially exchanged into the data hold device in the present invention without performing the redesign such as timing design or power consumption design.

Besides, in the data hold device of this embodiment, the loop structure portion LOOP and the non-volatile storage portion NVM are respectively and independently driven through supplying with the first supply voltage VDD1 and the second supply voltage VDD2 which are different from each other. And the circuit separating portion SEP includes potential shifters (inverters INV6 and INV7 having potential shifting function in the example in FIG. 1) for shifting the voltage potential of the data D exchanged between the loop structure portion LOOP and the non-volatile storage portion NVM.

Through the structure, the loop structure portion may be driven at a low voltage through using the first supply voltage VDD1, and the non-volatile storage portion NVM (more specifically, the ferroelectric elements CL1a, CL1b, CL2a and CL2b contained in the non-volatile storage portion NVM) may be appropriately driven through using the second supply voltage VDD2 which is higher than the first supply voltage VDD1 so as to provide a data hold device which can be appropriately configured in for a low-voltage driven element (ultra-low voltage processor etc.).

The First Embodiment

Figure 7:
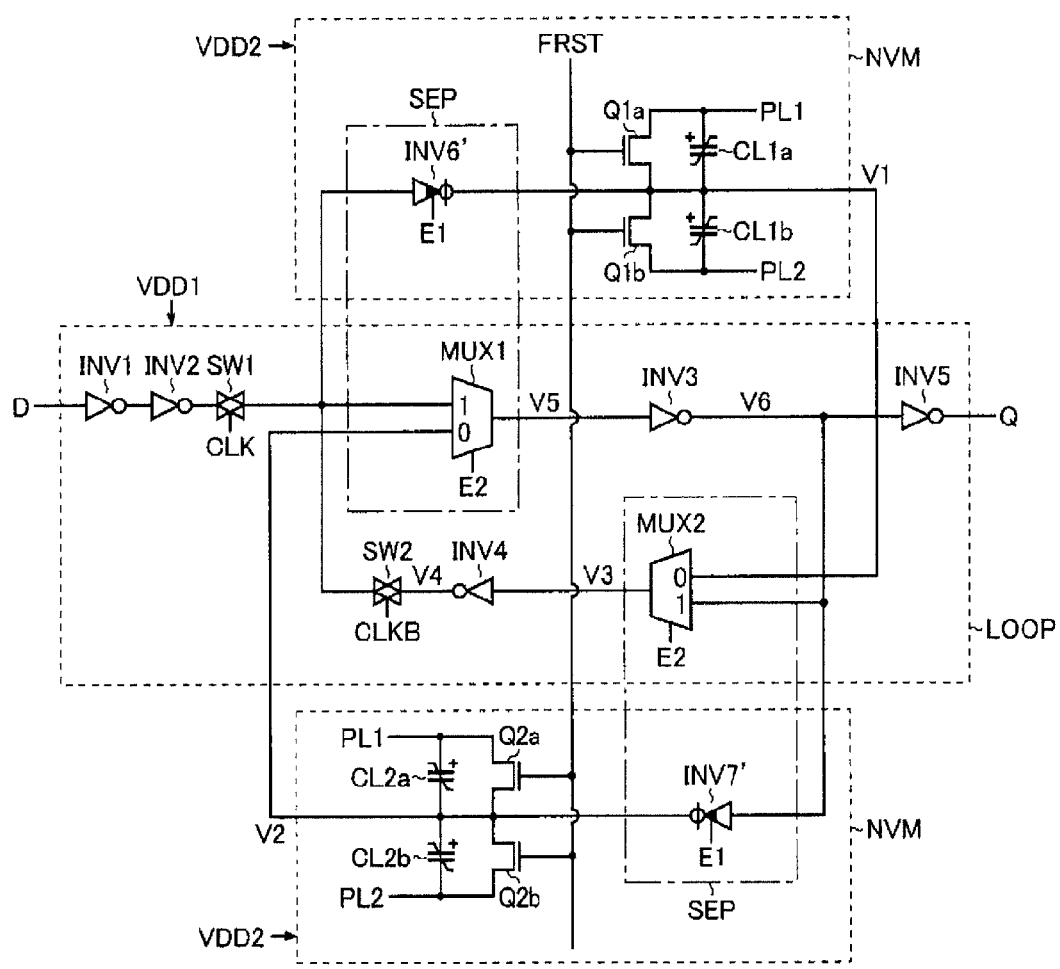
FIG. 7 illustrates a circuit diagram showing the first embodiment of the data hold device of the present invention.

Furthermore, in the embodiment, it takes the structure of the respectively combined inverter INV6 and path switch SW3, and inverter INV7 and path switch SW4 as the examples for illustration, but this is not the limitation of the structure of the present invention; it may also be as shown in FIG. 7 that the output state is set to be three-state inverters INV6' and INV7' at a high impedance according to the control signal E1 so as to omit the path switches SW3 and SW4.

Figure 8:
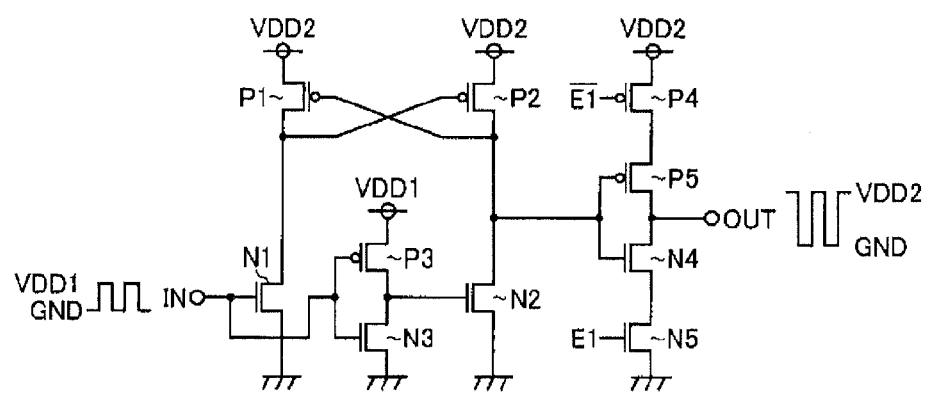
FIG. 8 represents a circuit diagram showing an example of the 3-state inverter INV6' (the same as inverter INV7').

Under this condition, the structure of the inverter INV6' (the same as the inverter INV7') is shown in FIG. 8.

FIG. 8 is a circuit diagram showing a structural example of the three-state inverter INV6'(the same as the inverter INV7') having potential shifting function.

As shown in FIG. 8, the three-state inverter INV6'(INV7') having potential shifting function may be easily realized through adding multiple changes to the above inverter INV6 (INV7). More specifically, based on the structure in FIG. 2, the three-state inverter INV6'(INV7') is additionally provided with an output segment including P-channel MOS field effect transistors P4 and P5 and N-channel MOS field effect transistors N4 and N5; and an output signal is led out from the output segment so as to replace the structure leading output signals out from the drain of the transistor P1.

The source of the transistor P4 forming the output segment is connected with the applying end of the second supply voltage VDD2, the gate thereof is connected with the applying end of the reverse control signal E1 bar, and the drain thereof is connected with the source of the transistor P5. The drain of the transistor P5 is connected with the drain of the transistor N4 and is further connected with the output end OUT. The gates of the transistors P5 and N4 are both connected with the drain of the transistor P2. The source of the transistor N4 is connected with the drain of the transistor N5. The source of the transistor N5 is connected with the ground end, and the gate thereof is connected with the applying end of the control signal E1.

In the three-state inverter INV6' (INV7'), under the condition that the control signal E1 is set to be high level (the second supply voltage VDD2), a logic signal at a low level (ground voltage GND) is output from the output end OUT when a logic signal at a high level (the first supply voltage VDD1) is input from the input end IN, in the contrary, a logic signal at a high level (the second supply voltage VDD2) is output from the output end OUT when a logic signal at a low level (ground voltage GND) is input from the input end IN. Namely, the inverter INV6' (INV7') increases the high-level potential thereof from the first supply voltage VDD1 to the second supply voltage VDD2 for outputting after reversing the logic of the logic signals input to the input end IN when the control signal E1 is high level. On the other hand, the transistors P4 and P5 are both switched off under the condition that the control signal E1 is low level (GND), so that the output end OUT turns to the high-impedance state. Namely, the inverter INV6' (INV7') sets the output end OUT at the high-impedance state without depending on the logic signal input into the input end IN when the control signal E1 is low level (GND). Therefore, the path switches SW3 and SW4 shown in FIG. 2 can be omitted if the three-state inverters INV6' and INV7' are used.

Figure 9:
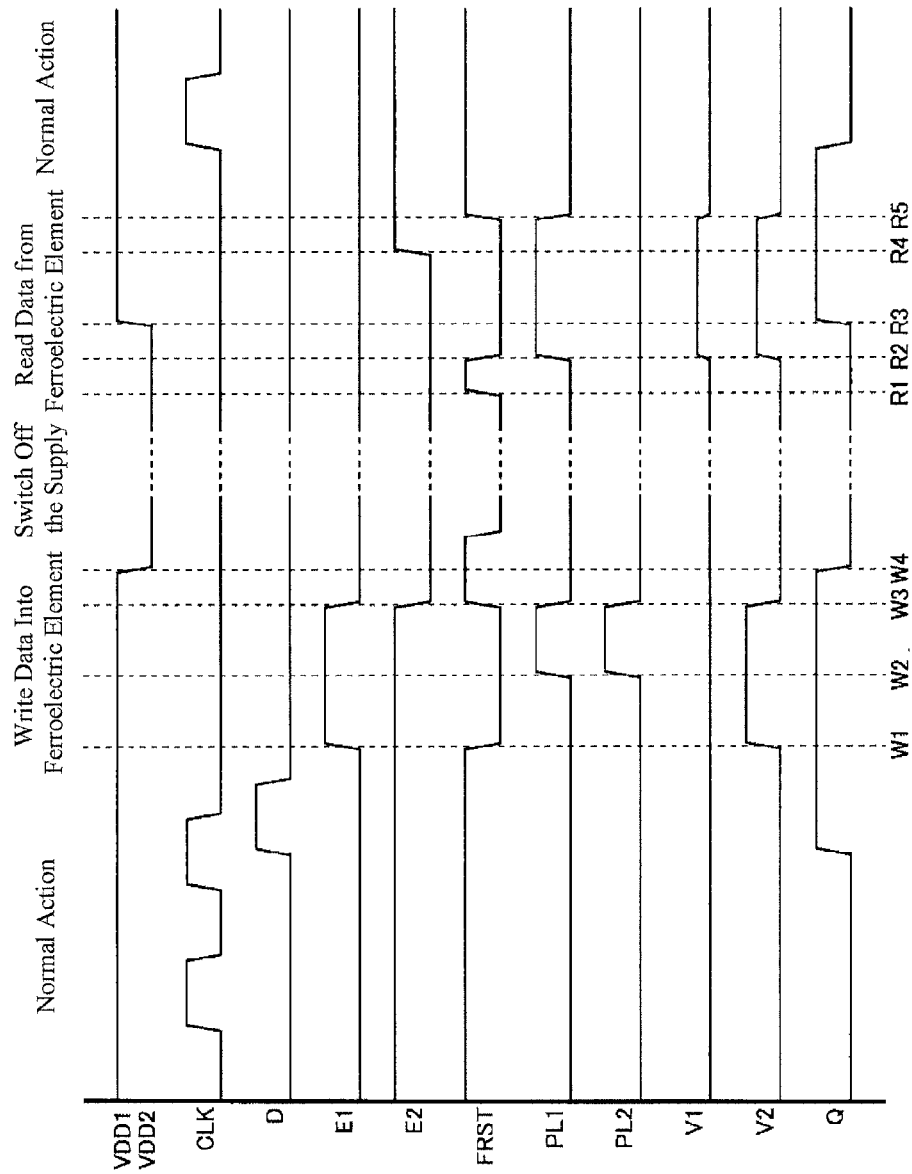
FIG. 9 represents a sequence diagram showing other action example of the data hold device of the present invention.

The embodiment of the action reading data from the ferroelectric elements is illustrated in details as follows referring to FIG. 9. FIG. 9 is a sequence diagram for illustrating the other action examples of the data hold device in the present invention, which shows the voltage waveforms of the supply voltages (VDD1 and VDD2), the clock signal CLK, the data signal D, the control signal E1, the control signal E2, the F reset signal FRST, the applying voltage of the first plate line PL1, the applying voltage of the second plate line PL2, the node voltage V1, the node voltage V2 and the output signal Q from the top to the bottom.

During the period from the time point R1 to time point R5, the clock signal CLK is "0 (GND)", and the reverse-clock signal CLKB is "1 (VDD1)". Therefore, the first path switch SW1 is switched off, and the second path switch SW2 is switched on. Thus, the action stability for reading data from the ferroelectric elements is improved through pre-fixing the logics of the clock signal CLK and the reverse-clock signal CLKB.

At the time point R1, the F reset signal FRST is set to be "1 (VDD2)" at first, the transistors Q1a, Q1b, Q2a and Q2b are switched on, and two ends of each of the ferroelectric elements CL1a, CL1b, CL2a and CL2b are in short circuit. Therefore, the ferroelectric elements CL1a, CL1b, CL2a and CL2b turn into the state of not applying any voltage, so that unexpected voltage is not applied on the ferroelectric elements CL1a, CL1b, CL2a and CL2b even under the condition of voltage change when the supply is switched on so as to avoid data change.

Furthermore, at the time point R1, the first plate line PL1 and the second plate line PL2 are both "0 (low level: GND)".

At the time point R2, the F reset signal FRST is "0 (GND)", and the transistors Q1a, Q1b, Q2a and Q2b are switched off so as to turn into the state capable of applying voltage to the ferroelectric elements CL1a, CL1b, CL2a and CL2b; one the other hand, the second plate line PL2 is maintained at "0 (GND)", and the first plate line PL1 is "1 (VDD2). Voltage signals corresponding to the residual polarization states in the ferroelectric elements are generated as the node voltage V1 and the node voltage V2 through applying the pulse voltage.

If detailed illustration is given according to FIG. 9, WL appears as the logic of the node voltage V1, and WH appears as the logic of the node voltage V2. Namely, voltage difference corresponding to the difference of the residual polarization states in the ferroelectric elements is generated between the node voltage V1 and the node voltage V2.

Wherein, during the period from the time point R2 to time point R3, since the supply voltage VDD is still not connected, the node voltages V3 to V6 at the loop structure portion LOOP are all "0 (GND)", and the output signal Q is "0 (GND)".

Then, at the time point R3, under the condition that the control signals E1 and E2 are all "0 (GND)" (namely, the data writing-in drivers are out of work, and the normal loop in the loop structure portion LOOP is out of work), the first supply voltage VDD1 is connected to the loop structure portion LOOP, and the second supply voltage VDD2 is connected to the non-volatile storage portion NVM. Meanwhile, the signal line painted by a thick line in FIG. 6 turns to float.

Besides, during the period from the time point R3 to time point R4, the control signal E2 is "0 (GND)", and the second input ends (0) of the multiplexer MUX1 and the multiplexer MUX2 are selected, so that the logic of the node voltage V3 turns into WL, and the logic of the node voltage V4 turns into WH. In addition, the logic of the node voltage V5 turns into WH, and the logic of the node voltage V6 turns into WL. Thus, during the period from the time point R3 to time point R4, the node voltages V1 to V6 at the portions of the device are still at an unstable state (the state that the logic reverses in the inverter INV3 and the inverter INV4 are not completed, and the output logics thereof are not assuredly turned to "0 (GND)"/"1 (VDD1)").

Then, at the time point R4, the control signal E2 is "1 (VDD1)", and the first input ends (1) of the multiplexer MUX1 and the multiplexer MUX2 are selected, so that a normal loop is formed in the loop structure portion LOOP. With the exchange of this signal path, the output end (logic: WH) of the inverter INV4 is connected with the input end (logic: WH) of the inverter INV3, and the output end (logic: WL) of the inverter INV3 is connected with the input end (logic: WL) of the inverter INV4. Thus, the signal logics (WH/WL) of nodes will not be unmatched. Then, during the period of forming a normal loop in the loop structure portion LOOP, the inverter receives the input of logic WL and increases the output logic thereof to "1 (VDD1)", and the inverter INV4 receives the input of logic WH and decreases the output logic thereof to "0 (GND)". Therefore, the output logic of the inverter INV3 is determined at "0 (GND)" from an unstable logic WL, and the output logic of the inverter INV4 is determined at "1 (VDD1)" from an unstable logic WH.

Therefore, at the time point R4, with the loop structure portion LOOP turns into a normal loop, the signal (the potential difference between the node voltage V1 and the node voltage V2) read from the ferroelectric elements is amplified by the loop structure portion so as to recover the hold data ("1 (VDD1)" in the example in FIG. 9) before the supply is cut off as an output signal Q.

And, at the time point R5, the F reset signal FRST is "1 (VDD2)" again, the transistors Q1a, Q1b, Q2a and Q2b are switched on, and two ends of each of the ferroelectric elements CL1a, CL1b, CL2a and CL2b are in short circuit, so the ferroelectric elements CL1a, CL1b, CL2a and CL2b turn to the state of not applying any voltage. Meanwhile, the first plate line PL1 and the second plate line PL2 are both "0 (GND)". Thus, the data hold device is recovered to the state as the same as that before the time point W1, namely a normal action state.

As mentioned above, the data readout action in FIG. 9 is different from that in FIG. 3. Before the first supply voltage VDD1 and the second supply voltage VDD2 are connected, the lead-out action of the voltage signals (node voltages V1 and V2) corresponding to the residual polarization state in the ferroelectric elements is started. Through the structure, the action steps (three steps (at the time points R3, R4 and R5) are required in the action example in FIG. 3) are reduced after connecting both the first supply voltage VDD1 and the second supply voltage VDD2, only two steps (at the time points R4 and R5) are relatively required in the action example in FIG. 9 so as to reduce the required time until it is recovered to a normal action.

<Ferroelectric Elements>

The characteristics of the ferroelectric elements used by the data hold device in this embodiment will be illustrated in details as follows.

Figure 10:
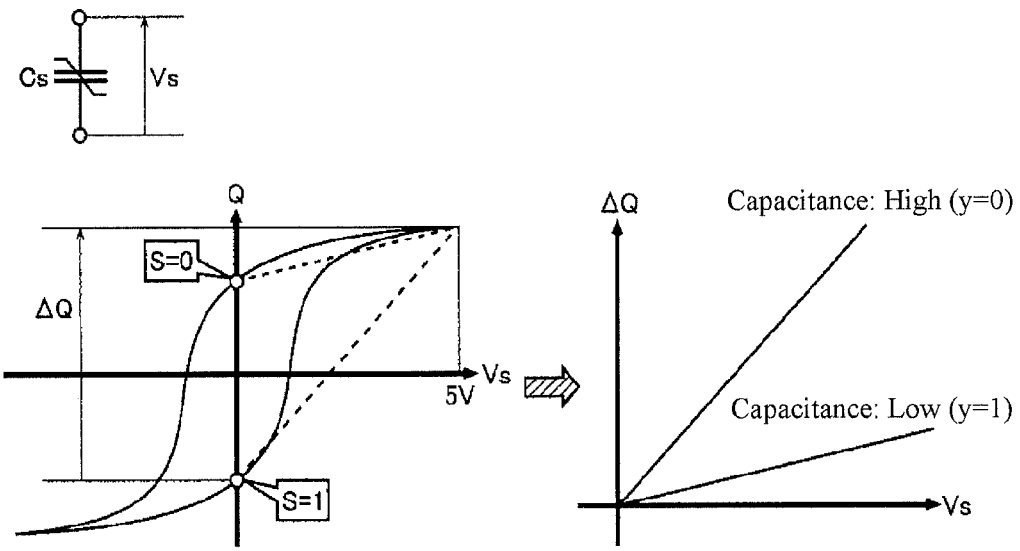
FIG. 10 represents the characteristics showing the ferroelectric element.

FIG. 10 is a diagram for illustrating the characteristics of the ferroelectric elements. Besides, at the upper segment of the FIG. 10, the condition that a voltage Vs is applied to the ferroelectric element Cs is described. And, the hysteresis characteristics of the ferroelectric element Cs are shown at the left side of the lower segment of the FIG. 10, while the capacitance characteristics thereof are shown at the right side of the lower segment.

As shown in FIG. 10, the capacitance characteristics of the ferroelectric element Cs change in accordance with the residual polarization state when a voltage Vs is applied between two ends thereof. Specifically, under the condition that a positive-polar voltage Vs is applied between two ends of the ferroelectric element Cs so as to set the ferroelectric element Cs to be at a non-reverse state (S=0), the capacitance thereof decreases. In the contrary, under the condition that a negative-polar voltage VS is applied between two ends of the ferroelectric element Cs so as to set the ferroelectric element Cs to be at a reverse state (S=1), the capacitance thereof increases. Thus, while reading the data stored in the ferroelectric element Cs, the difference of the capacitances is converted into a voltage.

Therefore, when reading data from the non-volatile storage portion NVM, the data hold device in this embodiment uses the capacitance coupling of the ferroelectric element at a non-reverse state (S=0) and the ferroelectric element at a reverse state (S=1).

Figure 11:
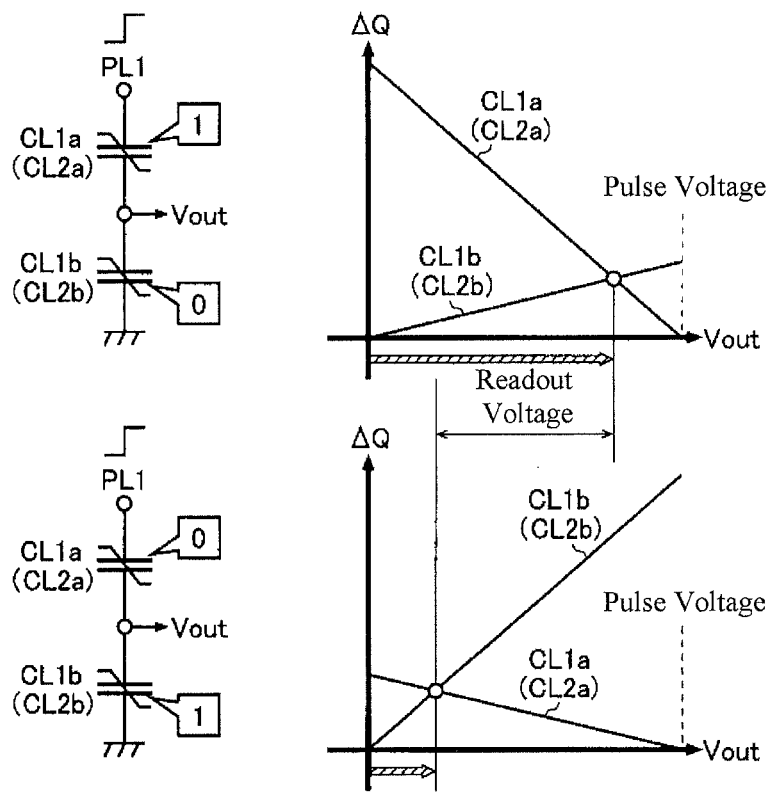
FIG. 11 represents the way showing data readout of the capacity coupling of the ferroelectric element.

FIG. 11 is a diagram for illustrating the data readout manner of the capacitance coupling between the ferroelectric elements. Besides, the upper segment of the FIG. 11 represents the capacitance characteristics when the ferroelectric element CL1a (the ferroelectric element CL2a) is at a reverse state (S=1) and the ferroelectric element CL1b (the ferroelectric element CL2b) is at a non-reverse state (S=0). In the contrary, the lower segment of the FIG. 11 represents the capacitance characteristics when the ferroelectric element CL1a (the ferroelectric element CL2a) is at a non-reverse state (S=0) and the ferroelectric element CL1b (the ferroelectric element CL2b) is at a reverse state (S=1).

As mentioned above, when data is written into the ferroelectric elements, the residual polarization states of the ferroelectric elements CL1a and CL1b and those of the ferroelectric elements CL2a and CL2b are contrary to each other, so that the capacitance characteristics thereof change into the relationship that the larger the capacitance of one is, the smaller that of the other one is.

Therefore, when two ferroelectric elements CL1a and CL1b and two ferroelectric elements CL2a and CL2b, which have contrary residual polarization states, are connected in series, a pulse voltage is applied at one end thereof and the node voltages V1 and V2 (a voltage determined due to the ratio of capacitances, which is the readout voltage Vout in FIG. 11) at the connecting node between two elements are detected, thus the amplitude of the readout voltage Vout can be maintained at about 1 [V] through the structure so as to greatly improve the readout margin.

Additionally, the data hold device in this embodiment performs 0/1 determination for the data read from the non-volatile storage portion NVM through comparing the node voltage V1 corresponding to the capacitance ratio of the ferroelectric elements CL1a and CL1b with the node voltage Vb corresponding to the capacitance ratio of the ferroelectric elements CL2a and CL2b, thus, it is unnecessary to strictly set the thresholds of the inverters.

The Second and the Third Embodiments

Figure 12:
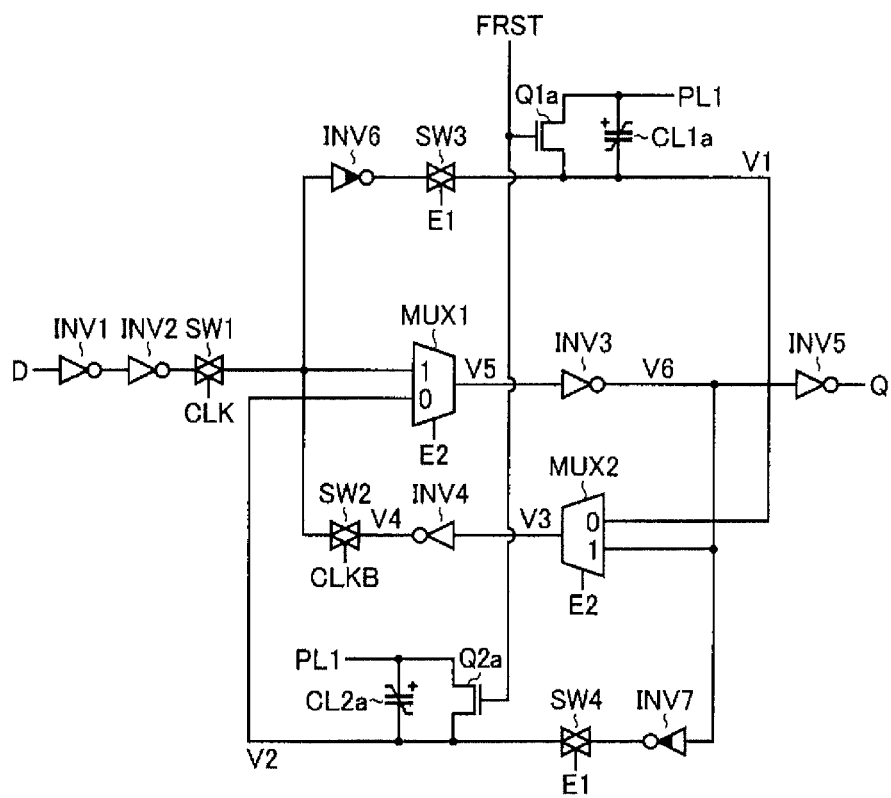
FIG. 12 represents a circuit diagram showing the second embodiment of the data hold device of the present invention.
Figure 13:
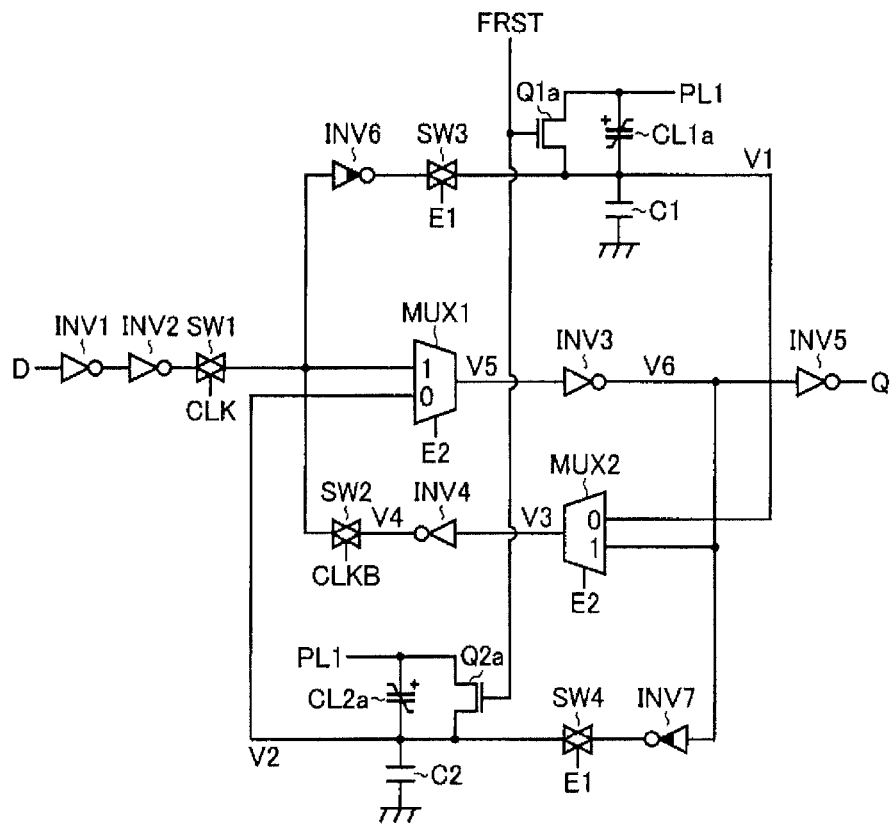
FIG. 13 represents a circuit diagram showing the third embodiment of the data hold device of the present invention.

Therefore, in the data hold device in this embodiment, a data readout manner using the capacitance coupling between the ferroelectric elements is adopted, but the structure of the present invention is not limited. As shown in FIG. 12 (the second embodiment), it can be configured to read data from the non-volatile storage portion NVM through using the capacitance coupling of the ferroelectric elements CL1a and CL2a and the gate capacitance of the transistors forming the inverters INV3 and INV4 (in other words, it is a structure after removing the ferroelectric elements CL1b and CL2b and the transistors Q1b and the Q2b from the structure in FIG. 1). Alternatively, as shown in FIG. 13 (the third embodiment), it can also be configured to read data from the non-volatile storage portion NVM through using the capacitance coupling between the ferroelectric elements CL1a and CL1b and the other capacitor elements C1 and C2.

<Application Example of D Trigger>

Figure 14:
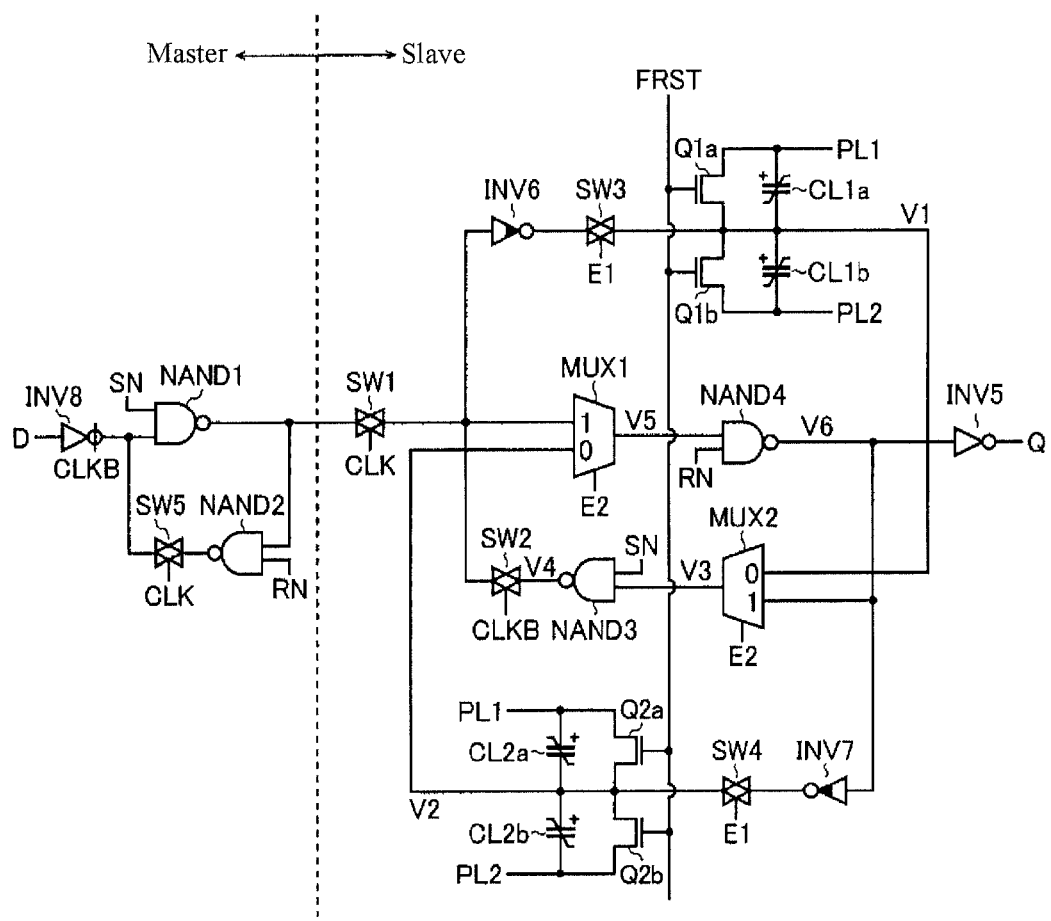
FIG. 14 is a circuit diagram showing the application example of D flip-flop.

FIG. 14 is a circuit diagram showing the application example of the D trigger (register) having a set/reset function.

As shown in FIG. 14, the latch circuit is serially connected into a two-segment group (master and slave) under the condition of forming the D trigger, and it is unnecessary to turn the master and the slave into be non-volatile that the present invention can be only applied to the latch circuit at the slave side.

Figure 15:
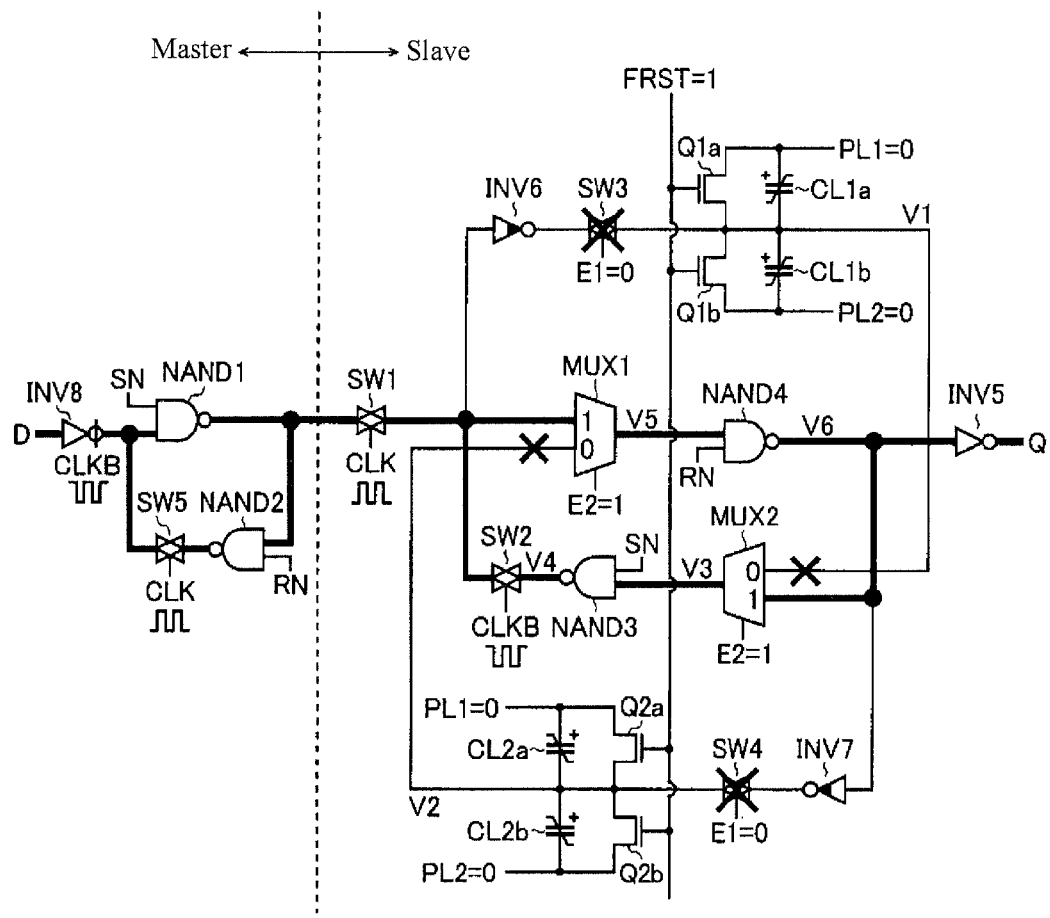
FIG. 15 is a circuit diagram showing the signal path during normal action.
Figure 16:
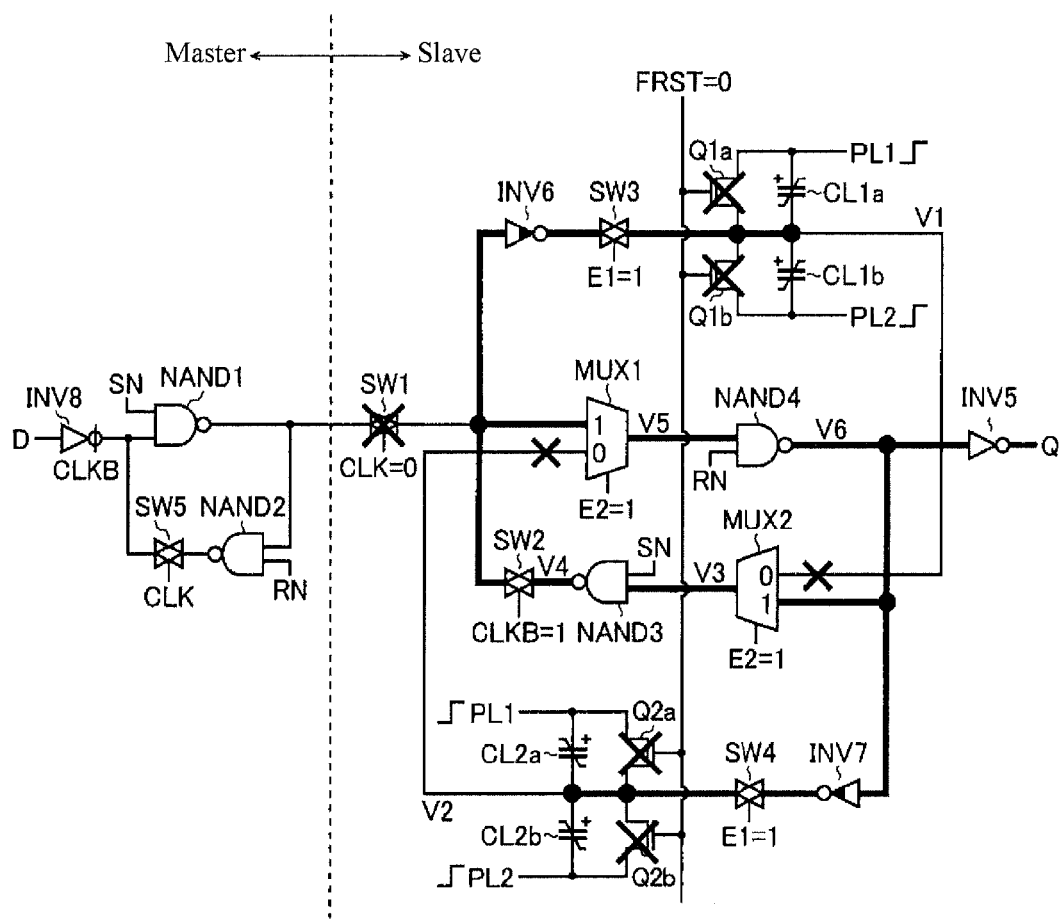
FIG. 16 is a circuit diagram showing the signal path during data writing action.
Figure 17:
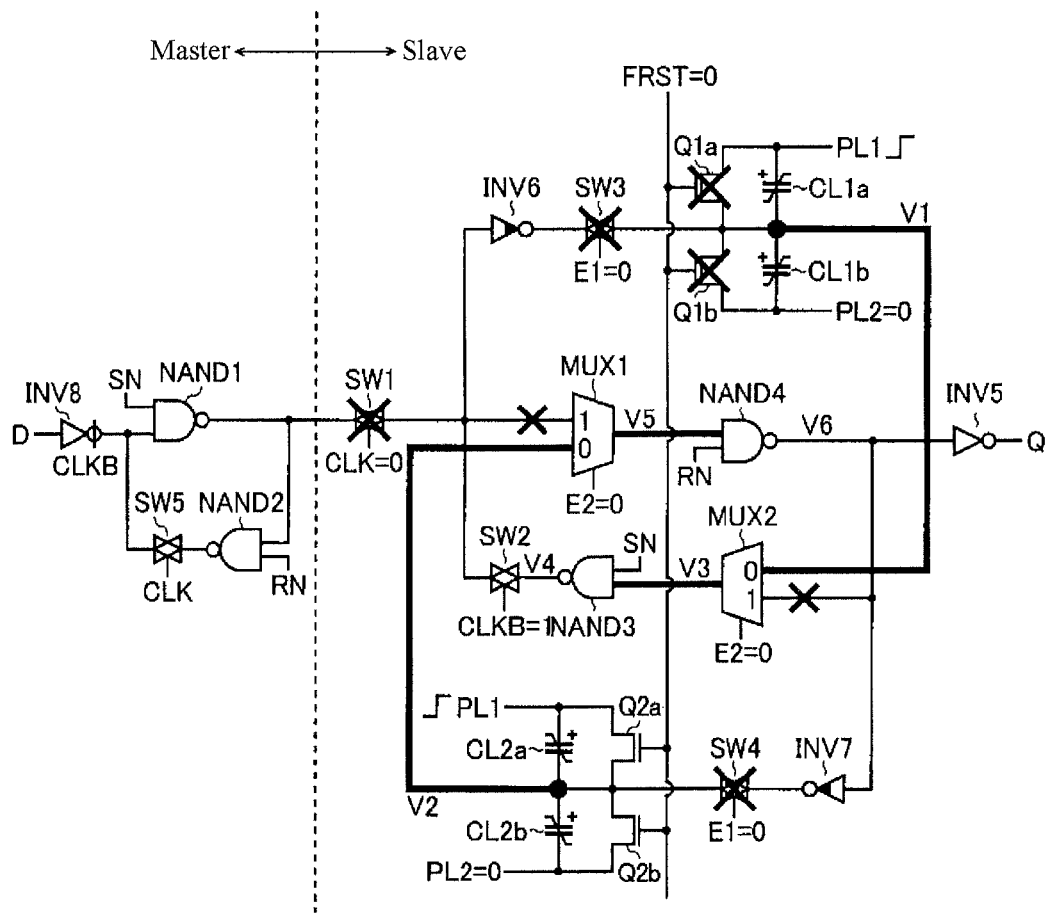
FIG. 17 is a circuit diagram showing signal path during data readout action.

Besides, except that it is connected with the latch circuit at the master side, the normal action, the action for writing data into the ferroelectric elements and the action for reading data from the ferroelectric elements thereof are the same as the illustration, and the signal paths in the various actions thereof are as shown in FIG. 15 to FIG. 17, so that it is unnecessary to repeat the illustration in addition.

Wherein, in the D trigger shown in FIG. 14, in order to realize the set/reset function, not the inverters but the NAND operators NAND1~NAND4 are used as the logic gates for forming the loop structure portion. In addition, if the set signal SN input to the NAND operators NAND1 and NAND3 is "0 (GND)", the output signal Q is compulsorily changed into "0 (GND)". Thus, the set signal SN and the reset signal RN are required to set as "1 (VDD1)" in the data writing-in action or the data readout action.

The Fourth Embodiment

Figure 18:
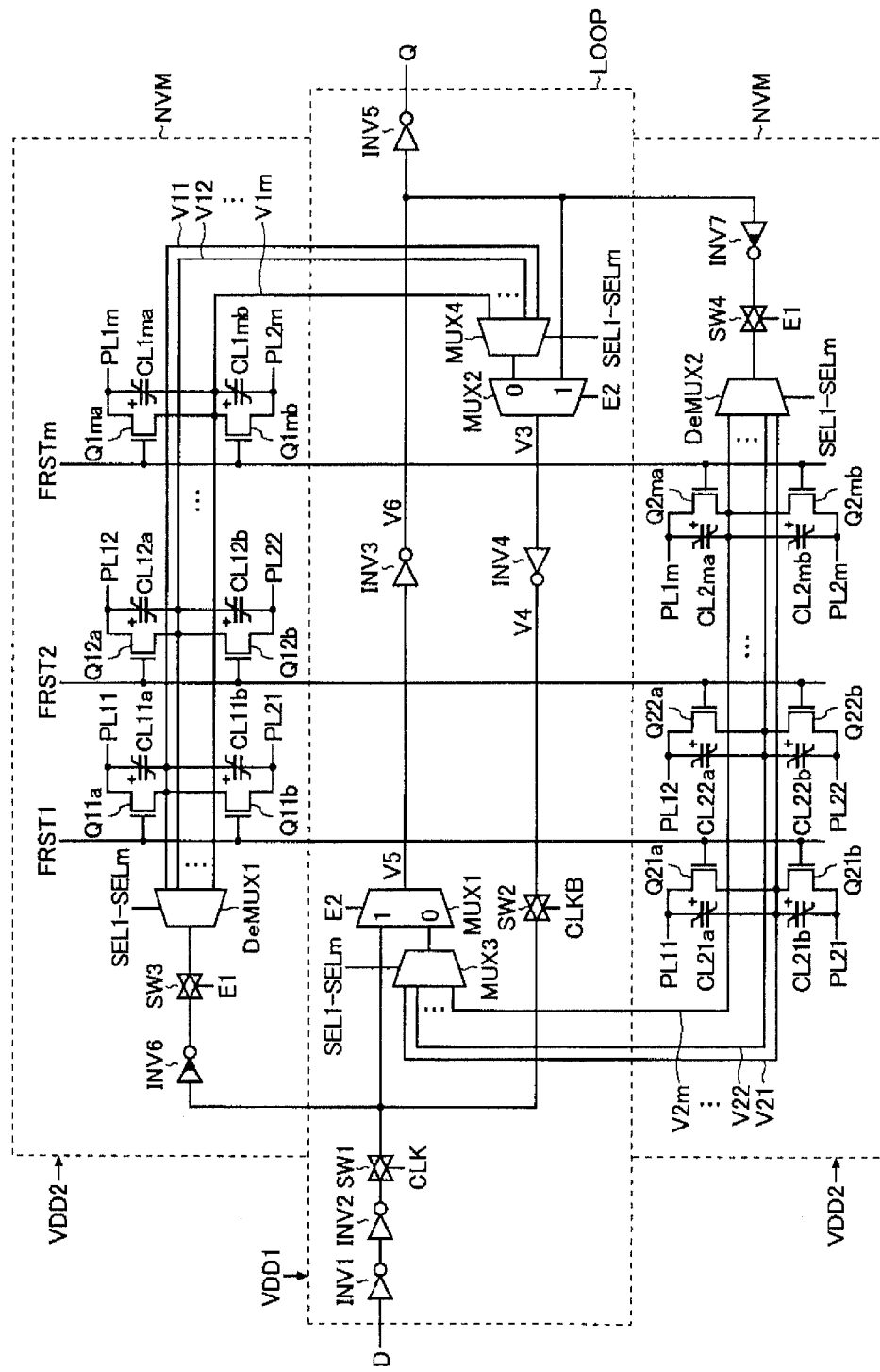
FIG. 18 is a circuit diagram showing the fourth embodiment of the data hold device of the present invention.

Then, the fourth embodiment of the data hold device of the present invention is illustrated in detail while referring to FIG. 18. FIG. 18 is a circuit diagram which shows the fourth embodiment of the data hold device of the present invention.

The data hold device described in FIG. 14 is a latch circuit including the inverters INV1-INV7, the path switches SW1-SW4, the multiplexers MUX1-MUX4, the demultiplexers DeMUX1, DeMUX2, the N-channel field effect transistors Q11a-Q1ma, Q11b-Q1mb, Q21a-Q2ma, Q21b-Q2mb, and the ferroelectric elements (ferroelectric capacitors) CL11a-CL1ma, CL11b-CL1mb, CL21a-CL2ma, CL21b-CL2mb.

An input end of the inverter INV1 is connected to an applying end of a data signal (D). An output end of the inverter INV1 is connected to an input end of the inverter INV2. An output end of the inverter INV2 is connected to a first input end (1) of the multiplexer MUX1 through the path switch SW1. An output end of the multiplexer MUX1 is connected to an input end of the inverter INV3. An output end of the inverter INV3 is connected to an input end of the inverter INV5. An output end of the inverter INV5 is connected to a draw out end of an output signal (Q). The first input end (1) of the multiplexer MUX2 is connected to the output end of the inverter INV3. The output end of the multiplexer MUX2 is connected to an input end of the inverter INV4. An output end of the inverter INV4 is connected to the first input end (1) of the multiplexer MUX1 through the path switch SW2.

Thus, the data hold device of the present embodiment is provided with a loop structure portion LOOP, i.e., the input data signal D is maintained by using two logic gates (inverters INV3, INV4 in the FIG. 18) in loop connection.

In addition, the loop structure portion LOOP is driven by being supplied with a first supply voltage VDD1, for example, 0.6[V].

The input end of the inverter INV6 is connected to the first input end (1) of the multiplexer MUX1. The output end of the inverter INV6 is connected to the input end of the demultiplexer DeMUX1 through the path switch SW3. The first output end to the m-th output end of the demultiplexer DeMUX1 are connected to the first input end to the m-th input end of the multiplexer MUX4, respectively. The output end of the multiplexer MUX4 is connected to the second input end (0) of the multiplexer MUX2.

The input end of the inverter INV7 is connected to the first input end (1) of the multiplexer MUX2. The output end of the inverter INV7 is connected to the input end of the demultiplexer DeMUX2 through the path switch SW4. The first output end to the m-th output end of the demultiplexer DeMUX2 are connected to the first input end to the m-th input end of the multiplexer MUX3, respectively. The output end of the multiplexer MUX3 is connected to the second input end (0) of the multiplexer MUX1.

The positive pole ends of the ferroelectric elements CL11a-CL1ma are connected to the plate lines PL11-PL1m, respectively. The negative pole ends of the ferroelectric elements CL11a-CL1ma are connected to the first output end to the m-th output end of the demultiplexer DeMUX1, respectively. The transistors Q11a-Q1ma are connected between two ends of the ferroelectric elements CL11a-CL1ma, respectively. The gates of the transistors Q11a-Q1ma are connected to the applying ends of the F reset signals FRST1-FRSTm, respectively.

The positive pole ends of the ferroelectric elements CL11b-CL1mb are connected to the first output end to the m-th output end of the demultiplexer DeMUX1, respectively. The negative pole ends of the ferroelectric elements CL11b-CL1mb are connected to the plate lines PL21-PL2m, respectively. The transistors Q11b-Q1mb are connected between two ends of the ferroelectric elements CL11b-CL1mb, respectively. The gates of the transistors Q11b-Q1mb are connected to the applying ends of the F reset signals FRST1-FRSTm, respectively.

The positive pole ends of the ferroelectric elements CL21a-CL2ma are connected to the plate lines PL11-PL1m, respectively. The negative pole ends of the ferroelectric elements CL21a-CL2ma are connected to the first output end to the m-th output end of the demultiplexer DeMUX2, respectively. The transistors Q21a-Q2ma are connected between two ends of the ferroelectric elements CL21a-CL2ma, respectively. The gates of the transistors Q21a-Q2ma are connected to the applying ends of the F reset signals FRST1-FRSTm, respectively.

The positive pole ends of the ferroelectric elements CL21b-CL2mb are connected to the first output end to the m-th output end of the demultiplexer DeMUX2, respectively. The negative pole ends of the ferroelectric elements CL21b-CL2mb are connected to the plate lines PL21-PL2m, respectively. The transistors Q21b-Q2mb are connected between two ends of the ferroelectric elements CL21b-CL2mb, respectively. The gates of the transistors Q21b-Q2mb are connected to the applying ends of the F reset signals FRST1-FRSTm, respectively.

As mentioned above, the data hold device of the present embodiment is provided with a non-volatile storage portion NVM, i.e., the data D held in the loop structure portion LOOP is stored in a non-volatile manner by using hysteresis characteristics of the ferroelectric elements (CL11a-CL1ma, CL11b-CL1mb, CL21a-CL2ma, and CL21b-CL2mb).

In addition, the non-volatile storage portion NVM is driven by being supplied with the second supply voltage VDD2, for example, 1.2[V], which is higher than the first supply voltage VDD1.

Further, in the mentioned elements, the path switch SW1 is switched on/off in accordance with the clock signal CLK. The path switch SW2 is switched on/off in accordance with a reverse clock signal CLKB (logic reverse signal of the clock signal CLK). That is to say, the path switch SW1 and the path switch SW2 are switched on/off exclusively (complementarily).

On the other side, the path switches SW3, SW4 are switched on/off in accordance with the control signal E1. Additionally, the multiplexers MUX1, MUX2 switch their signal paths in accordance with the control signal E2. Further, the multiplexers MUX3, MUX4 and the demultiplexers DeMUX1, DeMUX2 switch their signal paths in accordance with the control signals SEL1-SELm. That is, in the data hold device of the present embodiment, the multiplexers MUX1-MUX4, the demultiplexers DeMUX1, DeMUX, the inverters INV6, INV7 and the path switches SW3, SW4 function as circuit separating portion SEP for electrically separating the loop structure portion LOOP from the non-volatile storage portion NVM.

In addition, in the circuit elements forming the circuit separating portion SEP, the multiplexers MUX1-MUX4 included in the loop structure portion LOOP are driven by being supplied with the first supply voltage VDD1; the demultiplexers DeMUX1, DeMUX2 and the path switches SW3, SW4 included in the non-volatile storage portion NVM are driven by being supplied with the second supply voltage VDD2.

Further, the inverters INV6, INV7 are driven by the supply of both the first supply voltage VDD1 and the second supply voltage VDD2 and function as a level shifter for converting the voltage level of the data D exchanged between the loop structure portion LOOP and the non-volatile storage portion NVM. Additionally, because the circuit structures of the inverters INV6, INV7 have been illustrated, the repeated illustration is omitted. Moreover, as shown in the previous FIG. 7, the three-state inverters INV6', INV7' can be used to replace the inverter INV6, the path switch SW3, and the inverter INV7, as well as the path switch SW4.

Therefore, in order to store the data D with m bit (m≥2), the data hold device further extends the structure of the FIG. 1 and is structured to include the first to the m-th storage areas capable of making selection according to the control signals SEL1-SELm. Additionally, if the example of the FIG. 18 is illustrated, the x-th storage area (1≤x≤m) is formed with the ferroelectric elements CL1$xa$, CL1$xb$, CL2$xa$, CL2$xb$ and the transistors Q1$xa$, Q1$xb$, Q2$xa$, Q2$xb$. However, the structure of the invention is not confined to this; the embodiment same as the previous FIG. 12, FIG. 13 can also be carried out.

Then, the action of the data hold device is illustrated in detail. In addition, in the following illustration, the node voltage additional marks of each portion, i.e., the voltages respectively at the first output end to the m-th output end of the demultiplexer DeMUX1 (the first input end to the m-th input end of the multiplexer MUX4) are set as V11-V1$m$; the voltages separately at the first output end to the m-th output end of the demultiplexer DeMUX2 (the first input end to the m-th input end of the multiplexer MUX3) are set as V21-V2$m$; the voltage at the input end of the inverter INV4 is set as V3; the voltage at the output end of the inverter INV4 is set as V4; the voltage at the input end of the inverter INV3 is set as V5; the voltage at the output end of the inverter INV3 is set as V6.

Figure 19:
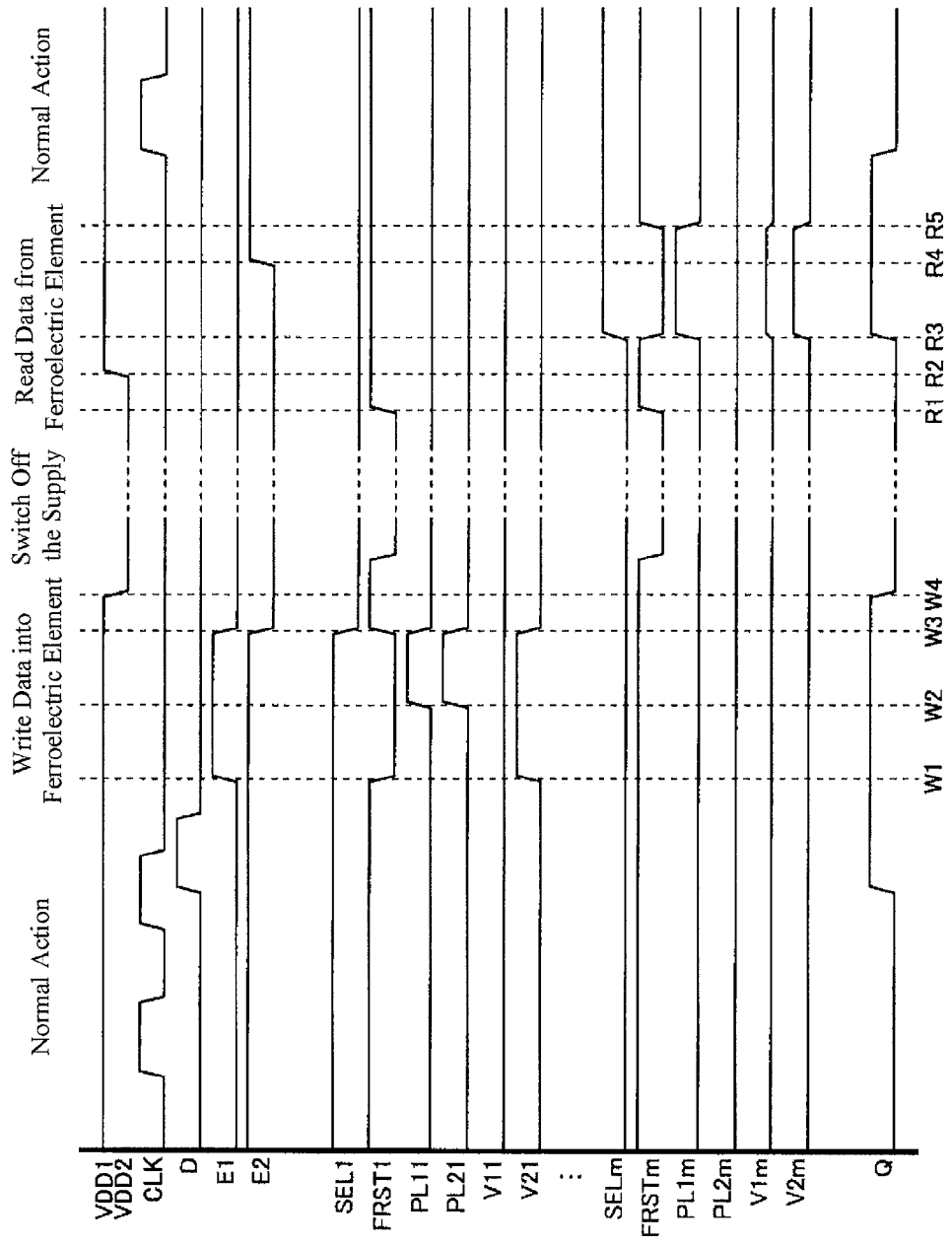
FIG. 19 is a circuit diagram showing an action example of the data hold device of the present invention.

FIG. 19 is to illustrate the sequence diagram of an action example (the action of writing the data D to the first storage area and reading the data D from the m-th storage area) of the data hold device of the present invention. The sequence diagram sequentially shows the supply voltages (VDD1, VDD2), the clock signal CLK, the data signal D, the control signal E1, the control signal E2, the control signal SEL1, the F reset signal FRST1, the applying voltage of the plate line PL11, the applying voltage of the plate line PL21, the node voltage V11, the node voltage V21, the control signal SEL$m$, the F reset signal FRST$m$, the applying voltage of the plate line PL1$m$, the applying voltage of the plate line PL2$m$, the node voltage V1$m$, the node voltage V2$m$ and the voltage waveform of the output signal Q from top to bottom.

In addition, the control signal SEL$y$, the F reset signal FRST$y$, the applying voltage of the plate line PL1$y$, the applying voltage of the plate line PL2$y$, the node voltage V1$y$, and the node voltage V2$y$ concerning the yth storage area (1≤y≤m) which is not selected as the write-in target or readout source of the data D, are the same as those of the m-th storage area which is not selected as the write-in target of the data D in the write-in action of the data D, and are the same as those of the first storage area which is not selected as the readout source of the data D in the readout action of the data D, therefore, their descriptions and illustrations are appropriately omitted.

Firstly, the normal action of the data hold device is illustrated.

Until time point W1, the F reset signals FRST1-FRSTm are "1 (high level: VDD2)", the transistors Q11$a$-Q1$ma$, Q11$b$-Q1$mb$, Q21$a$-Q2$ma$, Q21$b$-Q2$mb$ are switched on, and the respective two ends of the ferroelectric elements CL11$a$-CL1$ma$, CL11$b$-CL1$mb$, CL21$a$-CL2$ma$, CL21$b$-CL2$mb$ are in short-circuit, as a result, these ferroelectric elements CL11$a$-CL1$ma$, CL11$b$-CL1$mb$, CL21$a$-CL2$ma$, CL21$b$-CL2$mb$ are changed into the state of not applying any voltage. In addition, the plate lines PL1'-PL1$m$ and the plate lines PL21-PL2$m$ are "0 (low level: GND)".

Furthermore, until time point W1, the control signal E1 is "0 (GND)", the path switch SW3 and the path switch SW4 are switched off, so the drivers for data write-in (the inverters INV6, INV7 in the example of the FIG. 18) are unavailable.

Furthermore, until time point W1, the control signal E2 is "1 (GND)", the first input ends (1) of the multiplexer MUX1 and the multiplexer MUX2 are selected, so a normal loop is formed in the loop structure portion LOOP.

Hence, during the high level period of the clock signal CLK, the path switch SW1 is switched on and the path switch SW2 is switched off, so the data signal D directly passes through as the output signal Q. On the other side, during the low level period of the clock signal CLK, the path switch SW1 is switched off and the path switch SW2 is switched on, so the data signal is locked at the descending edge of the clock signal CLK.

Next, the action of writing data to the first storage area is illustrated.

During the period of time points W1 to W3, the control signal CLK 1 is "0 (GND)", the reverse clock signal CLKB is "1 (VDD1)". Thus, the first path switch SW1 is switched off and the second path switch SW2 is switched on. Therefore, the action stability of writing data to the ferroelectric elements can be improved by fixing the logic of the clock signal CLK and the reverse clock signal CLKB in advance.

And, during the period of time points W1 to W3, in order to select the first storage area as the write-in target of the data D, the control signal SEL 1 is "1 (VDD2)" while other control signals SEL2-SELm are "0 (GND)". Thus, the demultiplexers DeMUX1, DeMUX2 are changed into the state of selecting the signal path which connects their input ends with the first output end; the multiplexers MUX3, MUX3 are changed into the state of selecting the signal path which connects their output ends with the first input end.

Furthermore, during the period of time points W1 to W3, the F reset signal FRST1 is "0 (GND)", the transistors Q11$a$, Q11$b$, Q21$a$, Q21$b$ are switched off and changed into the state that the voltages can be applied to the ferroelectric elements CL11$a$, CL11$b$, CL21$a$, CL21$b$.

On the other side, the F reset signal FRST2-FRSTm is continuously maintained to be "1 (VDD1)", so that the data change in the second storage area to the m-th storage area can be avoided.

Moreover, during the period of time points W1 to W3, the control signal E1 is "1 (VDD2)", the path switch SW3 and the path switch SW4 are switched on. Therefore, the drivers for data write-in (the inverters INV6, INV7 in the example of the FIG. 18) are available.

In addition, during the period of time points W1 to W3, same as before, the control signal E2 is "1 (VDD1)", the first input ends (1) of the multiplexer MUX1 and the multiplexer MUX2 are selected, so a normal loop is formed in the loop structure portion LOOP.

Moreover, during the period of time points W1 to W2, the plate lines PL11, PL21 are "0 (GND)"; during the period of time points W2 to W3, the plate lines PL11, PL21 are "1 (VDD1)". That is to say, the identical pulse voltage is applied to the plate lines PL11, PL21. The residual polarization state within the ferroelectric element is set to be either of the reversed state/un-reversed state by applying such pulse voltage.

If the example of the FIG. 19 is illustrated in detail, the output signal Q is "1 (VDD1)" at the time point W1, thus, the node voltage V11 is changed to be "0 (GND)" and the node voltage V21 is changed to be "1 (VDD1)". As a result, during the period of time points W1 to W2, when the plate lines PL11, PL21 are "0 (GND)", the state between two ends of the ferroelectric elements CL11a, CL11b is changed into the one where the voltage is not applied; the state between two ends of the ferroelectric element CL21a is changed into the one where a negative voltage is applied; the state between two ends of the ferroelectric element CL21b is changed into the one where a positive voltage is applied. On the other side, during the period of time points W2 to W3, when the plate lines PL11, PL21 are "1 (VDD1)", the state between two ends of the ferroelectric elements CL21a, CL21b is changed into the one where the voltage is not applied; the state between two ends of the ferroelectric element CL11a is changed into the one where the positive voltage is applied; the state between two ends of the ferroelectric element CL11b is changed into the one where the negative voltage is applied.

Thus, the residual polarization state within the ferroelectric element is set to be either of reversed state/un-reversed state by applying the pulse voltage to the plate lines PL11, PL21. Besides, the residual polarization states between the ferroelectric elements CL11a and CL11b and, between the ferroelectric elements CL21a and CL21b are opposite to each other. Furthermore, the mutual residual polarization states between the ferroelectric elements CL11a and CL11b and, between the ferroelectric elements CL21a and CL21b are opposite to each other, as well.

Further, during the period of time points W1 to W3, the plate lines PL12-PL1m, PL22-PL2m are maintained to be "0 (GND)".

At the time point W3, the F reset signals FRST is "1 (VDD2)" again, the transistors Q11a, Q11b, Q21a, Q21b are switched on, and the respective two ends of the ferroelectric elements CL11a, CL11b, CL21a, CL21b are in short-circuit, as a result, these ferroelectric elements CL11a, CL11b CL21a, CL21b are changed into the state of not applying any voltage. At this time, the plate lines PL11, PL21 are "0 (GND)". Moreover, the control signal also is "0 (GND)".

Moreover, at the time point W, the control signal E1 is "0 (GND)" again, the path switch SW3 and the path switch SW4 are switched off, so the drivers for data write-in (the inverters INV6, INV7 in the example of the FIG. 18) are unavailable. Additionally, although the control signal E2 is not important, it is set to be "0 (GND)" in the example of the FIG. 19.

In addition, at the time point W3, the F reset signals RST2-FRSTm are maintained to be "1 (VDD2)"; the control signals SEL2-SELm and the plate lines PL12-PL1, PL22-PL2m are maintained to be "0 (GND)".

Moreover, at the time point W4, the actions of providing the loop structure portion LOOP with the first supply voltage and providing the non-volatile storage portion NVM with the second supply voltage VDD2 are interrupted. At this moment, it begins to maintain the F reset signals FRST1-FRSTm to be "1 (VDD2)"; before disconnecting from the first supply voltage VDD1 and the second supply voltage VDD2; the transistors Q11a-Q1ma, Q11b-Q1mb, Q21a-Q2ma, Q21b-Q2mb are switched on, and the respective two ends of the ferroelectric elements CL11a-CL1ma, CL11b-CL1mb, CL21a-CL2ma, CL21b-CL2mb are in short-circuit. Consequently, the ferroelectric elements CL11a-CL1ma, CL11b-CL1mb, CL21a-CL2ma, CL21b-CL2mb are changed into the state of not applying any voltage. Even if the voltage changes when the power supply is disconnected, the accidental voltages are not applied to the ferroelectric elements ferroelectric elements CL11a-CL1ma, CL11b-CL1mb, CL21a-CL2ma, CL21b-CL2mb so as to avoid the data change.

Then, the action of reading data from the m-th storage area is illustrated.

During the period of time points R1 to R5, the control signal CLK 1 is "0 (GND)", the reverse clock signal CLKB is "1 (VDD1)". Thus, the first path switch SW1 is switched off and the second path switch is switched on. In this way, the action stability for reading data from the ferroelectric elements can be improved by fixing the logic of the clock signal CLK and the reverse clock signal CLKB in advance.

At the time point R1, all of F reset signals FRST1-FRSTm are set to be "1 (VDD2)" at first; the transistors Q11a-Q1ma, Q11b-Q1mb, Q21a-Q2ma, Q21b-Q2mb are switched on, and the respective two ends of the ferroelectric elements CL11a-CL1ma, CL11b-CL1mb, CL21a-CL2ma, CL21b-CL2mb are in short-circuit. Consequently, the ferroelectric elements CL11a-CL1ma, CL11b-CL1 mb, CL21a-CL2ma, CL21b-CL2mb are changed into the state of not applying any voltage. Even if the voltage changes when the power supply is switched on, the accidental voltages are not applied to the ferroelectric elements ferroelectric elements CL11a-CL1ma, CL11b-CL1mb, CL21a-CL2ma, CL21b-CL2mb so as to avoid the data change.

Besides, at the time point R1, the plate lines PL11-PL1m and the plate lines PL21-PL2m are "0 (low level: GND)".

At the time point R2, under the state that the control signals E1, E2 are "0 (GND)" (that is to say, under the state that the drivers for data write-in are unavailable and the normal loop in the loop structure portion LOOP is unavailable), the first supply voltage VDD1 is switched on for the loop structure portion LOOP, and the second supply voltage VDD2 is switched on for the non-volatile storage portion NVM.

Next, at the time point R3, in order to select the m-th storage area as the readout source of the data D, the control signal SELm is set to be "1 (VDD2)" while other control signals SEL2-SEL (m−1) are set to be "0 (GND)". Thus, the demultiplexers DeMUX1, DeMUX2 are changed into the state of selecting the signal path which connects their input ends with the m-th output end; the multiplexers MUX3, MUX3 are changed into the state of selecting the signal path which connects their output ends with the m-th input end.

Furthermore, at the time point W3, it is changed into the state that the F reset signal FRST1 is "0 (GND)", the transistors Q1ma, Q1mb, Q2ma, Q2mb are switched off and thus the voltages can be applied to the ferroelectric elements CL11a, CL11b, CL21a, CL21b. On the other side, the plate line PL2m is maintained to be "0 (GND)", the plate line PL1*m* is marinated to be "1 (VDD2)". Voltage signals corresponding to the residual polarization states within the ferroelectric elements come out as node voltage V1*m* and node voltage V2*m* by applying such pulse voltage.

If the example (the case that the data D of logic "1" is stored in the m-th storage area) of the FIG. 19 is specifically illustrated, WL comes out as logic of the node voltage V1*m*; WH comes out as logic of the node voltage V2*m*. That is, a voltage difference corresponding to the difference of the residual polarization states within the ferroelectric elements is generated between the node voltage V1*m* and the node voltage V2*m*.

Now, during the period of time points R3-R4, the control signal E2 is "0 (GND)", and the second input ends (0) of the multiplexer MUX1 and the multiplexer MUX2 are selected, consequently, the logic of the node voltage V3 is changed to be WL; the logic of the node voltage V4 is changed to be WH. Besides, the logic of the node voltage V5 is changed to be WH and the logic of the node voltage V6 is changed to be WL. Therefore, during the period of time points R3-R4, the node voltages V1*m*, V2*m*, V3-V6 at each portion of the device are still in unstable state (in which the logic reversions in the inverter INV3 and the inverter INV4 are not completely performed, and their output logic are not certainly changed to be "0 (GND)"/"1 (VDD1)").

In addition, at the time point R3, the F reset signals FRST1-FRST (m−1) are maintained to be "1 (VDD2)"; the control signals SEL1-SEL (m−1), the plate lines PL11-PL1 (m−1), PL21-PL2 (m−1) are maintained to be "0 (GND)".

Then, at the time point R4, the control signal E2 is "1 (VDD1)", and the first input ends (1) of the multiplexer MUX1 and the multiplexer MUX2 are selected, so a normal loop is formed in the loop structure portion LOOP. Along with the switch of such signal path, the output end (logic: WH) of the inverter INV4 is connected with the input end (logic: WH) of the inverter INV3; the output end (logic: WL) of the inverter (INV3) is connected with the input end (logic: WL) of the inverter INV4. Thus, the signal logic (WH/WL) of each node will not generate unmatched. Afterwards, during the period of forming a normal loop in the loop structure portion LOOP, the inverter INV3 receives the input of the logic WL to increase the output logic thereof to be "1 (VDD1)"; the inverter INV4 receives the input of the logic WH to decrease the output logic thereof to be "0 (GND)". This determines the output logic of the inverter INV3 from the unstable logic WL to be "0 (GND)" and determines the output logic of the inverter INV4 from the unstable logic WH to be "1 (VDD1)".

Consequently, at the time point R4, accompanied by the change of the loop structure portion LOOP into a normal loop, the signal (the potential difference between the node voltage V1*m* and the node voltage V2*m*) read from the ferroelectric element is amplified by the loop structure portion LOOP and used as the output signal Q to recover the hold data ("1 (VDD1)". in the example of the FIG. 19) of the third storage area.

Then, at the time point R45, the F reset signal FRSTm is "1 (VDD2)" again, the transistors Q1*ma*, Q1*mb*, Q2*ma*, Q2*mb* are switched on, and the respective two ends of the ferroelectric elements CL1*ma*, CL1*mb*, CL2*ma*, CL2*mb* are in short-circuit, so these ferroelectric elements CL1*ma*, CL1*mb*, CL2*ma*, CL2*mb* are changed into the state of not applying any voltage. At this time, the plate line PL1*m* and the plate line PL2*m* are "0 (GND)", As a result, the data hold device is recovered to the same state as that before the time point W1, i.e., normal action state.

As mentioned above, in the data hold device of the fourth embodiment, the non-volatile storage portion NVM which is structured to use the hysteresis characteristics of the ferroelectric elements to store the data held in the loop structure portion LOOP in a non-volatile manner, includes m storage areas utilizing the ferroelectric elements, and selects the storage area used as the write-in target or the readout source of the data D for use based on the given control signals SEL1-SELm. With this structure, it is able to achieve arbitrarily switching several data hold devices used by data D.

In addition, when the data hold device is in normal action, as the ferroelectric elements are separated from the signal lines, the increase of the ferroelectric elements will not lead to performance degradation (speed degradation or power consumption increase, etc.) of the data hold device.

Figure 20:
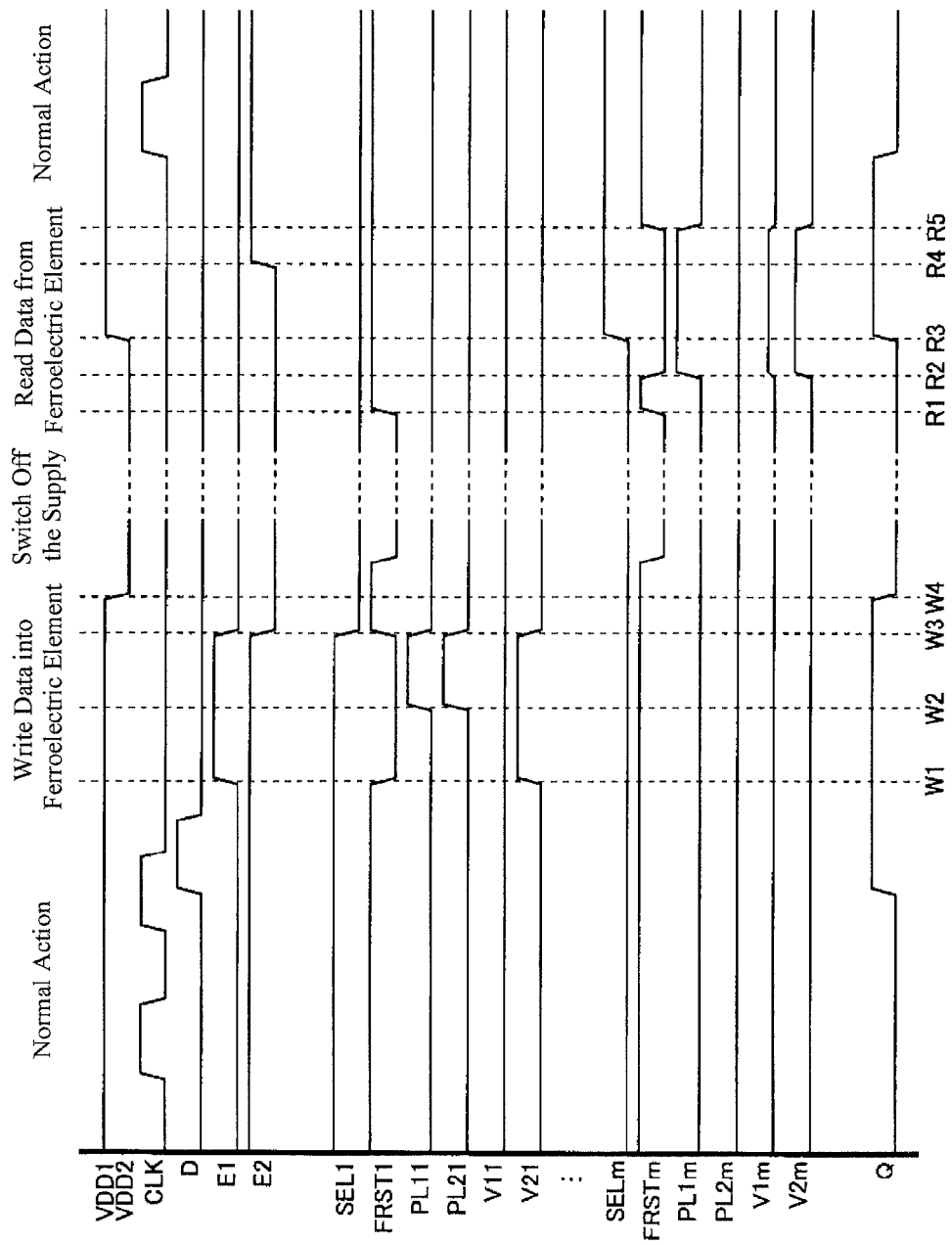
FIG. 20 is a circuit diagram showing other action example of the data hold device of the present invention.

Next, the embodiment of action of reading data from the m-th storage area is illustrated in detail while referring to FIG. 20. FIG. 20 is a sequence diagram for illustrating other action examples of the data hold device of the present invention; the sequence diagram sequentially shows the supply voltages (VDD1, VDD2), the clock signal CLK, the data signal D, the control signal E1, the control signal E2, the control signal SEL1, the F reset signal FRST1, the applying voltage of the plate line PL11, the applying voltage of the plate line PL21, the node voltage V11, the node voltage V21, the control signal SELm, the F reset signal FRSTm, the applying voltage of the plate line PL1*m*, the applying voltage of the plate line PL2*m*, the node voltage V1*m*, the node voltage V2*m* and the voltage waveform of the output signal Q from top to bottom.

In addition, the control signal SEL*y*, the F reset signal FRST*y*, the applying voltage of the plate line PL1*y*, the applying voltage of the plate line PL2*y*, the node voltage V1*y*, and the node voltage V2*y* concerning the y-th storage area (1<y<m) which is not selected as the write-in target or readout source of the data D, are the same as those of the m-th storage area which is not selected as the write-in target of the data D in the write-in action of the data D, and are the same as those of the first storage area which is not selected as the readout source of the data D in the readout action of the data D, therefore, their descriptions and illustrations are appropriately omitted.

From time point R1 to R5, the control signal CLK 1 is "0 (GND)"; the reverse clock signal CLKB is "1 (VDD1)". Thus, the first path switch SW1 is switched off and the second path switch is switched on. In this way, the action stability for reading data from the ferroelectric elements can be improved by fixing the logic of the clock signal CLK and the reverse clock signal CLKB in advance.

At the time point R1, the F reset signals FRST1-FRSTm are set to be "1 (VDD2)" at first; the transistors Q11*a*-Q1*ma*, Q11*b*-Q1*mb*, Q21*a*-Q2*ma*, Q21*b*-Q2*mb* are switched on, and the respective two ends of the ferroelectric elements CL11*a*-CL1*ma*, CL11*b*-CL1*mb*, CL21*a*-CL2*ma*, CL21*b*-CL2*mb* are in short-circuit. Consequently, the ferroelectric elements CL11*a*-CL1*ma*, CL11*b*-CL1 mb, CL21*a*-CL2*ma*, CL21*b*-CL2*mb* are changed into the state of not applying any voltage. Even if the voltage changes when the power supply is switched on, the accidental voltages are not applied to the ferroelectric elements CL11*a*-CL1*ma*, CL11*b*-CL1*mb*, CL21*a*-CL2*ma*, CL21*b*-CL2*mb* so as to avoid the data change.

In addition, at the time point R1, the plate lines PL11-PL1*m* and the plate lines PL21-PL2*m* are "0 (low level: GND)".

At the time point R2, it is changed into the state that the F reset signal FRSTm is "0 (GND)", the transistors Q1*ma*, Q1*mb*, Q2*ma*, Q2*mb* are switched off and thus the voltages can be applied to the ferroelectric elements CL1*ma*, CL1*mb*, CL2*ma*, CL2*mb*. On the other side, the plate line PL2*m* is maintained to be "0 (GND)" and the plate line PL1*m* is maintained to be "1 (VDD2)". Voltage signals corresponding to the residual polarization states within the ferroelectric elements come out as node voltage V1*m* and node voltage V2*m* by applying such pulse voltage.

If the example (the case that the data D of logic "1" is stored in the third storage area) of the FIG. 20 is specifically illustrated, WL comes out as logic of the node voltage V1*m*; WH comes out as logic of the node voltage V2*m*. That is, a voltage difference corresponding to the difference of the residual polarization states within the ferroelectric elements is generated between the node voltage V1*m* and the node voltage V2*m*.

Nevertheless, during the period of time points R2 to R3, because the first supply voltage VDD1 is still switched off, the node voltages V3-V6 at the loop structure portion LOOP are changed to be "0 (GND)", and the output signal Q is also changed to be "0 (GND)".

Then, at the time point R3, in order to select the m-th storage area as the readout source of the data D, the control signal SELm is set to be "1 (VDD2)" while other control signals SEL2-SEL(m−1) are set to be "0 (GND)". Thus, the demultiplexers DeMUX1, DeMUX2 are changed into the state of selecting the signal path which connects their input ends with the m-th output end; the multiplexers MUX3, MUX3 are changed into the state of selecting the signal path which connects their output ends with the m-th input end.

Moreover, at the time point R3, under the state that the control signals E1, E2 are "0 (GND)" (that is to say, under the state that the drivers for data write-in are unavailable and the normal loop in the loop structure portion LOOP is unavailable), the first supply voltage VDD1 is switched on for the loop structure portion LOOP, and the second supply voltage VDD2 is switched on for the non-volatile storage portion NVM.

In addition, during the period of time points R3-R4, the control signal E2 is "0 (GND)", and the second input ends (0) of the multiplexer MUX1 and the multiplexer MUX2 are selected, consequently, the logic of the node voltage V3 is changed to be WL; the logic of the node voltage V4 is changed to be WH. Additionally, the logic of the node voltage V5 is changed to be WH and the logic of the node voltage V6 is changed to be WL. Therefore, during the period of time points R3-R4, the node voltages V1-V6 at each portion of the device are still in unstable state (in which the logic reversions in the inverter INV3 and the inverter INV4 are not completely performed, and their output logic are not certainly changed to be "0 (GND)"/"1 (VDD1)").

Then, at the time point R4, the control signal E2 is "1 (VDD1)", and the first input ends (1) of the multiplexer MUX1 and the multiplexer MUX2 are selected, so a normal loop is formed in the loop structure portion LOOP. Along with the switch of this signal path, the output end (logic: WH) of the inverter INV4 is connected with the input end (logic: WH) of the inverter INV3; the output end (logic: WL) of the inverter (INV3) is connected with the input end (logic: WL) of the inverter INV4. Thus, the signal logic (WH/WL) of each node will not generate unmatched. Afterwards, during the period of forming a normal loop in the loop structure portion LOOP, the inverter INV3 receives the input of the logic WL to increase the output logic thereof to be "1 (VDD1)"; the inverter INV4 receives the input of the logic WH to decrease the output logic thereof to be "0 (GND)". This determines the output logic of the inverter INV3 from the unstable logic WL to be "0 (GND)" and determines the output logic of the inverter INV4 from the unstable logic WH to be "1 (VDD1)".

Consequently, at the time point R4, accompanied by the change of the loop structure portion LOOP into a normal loop, the signal (the potential difference between the node voltage V1*m* and the node voltage V2*m*) read from the ferroelectric signal is amplified by the loop structure portion LOOP and used as the output signal Q to recover the hold data ("1 (VDD1)" in the example of the FIG. 19) of the third storage area.

Then, at the time point R5, the F reset signal FRSTm is "1 (VDD2)" again, the transistors Q1*ma*, Q1*mb*, Q2*ma*, Q2*mb* are switched on, and the respective two ends of the ferroelectric elements CL1*ma*, CL1*mb*, CL2*ma*, CL2*mb* are in short-circuit, so these ferroelectric elements CL1*ma*, CL1*mb*, CL2*ma*, CL2*mb* are changed into the state of not applying any voltage. At this time, the plate line PL1*m* and the plate line PL2*m* are "0 (GND)", As a result, the data hold device is recovered to the normal action state which is the same as that before the time point W1.

As mentioned above, the data readout action of the FIG. 20 is different from that of the FIG. 19 and it is structured to start the leading-out action of the voltage signals (node voltages V1*m*, V2*m*) corresponding to the residual polarization states within the ferroelectric elements before switching on the first supply voltage VDD1 and the second supply voltage VDD2. With this structure, after switching on the first supply voltage VDD1 and the second supply voltage VDD2, the number of the action step (three steps (time points R3, R4, R5) are needed in the action example of the FIG. 19, and relatively only two steps are needed in the action example of the FIG. 20) can be reduced, so that the time required for recovering to the normal action can be shortened.

<CPU Process Switching Action>

Figure 21:
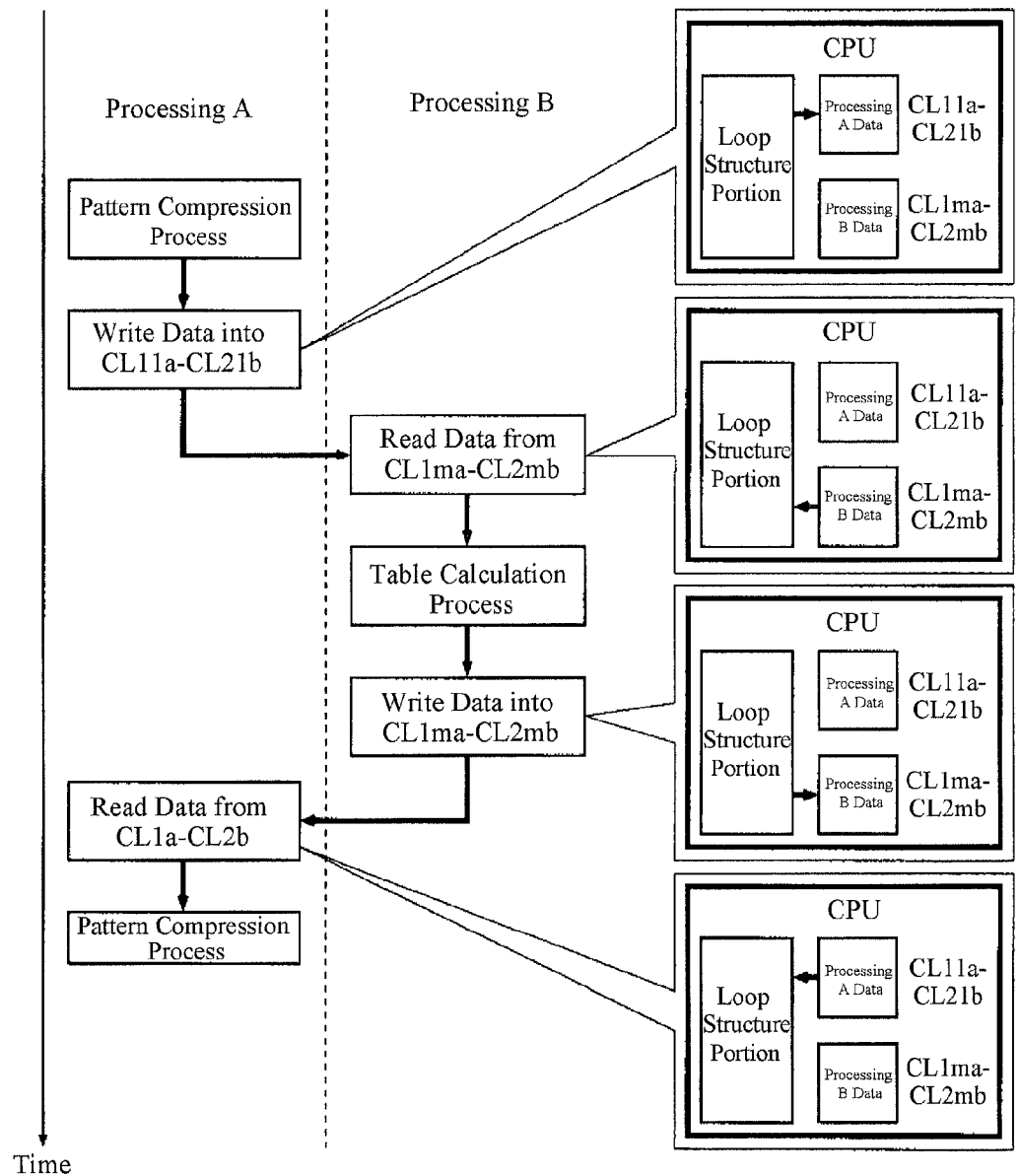
FIG. 21 illustrates a schematic diagram showing an example of the processing of shifting action using data substitution.
Figure 25:
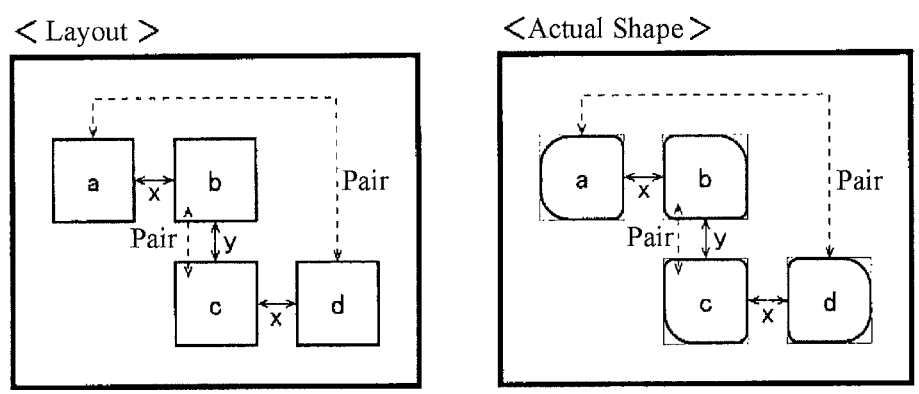
FIG. 25 illustrates a schematic diagram showing the fourth layout example of cell pattern.

Then, the process switching action for applying the data hold device of the fourth embodiment to the CPU is illustrated while referring to the FIG. 21. FIG. 21 is a schematic diagram showing an example which uses the data substitution to perform process switching action. Its schematic meaning shows the following situations: the process A, for example, animation compression process and the process B, for example, table computing process, are alternatively switched by arbitrarily switching the first storage area and the m-th storage area of the data hold device for use. Moreover, on the left side of the FIG. 21, a vertical axis is used as time axis to show the situation that the process A and the process B are alternatively switched. On the right side of the FIG. 21, the action state of the data hold device used within the CPU is schematically signified.

Under the condition of switching from the process A to the process B, the data hold device writes the data DA related to the process A to the first storage area (CL11*a*-CL21*b*) and reads the data DB related to the process B from the m-th storage area (CL1*ma*-CL2*mb*) to perform the substitution process on the data stored in the data hold device. On the other side, under the condition of switching from the process B to the process A, on the contrary, the data hold device writes the data DB related to the process B to the m-th storage area (CL1*ma*-CL2*mb*) and reads the data DA related to the process A from the first storage area (CL11*a*-CL21*b*) to perform the substitution process on the data stored in the data hold device. The process executed by the CPU can be switched instantly by such substitution process of data.

Additionally, it is not always necessary to perform the process switch of the CPU by data substitution during the disconnection period of the power supply previously shown in FIG. 19 and FIG. 20.

<Cell Pattern>

Next, the layouts of the cell patterns of the ferroelectric elements are illustrated in detail while referring to the FIG. 22-FIG. 25. FIG. 22-FIG. 25 are schematic diagrams showing the first layout example to the fourth layout example of the cell patterns of the ferroelectric elements, respectively. Moreover, the marks a-d in the figures respectively represent the ferroelectric elements; the marks x and y respectively represent the distance between elements.

When forming several ferroelectric elements on a semiconductor substrate, all of the ferroelectric elements in their layout period are designed into the same shape, for example, square or oblong shape in an overlook view; however, regarding the feature of manufacturing process, after masking process or etching process, the actual shapes of the elements formed on the semiconductor substrate are mostly not the designed shapes.

For example, in the FIG. 22, there are no other elements close to any four sides of the ferroelectric elements a, d, so the corner portions of the elements are easily etched, and the elements formed on the semiconductor substrate are actually shaped in such a manner that four corners of every element are changed into relatively bigger rounds. On the other side, the ferroelectric elements b, c are close to each other in such a manner that they are facing to each other with respective one side, thus, the element corner portion including the side is hard to be etched. The elements formed on the semiconductor substrate are actually shaped in such a manner that two corners facing to each other are changed into relatively smaller rounds while the other two corners are changed into relatively bigger rounds in the four corners of every element. It is the same as the examples of the FIG. 23-FIG. 25.

Consequently, the elements formed on the semiconductor substrate are actually shaped in such a manner that the etching degrees of four corners are different from each other in accordance with the density of the elements; it only needs to configure the pair of the ferroelectric element CL1a and the ferroelectric element CL1b, and the pair of the ferroelectric element CL2a and the ferroelectric element CL2b to be equivalent to the actual shapes formed on the semiconductor substrate.

For the example of the FIG. 22, the ferroelectric elements a, d may be set as a first pair and the ferroelectric elements b, c may be set as a second pair. Furthermore, for the example of the FIG. 23, the ferroelectric elements a, b may be set as a first pair and the ferroelectric elements c, d may be set as a second pair (referring to (a) in the figure), or the ferroelectric elements a, c may be set as a first pair and the ferroelectric elements b, d are set as a second pair (referring to (b) in the figure). Moreover, for the example of the FIG. 24, the ferroelectric elements a, c may be set as a first pair and the ferroelectric elements b, d may be set as a second pair (referring to (a) in the figure); the ferroelectric elements a, b may also be set as a first pair and the ferroelectric elements c, d may be set as a second pair (referring to (b) in the figure); alternatively, the ferroelectric elements a, d may be set as a first pair and the ferroelectric elements b, c may be set as a second pair (referring to (c) in the figure); moreover, for the example of the FIG. 25, it only needs to set the ferroelectric elements a, d as a first pair and set the ferroelectric elements b, c as a second pair.

By the layout of such cell pattern, the shapes (area) of a pair of ferroelectric elements are the same, therefore, their pairing features can be improved and the data hold feature of the data hold device can be further improved.

Furthermore, as shown in the FIG. 18, the situation that several storage areas are arranged is the same as the mentioned layout. Regarding the pair of the ferroelectric elements CL11a-CL1ma and the ferroelectric elements CL11b-CL1mb, and the pair of the ferroelectric elements CL21a-CL1ma and the ferroelectric elements CL21b-CL2mb, it is important to keep their shapes (areas) in accordance with each other.

The Fifth Embodiment

Figure 26:
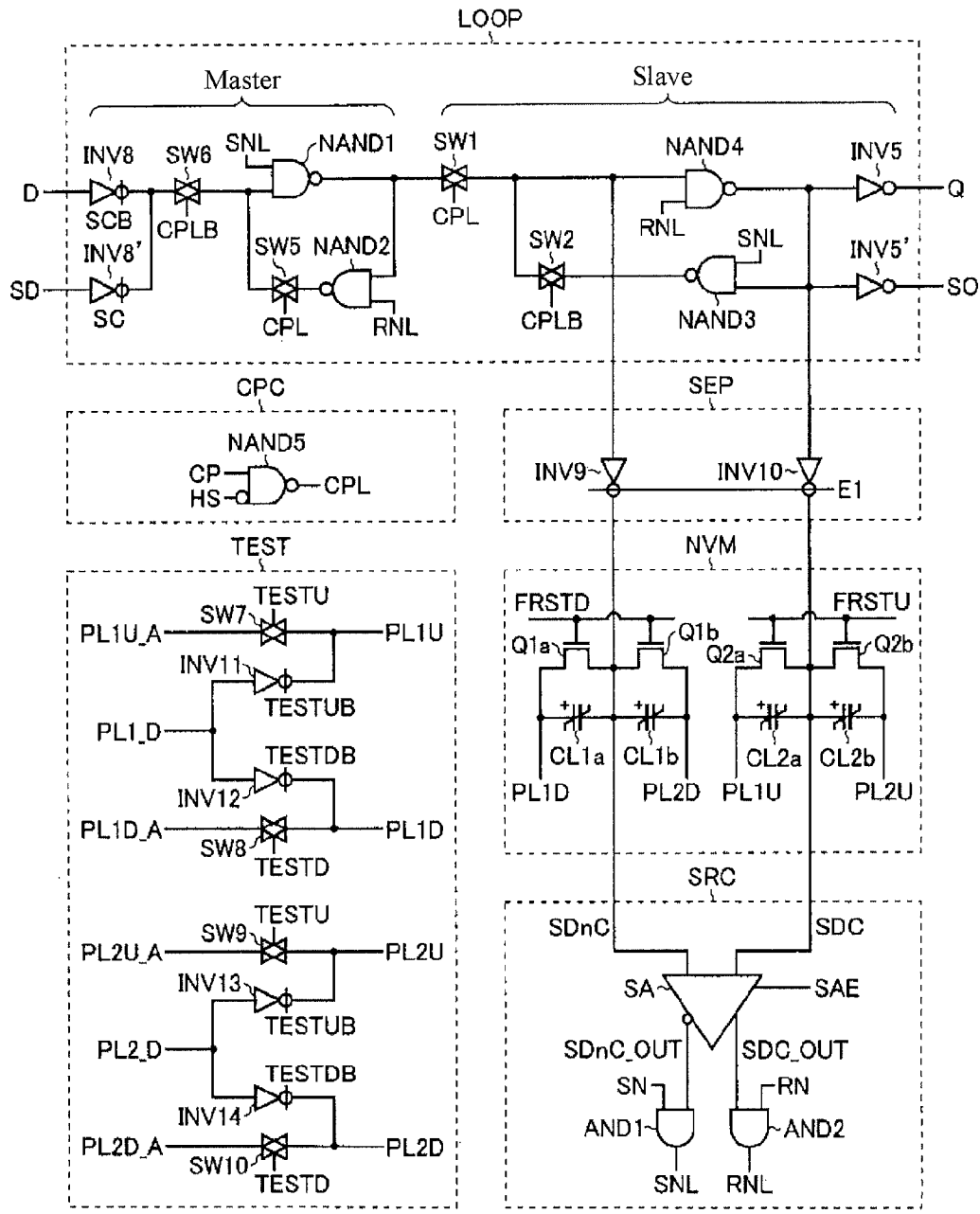
FIG. 26 represents a circuit diagram showing the fifth embodiment of the data hold device of the present invention.

Then it describes the fifth embodiment of the data hold device of the present invention in details referring to FIG. 26. FIG. 26 is a circuit diagram of the fifth embodiment of data hold device of the present invention. And so far in the description, it exemplifies the structure offering different supply voltages to the loop structure portion LOOP and the non-volatile storage portion NVM respectively, however, the present invention is not restricted thereof, it also can offer the same supply voltage to the loop structure portion LOOP and the non-volatile storage portion NVM. Hence, in the following fifth embodiment, it will not mention whether the supply voltage offered to the loop structure portion LOOP and the non-volatile storage portion NVM is consistent/inconsistent, but to focus on explaining portions of the structure different from the previous disclosure.

As shown in FIG. 26, the data hold device of the embodiment includes the loop structure portion LOOP, the non-volatile storage portion NVM, and the circuit separating portion SEP, as well as the set/reset control portion SRC, the clock pulse control portion CPC, the testing circuit portion TEST, which works as a D trigger (register) having set/reset function.

The loop structure portion LOOP includes NAND operators NAND1~NAND4, path switches SW1, SW2, SW5, SW6, inverters INV5 and INV5', 3-state inverters INV8 and INV8'.

The input end of the inverter INV8 is connected to the input end of the data D. The input end of the inverter INV8' is connected to the input end of the scan data SD. The output ends of the inverters INV8 and INV8' are connected to a first input end of the NAND operator NAND1 via the path switch SW6. A second input end of the NAND operator NAND1 is connected to the input end of the internal device signal SNL. The output end of the NAND operator NAND1 is connected to the first input end of the NAND operator NAND2, as well as connecting to the first input end of the NAND operator NAND4 via the path switch SW1. The second input end of the NAND operator NAND2 is connected to the input end of the internal reset signal RNL. The output end of the NAND operator NAND2 is connected to the first input end of the NAND operator NAND1 via the path switch SW5.

The second input end of the NAND operator NAND4 is connected to the input end of the internal reset signal RNL. The output end of the NAND operator NAND4 is connected to the output end of the output data Q via the inverter INV5 as well as connecting to the output end of the scanning output data SO via the inverter INV5'. And the output end of the NAND operator NAND4 also is connected to the first input end of the NAND operator NAND3. The second input end of the NAND operator NAND3 is connected to the input end of the internal device signal SNL. The output end of the NAND operator NAND3 is connected to the first input end of the NAND operator NAND4 via the path switch SW2.

The control end of the inverter INV8 is connected to the input end of the reverse scan control signal SCB (scanning logic reverse signal of the control signal SCB). The control end of the inverter INV8' is connected to the input end of the scan control signal SC. Hence, the inverter INV8 and the inverter INV8' are exclusively (complementarily) turning their output ends into high impedance state.

The control ends of the path switch SW1 and the path switch SW5 are connected to the input end of the internal clock signal CPL. The control ends of the path switch SW2 and the path switch SW6 are connected to the input end of the reverse internal clock signal CPLB (the logic reverse signal of the internal clock signal CPL). Hence, the path switches SW1 and SW5 and the path switches SW2 and SW6 are exclusively (complementarily) switch on/switch off. More specifically, when the path switches SW1 and SW5 switch on, the path switches SW2 and SW6 switch off, while the path switches SW1 and SW5 switch off, the path switches SW2 and SW6 switch on.

Thus the same as the embodiment, in the data hold device of this embodiment, it also has the basic structure of the loop structure portion LOOP, i.e. using the logic gate (NAND operators NAND1 and NAND2 are driving side and NAND operators NAND3 and NAND4 are following side) connected in a loop form to maintain the input data signal D. However, the loop structure portion LOOP forming the data hold device in the present embodiment has the following features: removing multiplexer MUX1 and MUX2 without clock stopping processing during data storage/recover; and using the input output functions of the serial data of the scanning path.

The non-volatile storage portion NVM includes ferroelectric elements CL1a, CL1b, CL2a and CL2b, and N-channel MOS field effect transistors Q1a, Q1b, Q2a and Q2b.

The positive pole end of the ferroelectric element CL1a is connected to a first plate line PL1D of D system. The negative pole end of the ferroelectric element CL1a is connected to the first input end of the NAND operator NAND4 forming the loop structure portion LOOP via the circuit separating portion SEP (inverter INV9). A transistor Q1a is connected between the two ends of the ferroelectric element CL1a. The gate of the transistor Q1a is connected to the applying end of the F reset signal FRSTD of the D system.

The positive pole end of the ferroelectric element CL1b is connected to the first input end of the NAND operator NAND4 forming the loop structure portion LOOP via the circuit separating portion SEP (inverter INV9). The negative pole end of the ferroelectric element CL1b is connected to a second plate line PL2D of D system. A transistor Q1b is connected between the two ends of the ferroelectric element CL1b. The gate of the transistor Q1b is connected to the applying end of the F reset signal FRSTD of the D system.

The positive pole end of the ferroelectric element CL2a is connected to a first plate line PL1U of U system. The negative pole end of the ferroelectric element CL2a is connected to the first input end of the NAND operator NAND3 forming the loop structure portion LOOP via the circuit separating portion SEP (inverter INV10). A transistor Q2a is connected between the two ends of the ferroelectric element CL2a. The gate of the transistor Q2a is connected to the applying end of the F reset signal FRSTD of the F system.

The positive pole end of the ferroelectric element CL2b is connected to the first input end of the NAND operator NAND3 forming the loop structure portion LOOP via the circuit separating portion SEP (inverter INV10). The negative pole end of the ferroelectric element CL2b is connected to a second plate line PL2U of U system. A transistor Q2b is connected between the two ends of the ferroelectric element CL2b. The gate of the transistor Q2b is connected to the applying end of the F reset signal FRSTD of the U system.

Thus, the same as the embodiment, in the data hold device, it also has the basic structure of the non-volatile storage portion NVM, i.e. using the hysteresis characteristics of the ferroelectric elements (CL1a, CL1b, CL2a and CL2b) to realize the non-volatile storage of the data D which maintains in the loop structure portion LOOP. However, the non-volatile storage portion NVM of the data hold device in the present embodiment has the following characteristics: corresponding two systems (U system/D system) has a first plate line, a second plate line and a F reset signal line respectively so as to estimate the features of the ferroelectric elements (CL1a, CL1b, CL2a and CL2b) via the testing circuit portion TEST.

As a mechanism electrically separating the loop structure portion LOOP and the non-volatile storage portion NVM, the circuit separating portion SEP includes inverters INV9 and INV10. Each of the output ends of the inverters INV9 and INV10 turns into high impedance state according to the control signal E1.

The set/reset control portion SRC includes a sense amplifier (differential amplifier) SA and AND operators AND1 and AND2. The first input end of the sense amplifier SA is connected to the D system output end (the connecting node between the negative pole end of the ferroelectric element CL1a and the positive pole end of the ferroelectric element CL1b) of the non-volatile storage portion NVM. The second input end of the sense amplifier SA is connected to the U system output end (the connecting node between the negative pole end of the ferroelectric element CL2a and the positive pole end of the ferroelectric element CL2b) of the non-volatile storage portion NVM. The first output end (reverse form) of the sense amplifier SA is connected to the first input end of the AND operator AND1. The second input end of the AND operator AND1 is connected to the input end of the external device signal SN. The output end of the AND operator AND1 works as the output end of the internal device signal SNL. The second output end of the sense amplifier SA is connected to the first input end of the AND operator AND2. The second input end of the AND operator AND2 is connected to the input end of the external reset signal RN. The output end of the AND operator AND2 works as the output end of the internal reset signal RNL. The control end of the sense amplifier SA is connected to the sense amplifier to enable the input end of the signal SAE. And the specific actions of the set/reset control portion SRC of the structure will be explained in details in the following texts.

The clock pulse control portion CPC includes the NAND operator NAND5. The first input end of the NAND operator NAND5 is connected to the input end of the external clock signal CP. The second input end (reverse input form) of the NAND operator NAND5 is connected to the input end of the data hold control signal HS. The output end of the NAND operator NAND5 works as the output end of the internal clock signal CPL. Hence, when the data hold control signal HS is high level (clock ineffective state), the internal clock signal CPL always turns into high level signal without depending on the external clock signal CP, and when the data hold control signal HS is low level (clock effective state), the internal clock signal CPL turns into the logic reverse signal of the external clock signal CP.

The testing circuit portion TEST includes the 3-state inverters INV11-INV14 and the path switches SW7-SW10.

The input ends of the inverters INV11 and INV12 are connected to the first digital plate line PL1_D. The output end of the inverter INV11 is connected to the first plate line PL1U of the U system. The output end of the inverter INV12 is connected to the first plate line PL1D of D system. The control end of the inverter INV11 is connected to the input end of the reverse analog enable signal TESTUB (the logic reverse signal of the analog enable signal TESTU) of the U system. The control end of the inverter INV12 is connected to the input end of the reverse analog enable signal TESTDB (the logic reverse signal of the analog enable signal TESTD) of the D system.

The input end of the path switch SW7 is connected to the first analog plate line PL1U_A of the U system. The output end of the path switch SW7 is connected to the first plate line PL1U of the U system. The control end of the path switch SW7 is connected to the input end of the analog enable signal TESTU of the U system. The input end of the path switch SW8 is connected to the first analog plate line PL1D_A of the D system. The output end of the path switch SW8 is connected to the first plate line PL1D of the D system. The control end of the path switch SW8 is connected to the input end of the analog enable signal TESTD of the D system.

The input ends of the inverters INV13 and INV14 is connected to the second digital plate line PL2_D. The output end of the inverter INV13 is connected to the second plate linePL2U of the U system. The output end of the inverter INV14 is connected to the second plate line PL2D of the D system. The control end of the inverter INV13 is connected to the input end of the reverse analog enable signal TESTUB (the logic reverse signal of the analog enable signal TESTU) of the U system. The control end of the inverter INV14 is connected to the input end of the reverse analog enable signal TESTDB (the logic reverse signal of the analog enable signal TESTD).

The input end of the path switch SW9 is connected to the second analog plate line PL2U_A of the U system. The output end of the path switch SW9 is connected to the second plate line PL2U of the U system. The control end of the path switch SW9 is connected to the input end of the analog enable signal TESTU of the U system. The input end of the path switch SW10 is connected to the second analog plate line PL2D_A of the D system. The output end of the path switch SW10 is connected to the second plate line PL2D of the D system. The control end of the path switch SW10 is connected to the input end of the analog enable signal TESTD of the D system.

In the testing circuit portion TEST, the analog enable signal TESTU of U system and the analog enable signal TESTD of D system are departure logic with each other. More specifically, when the analog enable signal TESTU of U system is high level (enable logic), the analog enable signal TESTD of D system is set as low level (disable logic). On the contrary, when the analog enable signal TESTU of U system is low level (disable logic), the analog enable signal TESTD of D system is set as high level (enable logic). And the specific actions of the testing circuit portion TEST will be explained in details in the following texts.

Figure 27:
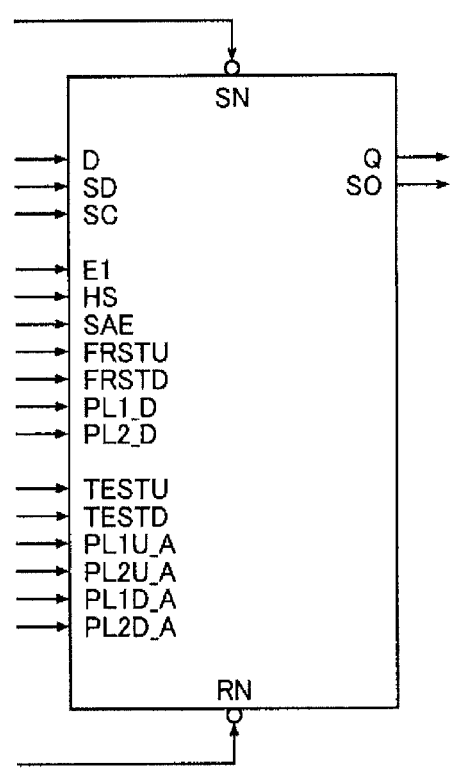
FIG. 27 represents a block diagram showing the pin used by the data hold device of the fifth embodiment.

FIG. 27 is the block diagram of the signal needles used by the data hold device of the fifth embodiment, FIG. 28 is the function specification chart of the signal needles. As shown in the two figures, in the data hold device of the present embodiment, the signal needle for logic control is arranged with clock terminals (CP), data input terminals (D), pre-set terminals (SN), clear terminals (RN), scan data input terminals (SD) and scan control terminals (SC). Moreover, the signal needle for controlling the ferroelectric elements is arranged with ferroelectric element writing-in enable terminals (E1), data hold terminals (HS), sense amplifier enable terminals (SAE), U system ferroelectric element reset terminals (FRSTU), D system ferroelectric element reset terminals (FRSTD), first plate line digital input terminals (PL1_D) and second plate line digital input terminals (PL2_D). Moreover, the signal needle for testing the ferroelectric element is arranged with U system PL1/2 analog enable terminals (TESTU), D system PL1/2 analog enable terminals (TESTD), PL1U analog input terminals (PL1U_A), PL2U analog input terminals (PL2U_A), PL1D analog input terminals (PL1D_A), PL2D analog input terminals (PL2D_A), scanning output terminals (SO) and output terminals (Q).

Figure 29:
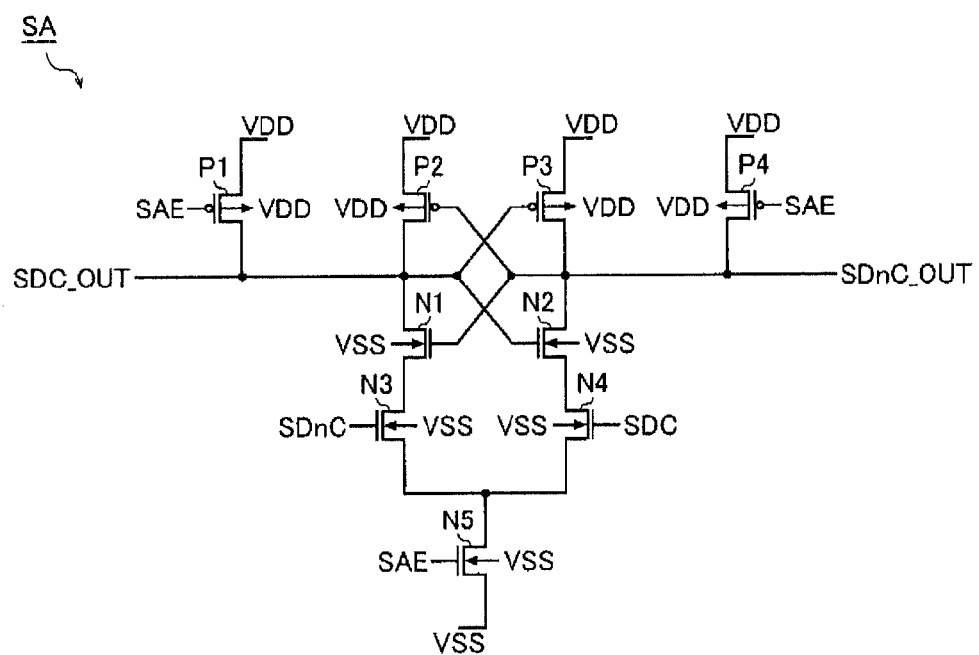
FIG. 29 represents a circuit diagram showing one structure example of the sense amplifier SA.

FIG. 29 is the circuit diagram of a structure example of the sense amplifier SA. The sense amplifier SA in the present structure example includes P-channel field effect transistors P1-P4, and N-channel field effect transistors N1-N5.

The source and the back gate of the transistor P1 are connected to the applying end of the supply voltage VDD. The drain of the transistor P1 is connected to the second output end (the output end of the second output signal SDC_OUT) of the sense amplifier SA. The gate of the transistor P1 is connected to the input end of the sense amplifier enable signal.

The source and the back gate of the transistor P2 are connected to the applying end of the supply voltage VDD. The drain of the transistor P2 is connected to the second output end (the output end of the second output signal SDC_OUT) of the sense amplifier SA. The gate of the transistor P2 is connected to the first output end (the output end of the first output signal SDC_OUT) of the sense amplifier SA.

The source and the back gate of the transistor P3 are connected to the applying end of the supply voltage VDD. The drain of the transistor P3 is connected to the first output end (the output end of the first output signal SDnC_OUT) of the sense amplifier SA. The gate of the transistor P3 is connected to the second output end (the output end of the second output signal SDC_OUT) of the sense amplifier SA.

The source and the back gate of the transistor P4 are connected to the applying end of the supply voltage VDD. The drain of the transistor P4 is connected to the first output end (the output end of the first output signal SDnC_OUT) of the sense amplifier SA. The gate of the transistor P4 is connected to the input end of the sense amplifier enable signal SAE.

The drain of the transistor N1 is connected to the second output end (the output end of the second output signal SDC_OUT) of the sense amplifier SA. The source of the transistor N1 is connected to the drain of the transistor N3. The gate of the transistor N is connected to the first output end (the output end of the first output signal SDnC_OUT) of the sense amplifier S. The back gate of the transistor N1 is connected to the applying end of the grounding voltage VSS.

The drain of the transistor N is connected to the first output end (the output end of the first output signal SDnC_OUT) of the sense amplifier SA. The source of the transistor N2 is connected to the drain of the transistor N4. The gate of the transistor N2 is connected to the second output end (the output end of the second output signal SDC_OUT) of the sense amplifier SA. The back gate of the transistor N2 is connected to the applying end of the grounding voltage VSS.

The drain of the transistor N3 is connected to the source of the transistor N1. The source of the transistor N3 is connected to the drain of the transistor N5. The gate of the transistor N3 is connected to the first input end (the input end of the first input signal SDnC) of the source amplifier SA. The back gate of the transistor N3 is connected to the applying end of the grounding voltage VSS.

The drain of the transistor N4 is connected to the source of the transistor N2. The source of the transistor N4 is connected to the drain of the transistor N5. The gate of the transistor N4 is connected to the second input end (the input end of the second input signal SDC) of the source amplifier SA. The back gate of the transistor N4 is connected to the applying end of the grounding voltage VSS.

The drain of the transistor N5 is connected to each of the sources of the transistors N3 and N4. The source and back gate of the transistor N5 are connected to the applying end of the grounding voltage VSS. The gate of the transistor N5 is connected to the input end of the sense amplifier enable signal SAE.

In the source amplifier SA, when the sense amplifier enable signal SAE is high level (enable logic), the transistors P1 and P2 switch off, the transistor N5 switches on, and the actions of the source amplifier SA are in an allowable status. Now, if the voltage of the first input signal SDnC is higher than the second input signal SDC, thus the first output signal SDnC_OUT turns into high level (supply voltage VDD), the second output signal SDC_OUT turns into low level (grounding voltage VSS). On the contrary, if the voltage of the first input signal SDnC is lower than the second input signal SDC, thus the first output signal SDnC_OUT turns into low level (grounding voltage VSS), and the second output signal SDC_OUT turns into high level (supply voltage VDD). On the other hand, when the sense amplifier enable signal SAE is low level (disable logic), the transistors P1 and P2 switch on, the transistor N5 switch off, and the actions of the source amplifier SA are in a forbidden status. Now, the first output signal SDnC_OUT and the second output signal SDC_OUT are always high level (supply voltage VDD) without depending on the first input signal SDnC and the second input signal SDC.

Next, it will explain the actions of the data hold device referring to the drawings.

Figure 30:
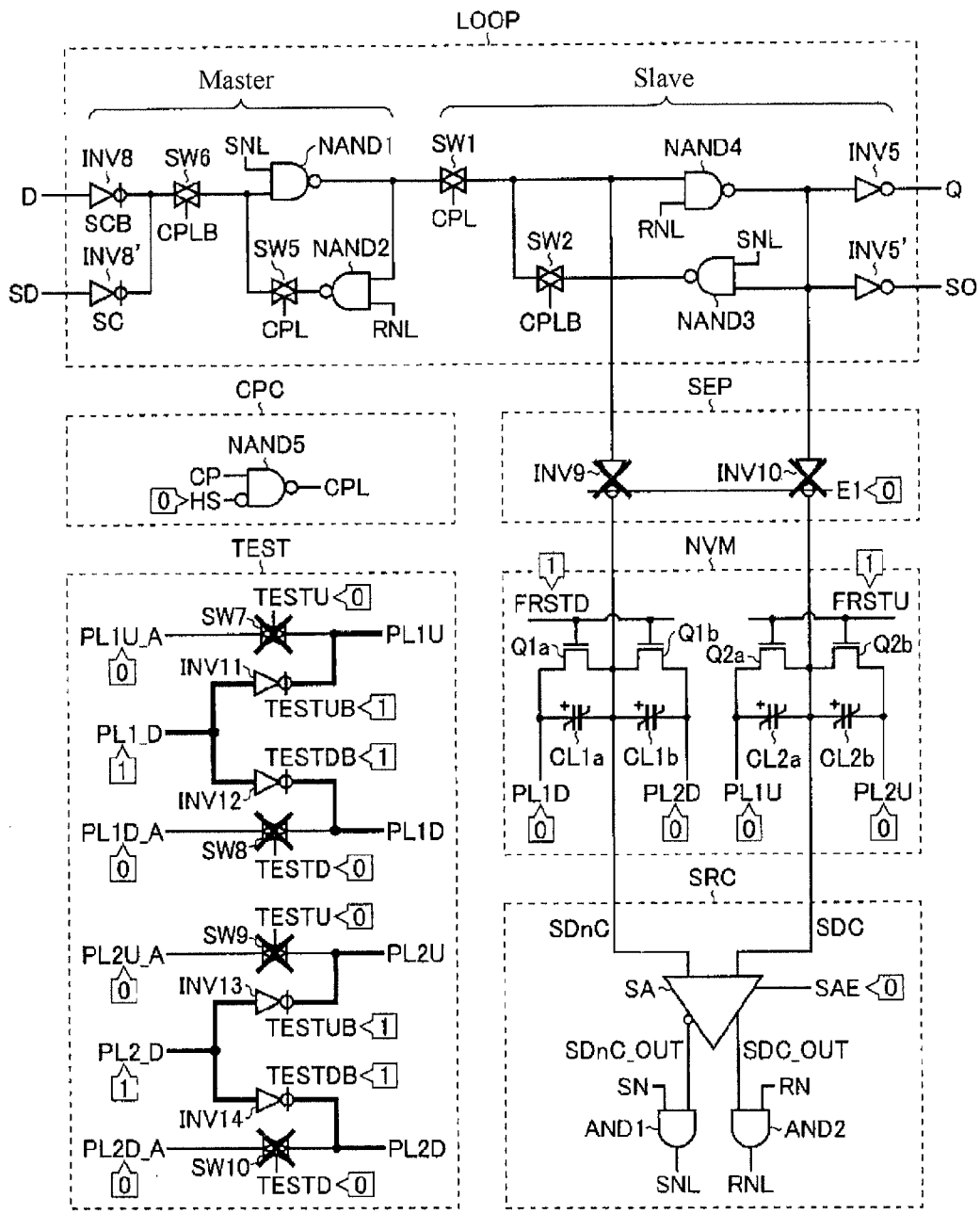
FIG. 30 represents a circuit diagram showing action state of each portion of the device during normal action.

First, it explains the normal actions of the data hold device. FIG. 30 is the circuit diagram showing the action status of the device when it acts normally.

When data hold device acts normally, data hold control signal HS at low level (0) is input in the clock pulse control portion CPC for enabling the efficiency of the external clock signal CP. Hence, external clock signal CP (more particularly, its logic reverse signal) works as internal clock signal CPL and is supplied to the loop structure portion LOOP from the clock pulse control portion CPC, so in the loop structure portion LOOP, the data signal D lock action performs according to the internal clock signal CPL (more particularly external clock signal CP).

Moreover, when the data hold device acts normally, for switching off 3-state inverters INV9 and INV10 (corresponding to the write-in driver facing the ferroelectric element), the control signal E1 at low level (0) is input in the circuit separating portion SEP. Hence, the output ends of the 3-state inverters INV9 and INV10 are all turn into high impedance state, the loop structure portion LOOP and the non-volatile storage portion NVM is electrically separated.

Moreover, when the data hold device acts normally, the high level (1) F reset signals FRSTD and FRSTU are input in the non-volatile storage portion NVM. Hence, transistors Q1a, Q1b, Q2a, Q2b all switch on, and between each two ends of the ferroelectric elements CL1a, CL1b, CL2a, CL2b, it is in short circuit, so it will avoid accidentally applying voltage on each ferroelectric element. Furthermore, a voltage signal at low level (0) is applied to the first plate lines PL1D, PL1U, and the second plate lines PL2D and PL2U.

Moreover, when the data hold device acts normally, the sense amplifier enable signal SAE at low level (0) is input in the set/reset control portion SRC. Hence, the first output signal SDnC_OUT and the second output signal SDC_OUT of the source amplifier SA both maintain at high level. Thus, the external device signal SN and the external Reset signal RN work as the internal device signal SNL and internal reset signal RNL directly so as to be output from the set/reset control portion SRC to the loop structure portion LOOP.

Moreover, when the data hold device acts normally, the analog enable signals TESTD and TESTU at low level (0) is input in the testing circuit portion TEST. Hence, the switches SW7-SW10 all switch off, and the 3-state inverters INV11-INV14 all switch on. Beside, now, a voltage signal is applied into the first digital plate line PL1_D and the second digital plate line PL2_D. Hence, a voltage signal at low level (0) is applied to the first plate lines PL1D, PL1U and the second plate lines PL2D, PL2U respectively via the 3-state inverters INV11-INV14. Moreover, a voltage signal at low level (0) is applied to the first analog plate lines PL1D_A and PL1U_A and the second analog plate lines PL2D_A and PL2U_A.

Figure 31:
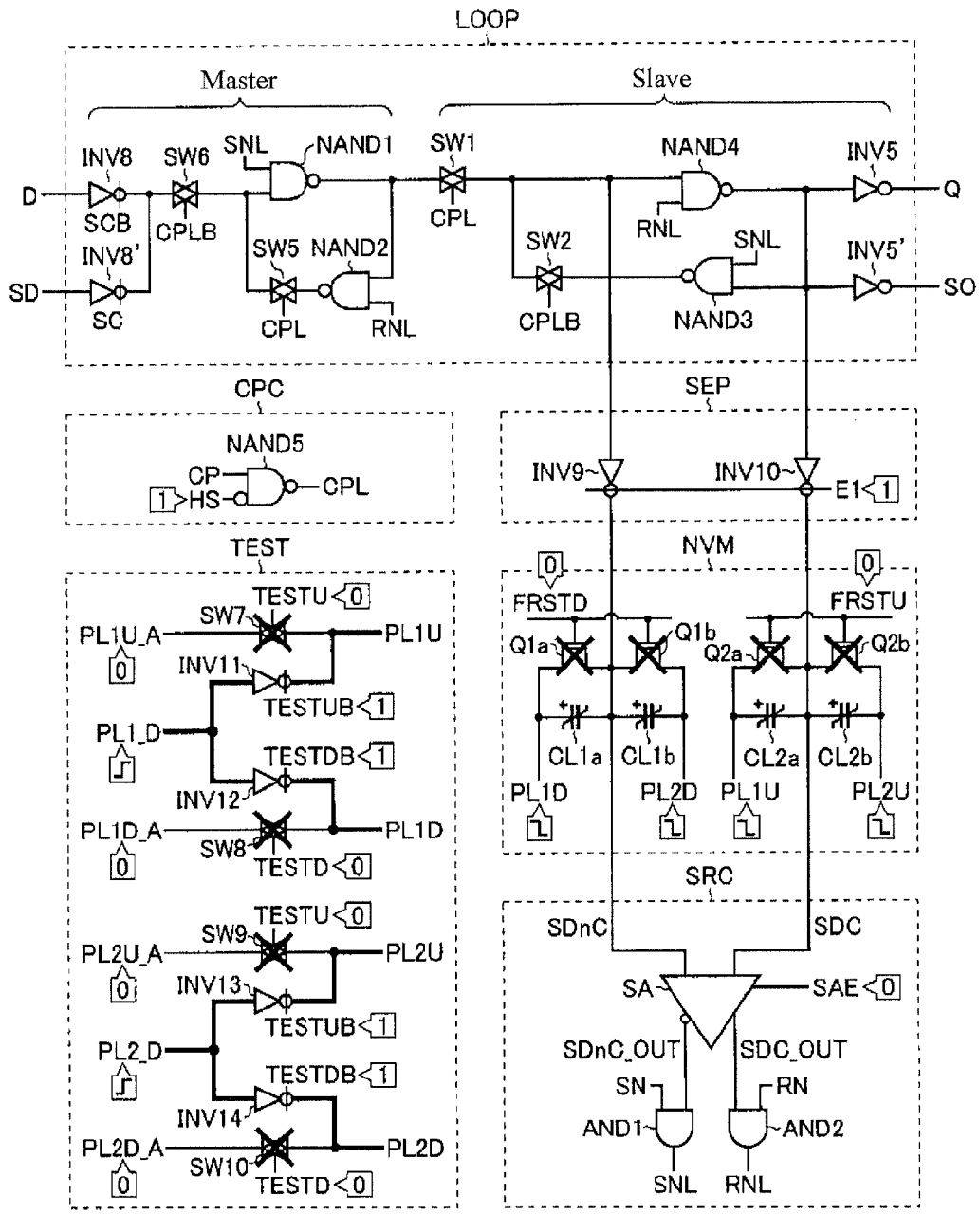
FIG. 31 is a circuit diagram of action state showing each portion of the device during data writing action.

Next, it will explain the data write-in action of the data hold device (the action store data to the non-volatile storage portion NVM). FIG. 31 is the circuit diagram of the action status of each portion of the device when writing in data.

When writing data into the data hold device, the data hold control signal HS at high level (1) is input in the clock pulse control portion CPC for disabling the efficiency of the external clock signal CP. Hence, the internal clock signal CPL can be maintained at high level without depending on the external clock signal CP, so as the contents (i.e., the data which shall be stored to the non-volatile storage portion NVM) of the stored data of the loop structure portion LOOP stay the same, to switch off the input path of the data signal D, it will further improve the stability of the action, i.e. writing data in the non-volatile storage portion NVM (data storage action).

Moreover, in the data writing-in action of the data hold device, the control signal E1 at high level (1) is input in the circuit separating portion SEP for switching on the 3-state inverters INV9 and INV10 (corresponding to the writing-in driver facing the ferroelectric element). Hence, the 3-state inverters INV9 and INV10 turn into the status that they can output respective logic reverse, and the loop structure portion LOOP and the non-volatile storage portion NVM are electrically broken over.

Moreover, in the data writing-in action of the data hold device, the F reset signals FRSTD and FRSTU at low level (0) are input in the non-volatile storage portion NVM. Hence, the transistor Q1a, Q1b, Q2a, Q2b all switch off, each of the two ends of the ferroelectric elements CL1a, CL1b, CL2a, CL2b is in an open status (non-short circuit state), thus data writing-in voltage can be applied to each ferroelectric element. Besides, now, the same pulse voltage signal (such as from high level to low level) is applied to the first plate lines PL1D, PL1U, and the second plate lines PL2D, PL2U as the data writing-in voltage. The residual polarization state of the ferroelectric elements is set as either reverse state/non-reverse state via applying the pulse voltage signal. As mentioned above, thus the explanation is omitted here.

Moreover, in the data writing-in action of the data hold device, the sense amplifier enable signal SAE at low level (0) is input in the set/reset control portion SRC the same as the normal action. Hence, the first output signal SDnC_OUT and the second output signal SDC_OUT of the source amplifier SA all maintain at high level. Hence, the external device signal SN and the external reset signal RN directly work as internal device signal SNL and internal reset signal RNL so as to be outputted from the set/reset control portion SRC to the loop structure portion LOOP.

Moreover, in the data writing-in action of the data hold device, the analog enable signal TESTD and TESTU at low level (0) is input in the testing circuit portion TEST the same as the normal action. Hence, switches SW7-SW10 all switch off, and the 3-state inverters INV11-INV14 all switch on. Besides, now, the same pulse voltage signal (such as from low level to high level) is applied to the first plate line PL1_D and the second plate line PL2_D. Hence, the same pulse voltage signal (such as from high level to low level) is applied to the first plate lines PL1D, PL1U, and the second plate lines PL2D, PL2U via the 3-state inverters INV11-INV14. Hence, now, a voltage signal at low level (0) is applied to the first analog plate lines PL1D_A, PL1U_A, and the second analog plate lines PL2D_A, PL2U_A.

Figure 32:
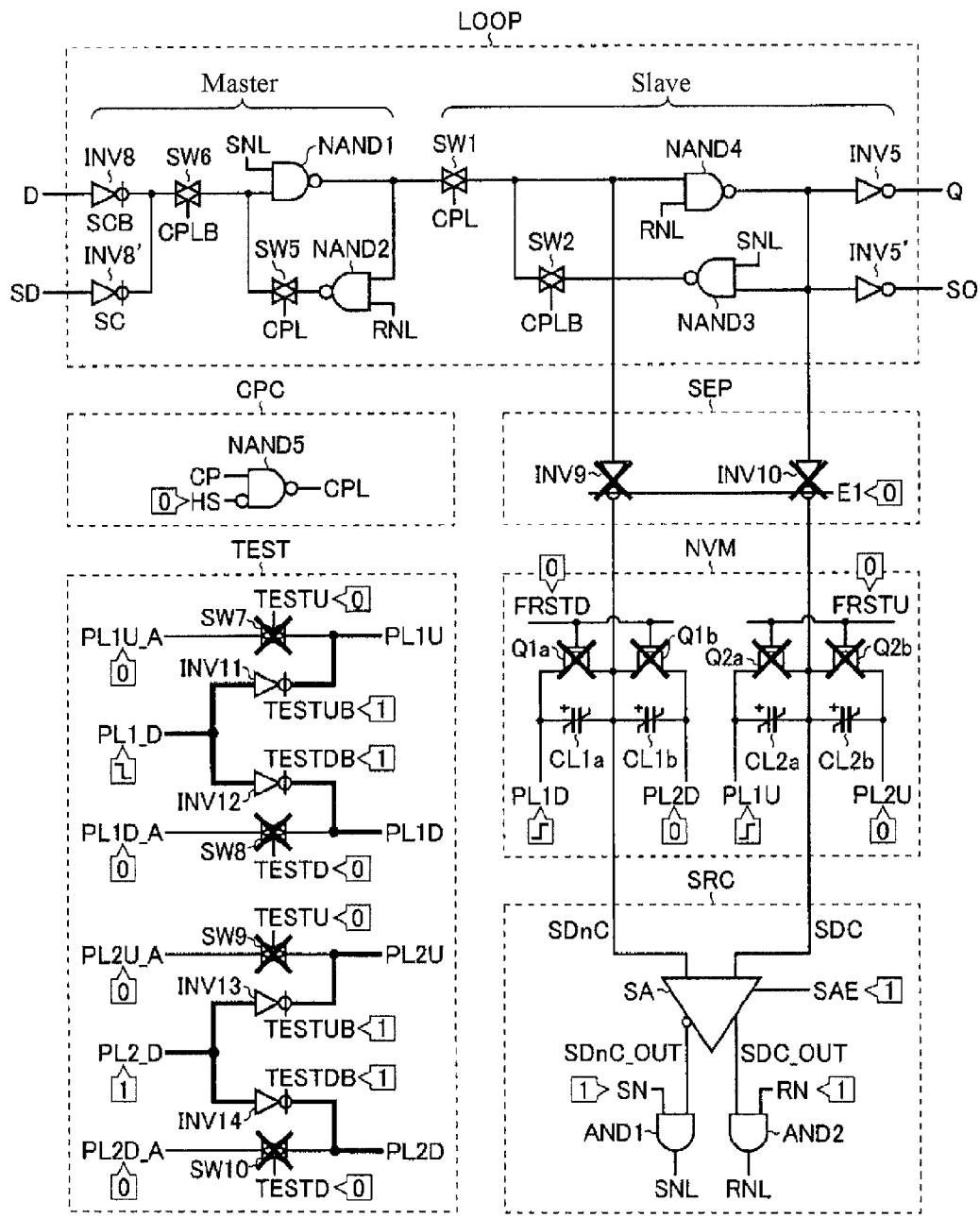
FIG. 32 is a circuit diagram showing action state of each portion of the device during data readout action.

Next, it will explain the reading action of the data hold device (action to recover data to the loop structure portion LOOP). FIG. 32 is the circuit diagram of the action status of each portion of the device when reading out the data.

In the data reading action of the data hold device, the data hold control signal HS at low level (0) is input in the clock pulse control portion CPC for enabling the efficiency of the external clock signal CP as normal actions. Hence, the external clock signal CP (more particularly its logic reverse signal) works as the internal clock signal CPL to be supplied from the clock pulse control portion CPC to the loop structure portion LOOP. Thus, in the data hold device of the fifth embodiment, it will not stop inputting into the external clock signal CP and recover data from the non-volatile storage portion NVM to the loop structure portion LOOP.

Moreover, in the data reading action of the data hold device, control signal E1 at low level (0) is input in to the circuit separating portion SEP as the normal actions for switching off the 3-state inverters INV9 and INV10 (corresponding to the writing-in driver facing the ferroelectric element). Hence, the output ends of the 3-state inverters INV9 and INV10 all turn into high impedance state, and the loop structure portion LOOP and the non-volatile storage portion NVM are electrically separated.

Moreover, in the data reading action of the data hold device, F reset signals FRSTD, FRSTU at low level (0) is input in to the non-volatile storage portion NVM. Hence, the transistors Q1a, Q1b, Q2a, Q2b all switch off, and between each of the two ends of the ferroelectric elements CL1a, CL1b, CL2a, CL2b are all in an open status (non-short circuit state), thus data reading voltage can be applied to each ferroelectric elements. And, now, as the data reading voltage, it maintains the second plate lines PL2D, PL2U at low level while applies predetermined pulse voltage signal (such as from low level to high level) to the first plate lines PL1D, PL1U. Via applying the pulse voltage signal, D system output end (the connecting node between the negative pole end of the ferroelectric element CL1a and the positive pole end of the ferroelectric element CL1b) of the non-volatile storage portion NVM, and the U system output end (the connecting node between the negative pole end of the ferroelectric element CL2a and the positive pole end of the ferroelectric element CL2b) respectively appears recover voltage signal (corresponding to the first input signal SDnC and the second input signal SDC of the source amplifier SA) corresponding to the residual polarization state in the ferroelectric elements. As mentioned above, thus the explanation is omitted here.

Moreover, in the data reading action of the data hold device, the sense amplifier enable signal SAE at high level (1) is input in to the set/reset control portion SRC. The first output signal SDnC_OUT and the second output signal SDC_OUT of the source amplifier SA respectively turn into logic level corresponding to the voltage level of the first input signal SDnC and the voltage level of the second input signal SDC. Specifically, if the voltage of the first input signal SDnC is higher than the second input signal SDC, the first output signal SDnC_OUT turns into high level (1), and the second output signal SDC_OUT turns into low level (0). On the contrary, if the voltage of the first input signal SDnC is lower than that of the second input signal SDC, the first output signal SDnC_OUT turns into low level (0), and the second output signal SDC_OUT turns into high level (1).

Moreover, in the data reading action of the data hold device, the external device signal SN and the external reset signal RN input to the set/reset control portion SRC both maintain at high level (1). Hence, the first output signal SDnC_OUT and the second output signal SDC_OUT of the source amplifier SA directly work as the internal device signal SNL and the reset signal internal reset signal RNL as to be outputted from set/reset control portion SRC to loop structure portion LOOP.

In addition, in the loop structure portion LOOP, if the internal device signal SNL input into the NAND operators NAND1 and NAND3 turns into low level (0), thus the output signal Q is forcefully turned into high level (1), if the reset signal internal reset signal RNL input into the NAND operators NAND2 and NAND4 turns into low level (0), thus the output signal Q is forcefully turned into low level (0). That is to say, in the data hold device of the fifth structure example, set/reset control (generating control of the internal device signal SNL and the reset signal internal reset signal RNL) of the loop structure portion LOOP is performed via the output signal of the non-volatile storage portion NVM to realize data reading action (recover action).

For example, in the data reading action of the data hold device, the situation that the storage data written from the loop structure portion LOOP to the non-volatile storage portion NVM is "1". In such situation, via reading action of the data hold device, the voltage of the first input signal SDnC from the non-volatile storage portion NVM to the set/reset control portion SRC is lower than the voltage of the second input signal SDC from the non-volatile storage portion NVM to the set/reset control portion SRC. Hence, the first output voltage SDnC_OUT of the source amplifier SA turns into low level (0), further, the internal device signal SNL turns into low level (0), so the output signal Q is forcefully set as high level (1). This means the storage data "1" written into the volatile storage portion NVM recovers into loop structure portion LOOP.

On the contrary, considering the situation that the storage data written from the loop structure portion LOOP to the non-volatile storage portion NVM is "0" via the data writing-in action of the data hold device. In this case, via the data writing-in action of the data hold device, the voltage of the first input signal SDnC input from non-volatile storage portion NVM to set/reset control portion SRC is also higher than the voltage of the second input signal SDC input from the non-volatile storage portion NVM to the set/reset control portion SRC. Therefore, the second output voltage SDC_OUT of the source amplifier SA turns into low level (0), further, the reset signal internal reset signal RNL turns into low level (0), so the output signal Q is forcefully set as low level (0). This means the storage data "0" written to the volatile storage portion NVM recovers to loop structure portion LOOP.

Moreover, when in the data reading action of the data hold device, the analog enable signals TESTD and TESTU at low level (0) are input into the testing circuit portion TEST the same as the normal action. Hence, switches SW7-SW10 all switch off, and the 3-state inverters INV11-INV14 all switch on. Besides, now, a predetermined pulse voltage signal (such as from high level to low level) is applied to the first digital plate line PL1_D, a voltage signal at high level (1) is applied to the second digital plate line PL2_D. Therefore, same pulse voltage signal (such as from low level to high level) is applied to the first plate lines PL1D, PL1U via the 3-state inverters INV11 and INV12 respectively, the voltage signal at low level (0) is applied to the second plate lines PL2D, PL2U via the 3-state inverters INV13 and INV14 respectively. And, now, the voltage signal at low level (0) is applied to the first analog plate lines PL1D_A, PL1U_A, and the second analog plate lines PL2D_A, PL2U_A.

As mentioned above, different from the above structure, the structure of the data hold device in the fifth embodiment does not divert the loop structure portion LOOP as the sense amplifier for recovering data, but sets an independent sense amplifier SA, and use the sense amplifier SA to set/reset control the loop structure portion LOOP. And, the structure of the data hold device in the fifth embodiment, it does not stop the signal external clock signal CP, but to control whether transmitting the signal external clock signal CP as the signal internal clock signal CPL to the loop structure portion LOOP. Via such structure, it is unnecessary to stop external clock CP during data storage/recover, so not only timing analysis while designing becomes easier, but also the matching ability with the low power consumption technology using gated clocks and etc. becomes fine.

Figure 33:
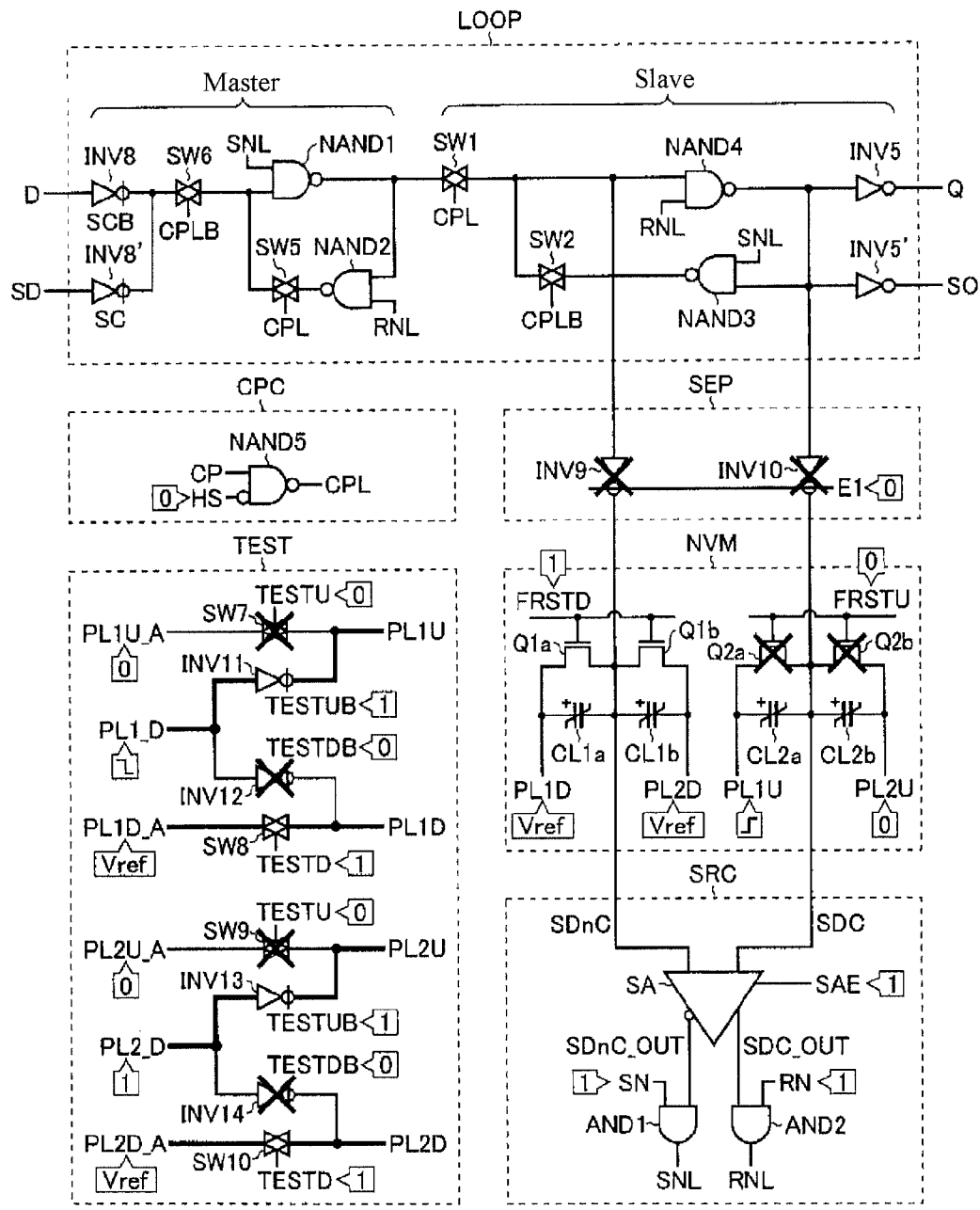
FIG. 33 is a circuit diagram showing action state of each portion of the device during testing action.

Next it will explain the testing actions of the data hold device (the analog characteristic assessment action of the ferroelectric element). FIG. 33 is the circuit diagram of the action status of each portion of the device when testing actions (especially recover steps of the storage data included by a series of testing actions). And, take the following situation as an example: the analog characteristic assessment (voltage testing of the second signal input signal SDC) input from U system output end of the non-volatile storage portion NVM to the second signal input signal SDC of the source amplifier SA, which is called "U system testing action of the non-volatile storage portion NVM", and explain it in details.

In the U system testing action of the non-volatile storage portion NVM, the data hold signal control signal HS at low level (0) is input into the clock pulse control portion CPC as the normal action and data reading action for enabling the signal external clock signal CP. Therefore, the signal external clock signal CP (more precisely, its logic reverse signal) as the signal internal clock signal CPL, it is supplied from the clock pulse control portion CPC to the loop structure portion LOOP. Thus, in the data hold device of the fifth embodiment, it performs U system testing actions of the non-volatile storage portion NVM without stopping the input of the signal external clock signal CP.

In addition, during U system testing actions of the non-volatile storage portion NVM, the signal control signal E1 at low level (0) is input in the circuit separating portion SEP the same as normal actions and data reading actions for switching off the 3-state inverters INV9 and INV10 (corresponding to the written driver facing the ferroelectric element). Therefore, the output ends of the 3-state inverters INV9 and INV10 all becomes high impedance status, and the loop structure portion LOOP and the non-volatile storage portion NVM are electrically separated.

Moreover, in the U system testing action of the non-volatile storage portion NVM, the F signal reset signal FRSTU at low level (0) is input in the U system of the non-volatile storage portion NVM. Therefore, the transistors Q2a, Q2b all switch off, and each of the two ends of the ferroelectric elements CL2a, CL2b are all in an open status (non-short circuit state), so data readout voltage can be applied to each ferroelectric elements. Besides, now, as the data readout voltage, the second plate linePL2U is maintained at low level while a predetermined pulse voltage signal (such as from low level to high level) is applied to the first plate line PL1U. Via applying such pulse voltage signal, the recover voltage signal (corresponding to the second signal input signal SDC of the source amplifier SA) corresponding to the residual polarization state in the ferroelectric element appears in the U system output end (the connecting node of the negative pole end of the ferroelectric element CL2a and the positive pole end of the ferroelectric element CL2b) of the non-volatile storage portion NVM. As mentioned above, thus the explanation is omitted here.

On the other hand, in the U system testing action of the non-volatile storage portion NVM, the F signal reset signal FRSTD at high level (1) is input in the D system of the non-volatile storage portion NVM. Hence, the transistor Q1a, Q1b all switch off, and between each of the two ends of the ferroelectric electric elements CL1a, CL1b all are in short circuit. And, now, the reference voltage signal Vref having a predetermined analog voltage (an arbitrarily set median voltage between the low level (grounding voltage VSS) and the high level (supply voltage VDD) is applied to the first plate line PL1D and the second plate line PL2D. Hence, as the first signal input signal SDnC, the reference voltage signal Vref is directly input to the source amplifier SA from the D system output end (the connecting node between the negative pole end of the ferroelectric element CL1a and the positive pole end of the ferroelectric element CL1b) of the non-volatile storage portion NVM. Besides, the meaning of the action that the reference voltage Vref as the first signal input signal SDnC of the source amplifier SA is input directly will be explained in details in the following texts.

And, in the U system testing action of the non-volatile storage portion NVM, the sense amplifier enable signal SAE at high level (1) is input into the set/reset control portion SRC. Hence, the first output signal SDnC_OUT and the second output signal SDC_OUT of the source amplifier SA respectively turn into logic level corresponding to the high-low of the voltage level of the first input signal SDnC and of the voltage level of the second input signal SDC.

Specifically speaking, if the voltage of the first input signal SDnC is higher than that of the second input signal SDC, the first output signal SDnC_OUT turns in to high level (1), and the second output signal SDC_OUT turns into low level (0). On the contrary, if the voltage of the first input signal SDnC voltage is lower than that of the second input signal SDC, the first output signal SDnC_OUT turns into low level (0), and the second output signal SDC_OUT turns into high level (1).

And, in the U system testing action of the non-volatile storage portion NVM, the external device signal SN and the external reset signal RN input into the set/reset control portion SRC all maintain at high level (1). Hence, the first output signal SDnC_OUT and the second output signal SDC_OUT of the source amplifier SA directly work as the internal device signal SNL and the internal reset signal RNL and be outputted from the set/reset control portion SRC to the loop structure portion LOOP. This is the same as the data readout action.

And, in the U system testing action of the non-volatile storage portion NVM, the analog enable signal TESTU of the U system input to the testing circuit portion TEST is low level (0). Hence, the switches SW7, SW9 both switch off, and the 3-state inverters INV11, INV13 both switch on. Beside, now, a predetermined pulse voltage signal (such as from high level to low level) is applied to the first digital plate line PL1_D, and the voltage signal at high level (1) is applied to the second digital plate line PL2_D. Therefore, a predetermined pulse voltage signal (such as from low level to high level) is applied to the first plate line PL1U of the U System via the 3-state inverter INV11, and the voltage signal at low level (0) is applied to the second plate line PL2U of the U system via the 3-state inverter INV13. Beside, the voltage signal at low level (0) is applied to the first analog plate line PL1U_A of the U system and the second analog plate line PL2U_A of the U system.

On the other hand, in the U system testing action of the non-volatile storage portion NVM, the analog enable signal TESTD input to D system of the testing circuit portion TEST is high level (1). Hence, the switches SW8, SW10 both switch on, the 3-state inverters INV12, INV14 both switch off. In addition, now, the reference voltage signal Vref having predetermined voltage is applied to the first analog plate line PL1D_A of the D system and the second analog plate linePL2D_A of the D system. Therefore, the reference voltage signal Vref having a predetermined voltage is applied to the first plate line PL1D of the D system and the second plate line PL2D of the D system via the switches SW8, SW10.

<Analog Characteristic Assessment Action>

Figure 34:
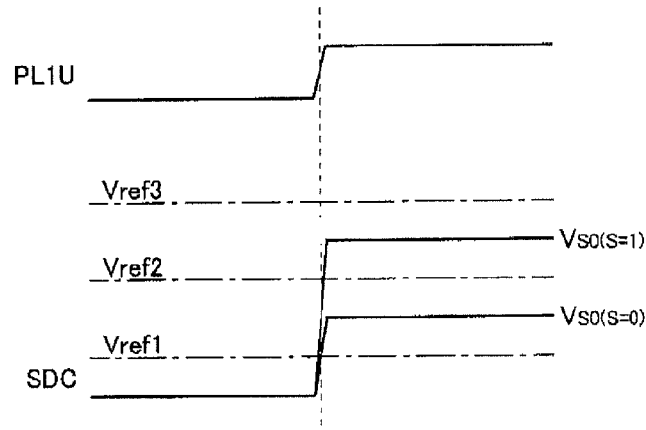
FIG. 34 is a sequence diagram showing the analog characteristic assessment action of the ferroelectric element.

FIG. 34 is the sequence diagram to explain the analog characteristic assessment action of the ferroelectric element. Wherein it describes the pulse voltage signal applied to the first plate linePL1U of the U system, the recover voltage signal (corresponding to the second input signal SDC of the source amplifier SA) at the output end of the U system of the non-volatile storage portion NVM, and the reference voltage signal Vref (3 voltage Vref1-Vref3 in FIG. 34) directly input to the output end of the D system of the non-volatile storage portion NVM.

In the U system testing action of the non-volatile storage portion NVM, the second plate line PL2U of the U system maintains at low level, and when applying a predetermined pulse voltage signal (such as from low level to high level) to the first plate line PL1U of the U system, the recover voltage signal (corresponding to the second input signal SDC of the source amplifier SA) corresponding to the residual polarization state in the ferroelectric element appears in the U system output end (the connecting node between the negative pole end of the ferroelectric element CL2a and the positive pole end of the ferroelectric element CL2b) of the non-volatile storage portion NVM, as mentioned above.

Here, in the case that the storage data in the non-volatile storage portion NVM is "0" (S=0), the second input signal SDC of the source amplifier SA turns into the first recover voltage level VSO (S=0) (corresponding to the logic WL), in the case that the storage data in the non-volatile storage portion NVM is "1" (S=1), the second input signal SDC of the source amplifier SA turns into the second recover voltage level VSO (S=1) (corresponding to the logic WH) which is higher than the first recover voltage level VSO (S=0).

On the other hand, in the U system testing action of the non-volatile storage portion NVM, D system output end (the connecting node of the negative pole end of the ferroelectric element CL1a and the positive pole end of the ferroelectric element CL1b) of the non-volatile storage portion NVM directly inputs the reference voltage signal Vref having an arbitrary analog voltage from outside of the device (corresponding to the first input voltage SDnC of the source amplifier SA).

Hence, input the recover voltage signal appearing at the U system output end of the non-volatile storage portion NVM as the second input signal SDC of the source amplifier SA, and make the voltage of the reference voltage signal Vref input as the first input signal SDnC of the source amplifier SA change in turn via step control or scan control, and each time monitor the logic level of the output signal Q recovered in the loop structure portion LOOP, so as to obtain the analog voltage of the recover voltage signal (the second input signal SDC of the source amplifier SA) appearing at the U system output end of the non-volatile storage portion NVM.

Figure 35:
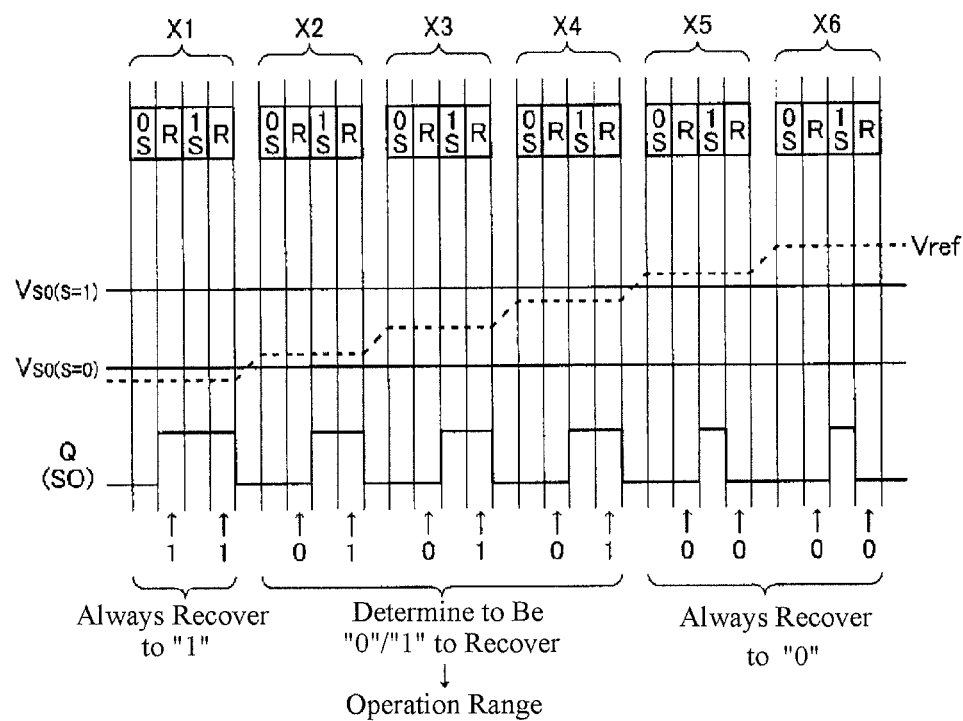
FIG. 35 is a schematic diagram showing the relationship of reference voltage signal Vref and the output signal Q.

FIG. 35 is the schematic diagram of the relation between the reference voltage signal Vref and the output signal Q. And, in the testing sequences shown in this figure, data "0" writing-in step (0S), data readout step (R), and data "1" writing-in step (1S) are one cycle, make the voltage of the reference voltage signal Vref change in turn in every cycle, while monitor the logic level of the output signal Q recovered in the loop structure portion LOOP every time, and determine the analog voltage of the recover voltage signal appearing at the U system output end of the non-volatile storage portion NVM based on the monitoring result.

Moreover, data "0" writing-in step (0S) and data "1" writing-in step (1S) are respectively steps of inputting data "0" and data "1" to the loop structure portion LOOP, and then storing storage data of the loop structure portion LOOP to the non-volatile storage portion NVM. And, data readout step (R) is the step of recovering the storage data of the non-volatile storage portion NVM to the loop structure portion LOOP and reading out the recover data as the output signal Q.

It will further explain with reference to the example in FIG. 35.

First, in first cycle X1, the voltage of the reference voltage signal Vref is set as a voltage Vref1 which is lower than the first recover voltage level VSO (S=0) and the second recover voltage level VSO (S=1). Therefore, no matter data "0" or data "1" is written in the non-volatile storage portion NVM, it always recovers to data "1" in the loop structure portion LOOP. That is to say, it includes two data readout steps in the first cycle X1, the output signal Q always reads out as data "1".

Next, in the second cycle X2, the voltage of the reference voltage signal Vref is set as a voltage Vref2 which is higher than the voltage Vref1 set in the first cycle X1. And in the example of FIG. 35, the voltage Vref2 is higher than the first recover voltage level VSO (S=0) and lower than the second recover voltage level VSO (S=1). Therefore, when writing data "0" in the non-volatile storage portion NVM, the data recovers to "0" in the loop structure portion LOOP, when writing data "1" in the non-volatile storage portion NVM, the data recovers to "1" in the loop structure portion LOOP. That is to say, it includes two data readout steps in the second cycle X2, the output signal Q reads out as data "0" and data "1" in turn. The action status shows the action, that determining the data contents (0/1) stored in the non-volatile storage portion NVM to recover data to the loop structure portion LOOP, works normally.

At this time of point, it is known that the first recover voltage level VSO (S=0) is a voltage higher than the voltage Vref1 and lower than the voltage Vref2.

Then in the third cycle X3, the voltage of the reference voltage signal Vref is set to be a voltage Vref3 higher than voltage Vref2, next in the fourth cycle X4, the voltage of the reference voltage signal Vref is set to be a voltage Vref4 higher than voltage Vref3. Wherein, the same as the voltage Vref2, the voltages Vref3 and Vref4 are higher than the first recover voltage level VSO (S=0), and lower than the second recover voltage level VSO (S=1), so when writing data "0" to the non-volatile storage portion NVM, data "0" is recovered in the loop structure portion LOOP, and when writing data "1" to the non-volatile storage portion NVM, data "1" is recovered in the loop structure portion LOOP. That is to say, it includes two data readout steps in the third cycle X3 and in the fourth cycle X4, the output signal Q reads out as data "0" and data "1" in turn.

Next, in the fifth cycle X5, the voltage of the reference voltage signal Vref is set as a voltage Vref5 which is higher than the voltage Vref4. And in the example of FIG. 35, the voltage Vref5 becomes higher than the first recover voltage level VSO (S=0) and the second recover voltage level VSO (S=1). Therefore, no matter writing data "0" or data "1" in the non-volatile storage portion NVM, the data always recovers to "0" in the loop structure portion LOOP. That is to say, it includes two data readout steps in the fifth cycle X5, the output signal Q always reads out as data "0".

At this point of time, it is known that the second recover voltage level VSO (S=1) is a voltage higher than voltage Vref4 and lower than the voltage Vref5.

Moreover, the example in FIG. 35 continues to describe the sixth step X6 and the rest of the orders, but at the time point when the analog voltages of both the first recover voltage level VSO (S=0) and the second recover voltage level VSO (S=1) are determined, the testing sequence can be finished too.

In addition, it illustrates the testing sequence that sets the data "0" writing-in step (OS), data readout step (R), data "1" writing-in step (1S) and data readout step (R) as one cycle in FIG. 35, but the testing sequence is not restricted herein, for example, writing-in step (OS) and data readout step (R) can be set as one cycle, and after merely determining first recover voltage level VSO (S=0), data "1" writing-in step (1S) and data readout step (R) can be reset as one cycle to merely determine the second recover voltage level VSO (S=1).

And it illustrates the situation of the analog characteristic assessment (determining the voltage of the second input signal SDC) of the second input signal SDC input from the U system output end of the non-volatile storage portion NVM to the source amplifier SA, but the situation of the analog characteristic assessment (determining the voltage of the first input signal SDnC) of the second input signal SDC input from the D system output end of the non-volatile storage portion NVM to the source amplifier SA is the same.

That is to say, when determining the voltage of the first input signal SDnC, it only needs to outlet the recover voltage signal (corresponding to the first input voltage SDnC of the source amplifier SA) corresponding to the contents of the storage data from the D system output end (the connecting node of the negative pole end of the ferroelectric element CL1a and the positive pole end of the ferroelectric element CL1b) of the non-volatile storage portion NVM, and on the other hand, to directly input the reference voltage signal Vref (corresponding to the second input voltage SDC of the source amplifier SA) having an arbitrary analog voltage to the U system output end (the connecting node of the negative pole end of the ferroelectric element CL2a and the positive pole end of the ferroelectric element CL2b) of the non-volatile storage portion NVM, and to perform the same testing sequence as mentioned above.

<Scan Path>

Figure 36:
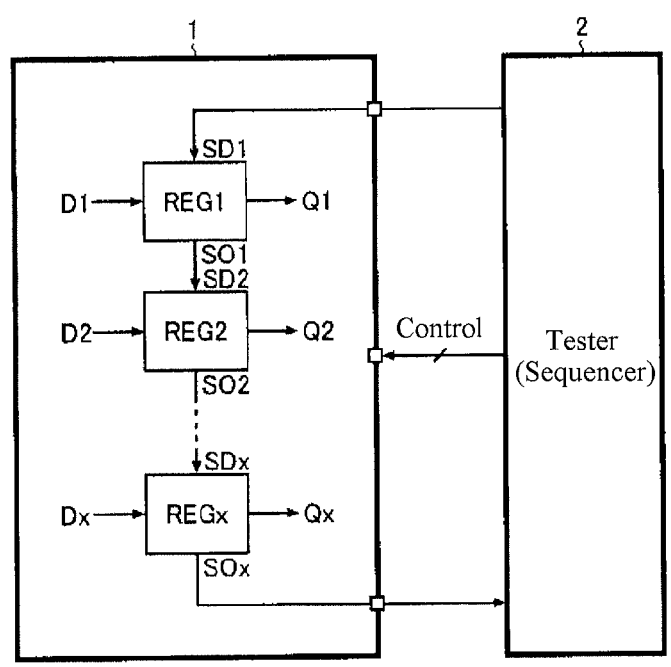
FIG. 36 is a block diagram showing the testing action of the data hold device using scan path.

Then, the test action of the data hold device which flexibly uses the scan path is illustrated. FIG. 36 is a block diagram for illustrating the test action of the data hold device which flexibly uses the scan path. The operating device 1 is a semiconductor integrated circuit device coordinately including x (in which, x is an integer greater than 2) registers REG1-REGx. Additionally, the registers REG1-REGx respectively amount to the data hold device of the previously described fifth embodiment (referring to the FIG. 26, etc.), When the operating device 1 is in normal action, the input data D1-Dx are respectively input from the logic circuit in the front section (not shown) to the registers REG1-REGx; the output signals Q1-Qx are respectively output from the registers REG1-REGx to the logic circuit in the rear section (not shown).

On the other side, when the operating device 1 is in test action, the registers REG1-REGx are serially connected to form a shift register in order to pass through the scan path and the control signal is input from the tester (sequencer) 2. That is to say, the scan data SD1 is input from the tester 2 to the register REG1 in the foremost section; the scan output signal SO of the register REG1 is used as the scan data SD2 to be input to the register REG2. It is the same with the register after the next section; the scan output signal of the register in the front section is used as the scan data of the register in the rear section for sequential input, and the scan output signal SOx output from the register REGx in the last section is input to the tester 2.

Therefore, it is configured to flexibly use the scan path to perform the test action of the data hold device. Even if being in the system which is used for testing object and has multiple data hold devices (the registers REG1-REGx in the FIG. 36), the test action may be properly carried out without increasing the pin number of the data output terminal outside the directing device.

Figure 37A:
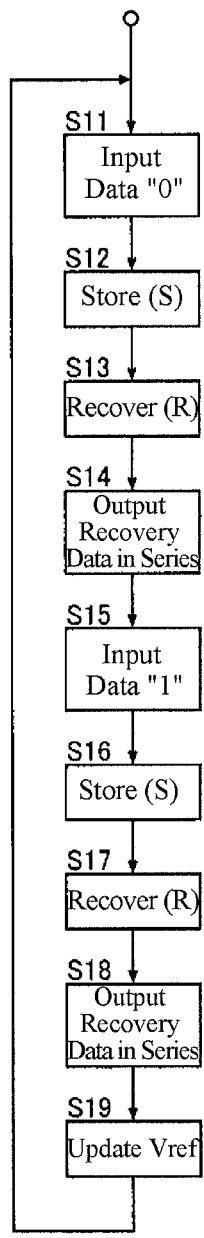
FIG. 37A is a flow chart showing an example of the testing action of the scan path.

FIG. 37A is a flow diagram showing an example of test action which flexibly uses the scan path. Essentially, it follows the test order previously shown in the FIG. 35.

Firstly, in the step S11, the data "0" is input to each loop structure portion LOOP of the registers REG1-REGx. Furthermore, as the input approach of data "0", any one of the approach for inputting the data "0" from the input end of the data D, the approach for inputting the data "0" from the input end of the scan data SD, or the approach for inputting the data "0" by using the external reset signal RN to reset the loop structure portion LOOP can be adopted.

Next, in the step S12, the data storage is performed on each non-volatile storage portion NVM by each loop structure portion LOOP of the registers REG1-REGx. Then, in the step S12, the data recovery is performed on each loop structure portion LOOP by non-volatile storage portion NVM of the registers REG1-REGx. At this time, under the condition of measuring the voltage of the first input signal SDnC, an arbitrary reference voltage signal Vref can be directly input as a second input voltage SDC. On the contrary, under the condition of measuring the voltage of the second input signal SDC, an arbitrary reference voltage signal Vref can be directly input as a first input voltage SDnC. It is the same as the described contents regarding this data storage/recovery action, so the repeated illustration is omitted.

Next, in the step S14, the scan path is flexibly used to perform the serial output of the data recovered in each loop structure portion LOOP of the registers REG1-REGx. Specifically, the x-times scan data SD1 is input from the tester 2 to the register REG1 in the foremost section in synchronization with the clock signal sent from the register x; correspondingly, the x-times scan output signal SOx is output from the register REGx in the last section to the tester 2. That is to say, the data recovered in each loop structure portion LOOP of the registers REG1-REGx are reversely (the order of the registers REG1-REGx) output in series in the tester 2. Additionally, at this time, the contents of the scan data SD1 input from the tester 2 to the register REG1 in the foremost section are ignored.

Next, in the step S15, the data "1" is input to each loop structure portion LOOP of the registers REG1-REGx. Furthermore, as the input approach of data "1", any one of the approach for inputting the data "1" from the input end of the data D, the approach for inputting the data "1" from the input end of the scan data SD, or the approach for inputting the data "1" by using the external device signal SN to set the loop structure portion LOOP can be adopted.

Next, in the step S16, the data storage is performed on each non-volatile storage portion NVM by each loop structure portion LOOP of the registers REG1-REGx. Then, in the step S17, the data recovery is performed on each loop structure portion LOOP by each non-volatile storage portion NVM of the registers REG1-REGx. At this time, under the condition of measuring the voltage of the first input signal SDnC, an arbitrary reference voltage signal Vref can be directly input as the second input voltage SDC. On the contrary, under the condition of measuring the voltage of the second input signal SDC, an arbitrary reference voltage signal Vref can be directly input as the first input voltage SDnC. It is the same as the described contents regarding this data storage/recovery action, so the repeated illustration is omitted.

Next, in the step S18, the scan path is flexibly used to perform the serial output of the data recovered in each loop structure portion LOOP of the registers REG1-REGx. Specifically, the x-times scan data SD1 is input from the tester 2 to the register REG1 in the foremost section in synchronization with the clock signal sent from the register x; correspondingly, the x-times scan output signal SOx is output from the register REGx in the last section to the tester 2. That is to say, the data recovered in each loop structure portion LOOP of the registers REG1-REGx are reversely (the order of the registers REG1-REGx) output in series in the tester 2.

Then, in the step S19, the voltage of the reference voltage Vref is updated and the flow is returned to the step S11. Such a series of steps are set as one period; the test order previously shown in the FIG. 35 is executed to measure the voltage of the first input signal SDnC or the second input signal SDC.

Figure 37B:
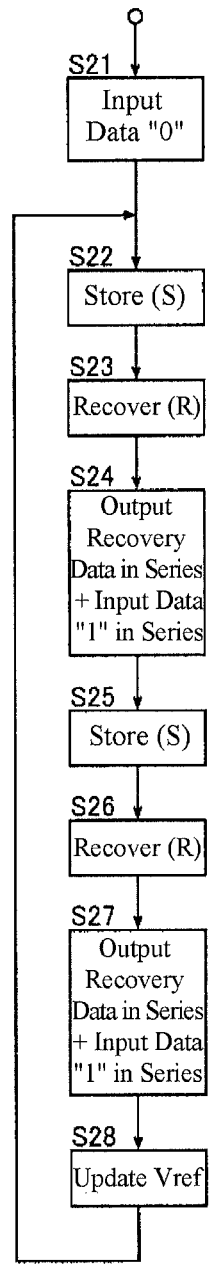
FIG. 37B is a flow chart showing another example of the testing action of the scan path.

FIG. 37B is a flow diagram showing another example of test action which flexibly uses the scan path. Essentially, it follows the test order previously shown in the FIG. 35.

Firstly, in the step S21, the data "0" is input to each loop structure portion LOOP of the registers REG1-REGx. Furthermore, as the input approach of data "0", any one of the approach for inputting the data "0" from the input end of the data D, the approach for inputting the data "0" from the input end of the scan data SD, or the approach for inputting the data "0" by using the external reset signal RN to reset the loop structure portion LOOP can be adopted.

Next, in the step S22, the data storage is performed on each non-volatile storage portion NVM by each loop structure portion LOOP of the registers REG1-REGx. Then, in the step S23, the data recovery is performed on each loop structure portion LOOP by each non-volatile storage portion NVM of the registers REG1-REGx. At this time, under the condition of measuring the voltage of the first input signal SDnC, an arbitrary reference voltage signal Vref can be directly input as the second input voltage SDC. On the contrary, under the condition of measuring the voltage of the second input signal SDC, an arbitrary reference voltage signal Vref can be directly input as the first input voltage SDnC. It is the same as the described contents regarding this data storage/recovery action, so the repeated illustration is omitted.

Next, in the step S24, the scan path is flexibly used to perform the serial output of the data recovered in each loop structure portion LOOP of the registers REG1-REGx, and to perform the serial input of the data "1" on each loop structure portion LOOP of the registers REG1-REGx. Specifically, the scan data SD1 of the x-times data "1" is input from the tester 2 to the register REG1 in the foremost section in synchronization with the clock signal sent from the register x; correspondingly, the x-times scan output signal SOx is output from the register REGx in the last section to the tester 2. That is to say, for the tester 2, the data recovered in each loop structure portion LOOP of the registers REG1-REGx are reversely (the order of the registers REG1-REGx) output in series; and for each loop structure portion LOOP of the registers REG1-REGx, the data "1" are sequentially input in series. As a result, the step S14 and the step S15 of the FIG. 37A can be gathered into a single step S24.

Next, in the step S25, the data storage is performed on each non-volatile storage portion NVM by each loop structure portion LOOP of the registers REG1-REGx. Then, in the step S26, the data recovery is performed on each loop structure portion LOOP by each non-volatile storage portion NVM of the registers REG1-REGx. At this time, under the condition of measuring the voltage of the first input signal SDnC, an arbitrary reference voltage signal Vref can be directly input as the second input voltage SDC. On the contrary, under the condition of measuring the voltage of the second input signal SDC, an arbitrary reference voltage signal Vref can be directly input as the first input voltage SDnc. It is the same as the described contents regarding this data storage/recovery action, so the repeated illustration is omitted.

Next, in the step S27, the scan path is flexibly used to perform the serial output of the data recovered in each loop structure portion LOOP of the registers REG1-REGx, and to perform the serial input of the data "0" on each loop structure portion LOOP of the registers REG1-REGx. Specifically, the scan data SD1 of the x-times data "0" is input from the tester 2 to the register REG1 in the foremost section in synchronization with the clock signal sent from the register x; correspondingly, the x-times scan output signal SOx is output from the register REGx in the last section to the tester 2. That is to say, for the tester 2, the data recovered in each loop structure portion LOOP of the registers REG1-REGx are reversely (the order of the registers REGx-REG1) output in series; and for each loop structure portion LOOP of the registers REG1-REGx, the data "0" are sequentially input in series. As a result, the step S18 and the step S11 of the FIG. 37A can be gathered into a single step S27.

Then, in the step S28, the voltage of the reference voltage Vref is updated and the flow is returned to the step S22. Such a series of steps is set as one period; the test order previously shown in the FIG. 35 is executed to measure the voltage of the first input signal SDnC or the second input signal SDC.

As mentioned above, for the data hold device of the fifth embodiment, even if in a state of being configured in the system, the simulation characteristics of the ferroelectric elements can be assessed in detail.

The Sixth Embodiment

Figure 38:
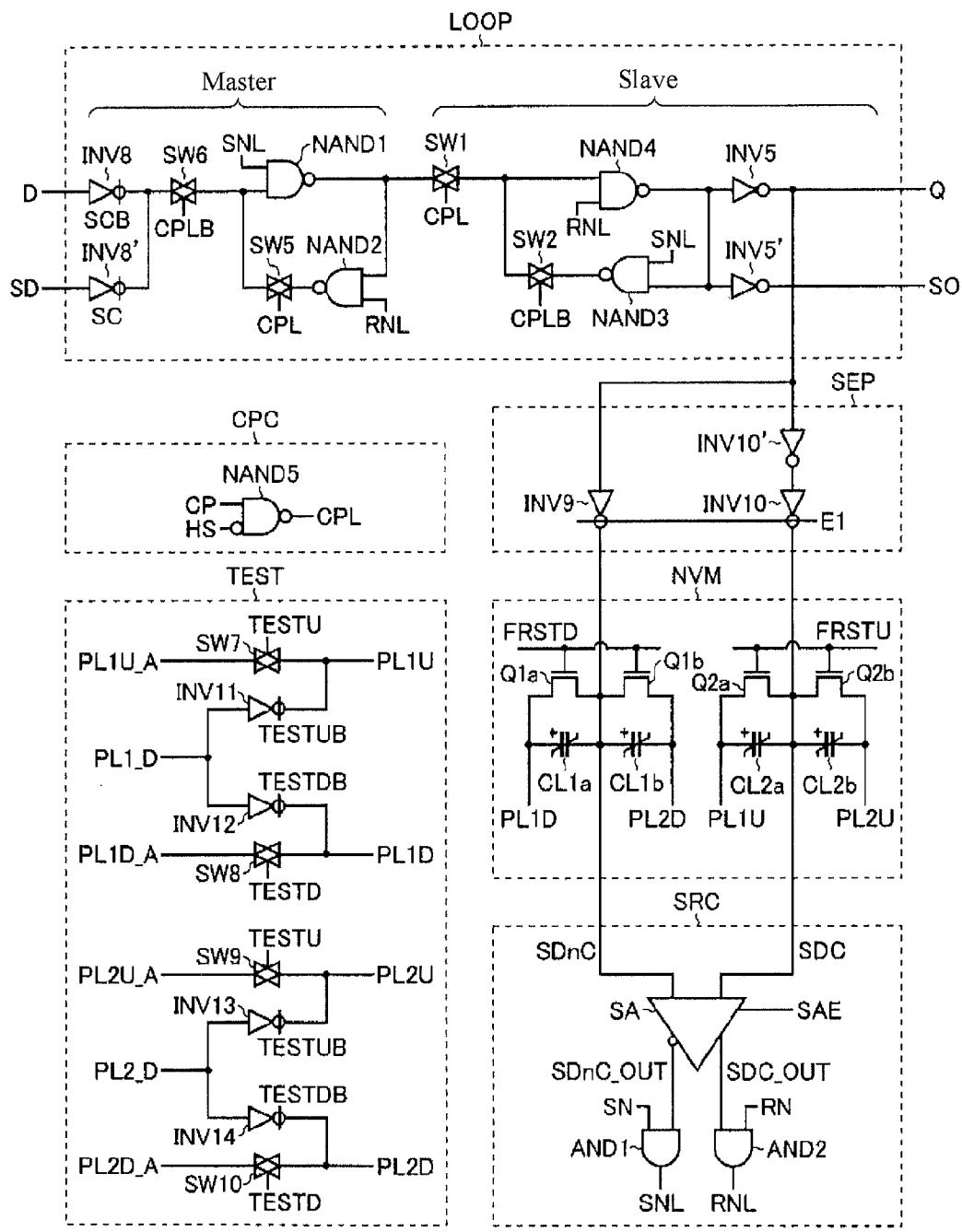
FIG. 38 is a circuit diagram showing the sixth embodiment of the data hold device of the present invention.

FIG. 38 is the circuit diagram showing the sixth embodiment of the data hold device in the present invention. And the present embodiment is generally the same as the previous fifth embodiment (FIG. 26), there is only the output signal Q of the loop structure portion LOOP is input to the circuit separating portion SEP. Besides, the circuit separating portion SEP directly inputs output signal Q to the 3-state inverter INV, on the other hand, the logic reverse signal of the output signal Q is input to the 3-state inverter INV10 through a new inserted inverter 10'. It does not need any modification to the loop structure portion LOOP via such structure, and it can attach circuit separating portion SEP, non-volatile storage portion NVM and set/reset control portion SRC and etc., thus, it is easy to turn the present data storage device into non-volatile.

The Seventh Embodiment

Figure 39:
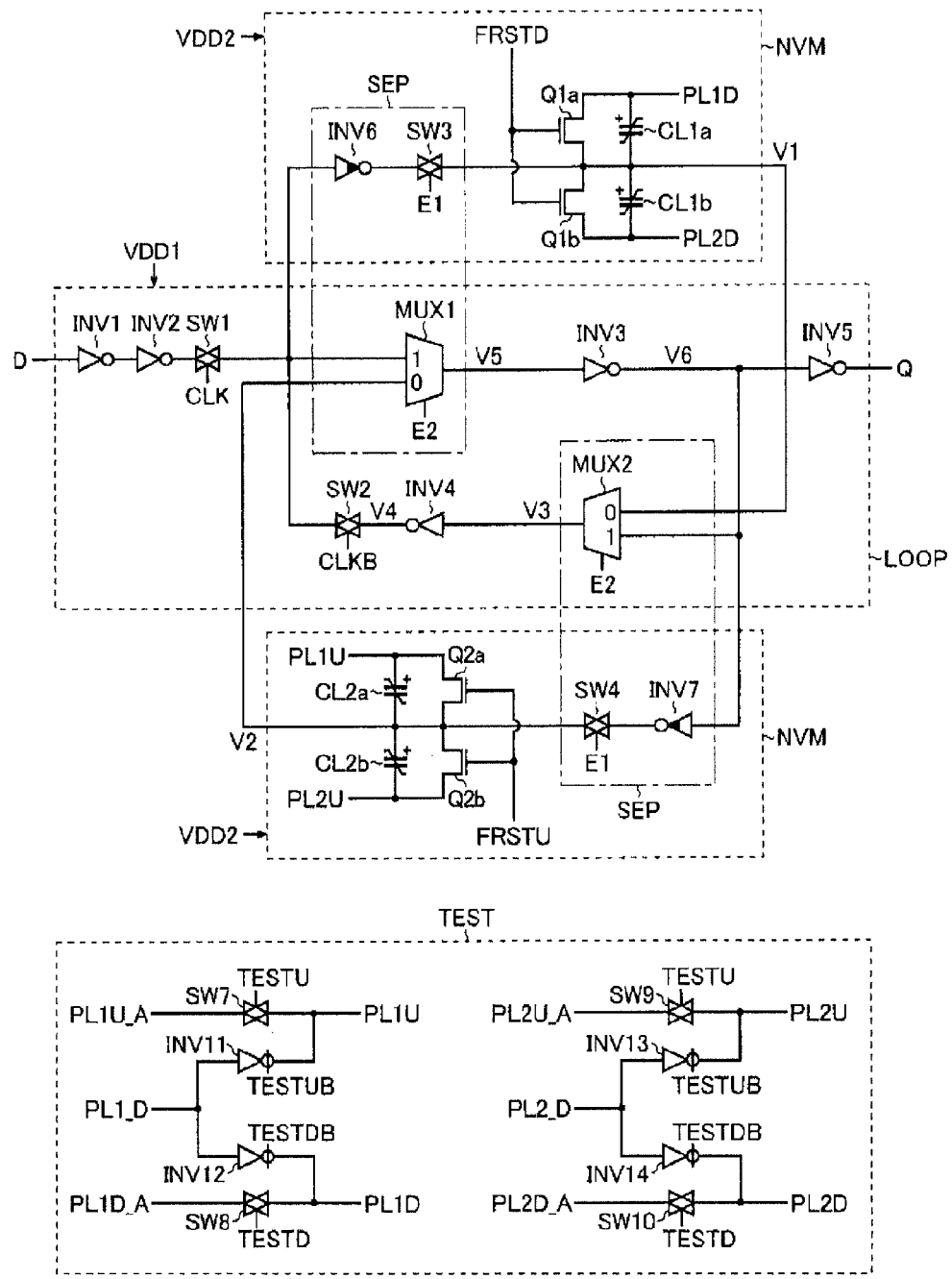
FIG. 39 is a circuit diagram showing the seventh embodiment of the data hold device of the present invention.

FIG. 39 is a circuit diagram showing the seventh embodiment of the data hold device in the present invention. In addition, this embodiment is equivalent to the following structure: the first plate line, the second plate line and the F reset signal line are respectively separated into 2 systems (U system/D system) in the data hold device of FIG. 1 and then configured in the testing circuit portion TEST.

Figure 40:
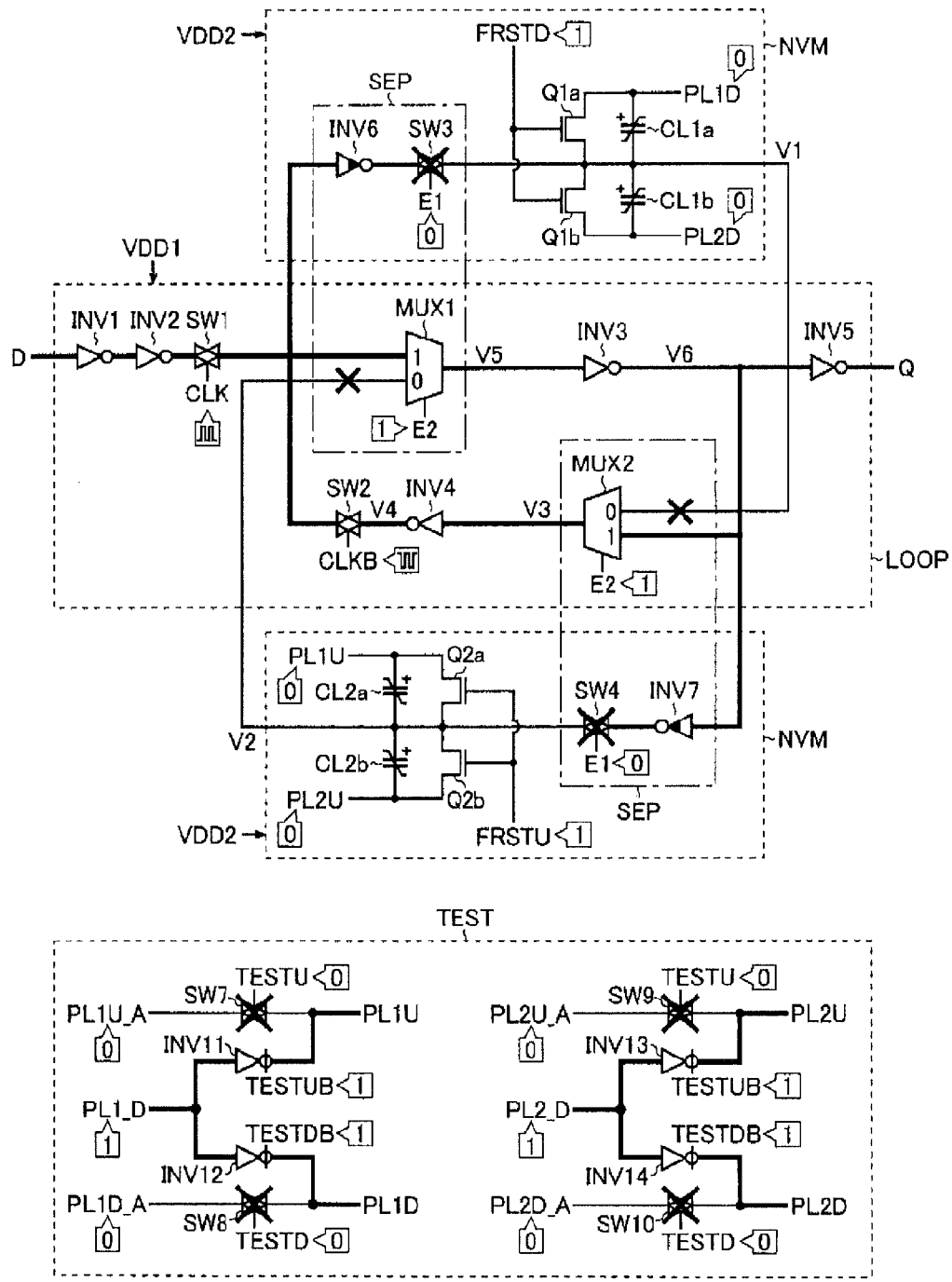
FIG. 40 illustrates a circuit diagram showing action state of each portion of the device during normal action of the seventh embodiment.

Firstly, the normal action of the data hold device is illustrated. FIG. 40 is a circuit diagram showing the action state of portions of the device in normal action.

When the data hold device normally acts, the lock action of the data signal D is processed in the loop structure portion LOOP based on the clock signal CLK or the reverse clock signal CLKB driven by pulse.

And, when the data hold device normally acts, the control signal E1 is set to be low level (0) in the circuit separating portion SEP; the switches SW3 and SW4 are both switched off, and the control signal E2 is set to be high level (1); the first input ends (1) of the multiplexers MUX1 and MUX2 are selected. Thus, the normal loop of the loop structure portion LOOP is formed at the state that the loop structure portion LOOP and the non-volatile storage portion NVM are electrically separated.

Further, the F reset signal FRSTD and FRSTU of high level (1) is input in the non-volatile storage portion when the data hold device normally acts. Thus, the transistors Q1a, Q1b, Q2a and Q2b are switched on; every two ends of the ferroelectric elements CL1a, CL1b, CL2a and CL2b are in short circuit, therefore the unexpected voltage apply to every ferroelectric element can be avoided. Further, meanwhile, the voltage signal at low level (0) is applied to the first plate lines PL1D, PL1U and the second plate line PL2D, PL2U.

In addition, the analog enable signals TESTD, TESTU of low level (0) are input to the testing circuit portion TEST when the data hold device normally acts. Thus, the switches SW7-SW10 are switched off, the 3-state inverter INV11-INV14 are switched on. Further, at the same time, the voltage signal at high level (1) is applied to the first digital plate line PL1_D and the second digital plate line PL2_D. Hence, the voltage signal at low level (0) is respectively applied to the first plate lines PL1D, PL1U and the second plate lines PL2D, PL2U through the 3-state inverter. And, this time, the voltage signal at low level (0) is applied to the first analog plate lines PL1D_A, PL1U_A and the second analog plate lines PL2D_A, PL2U_A.

Figure 41:
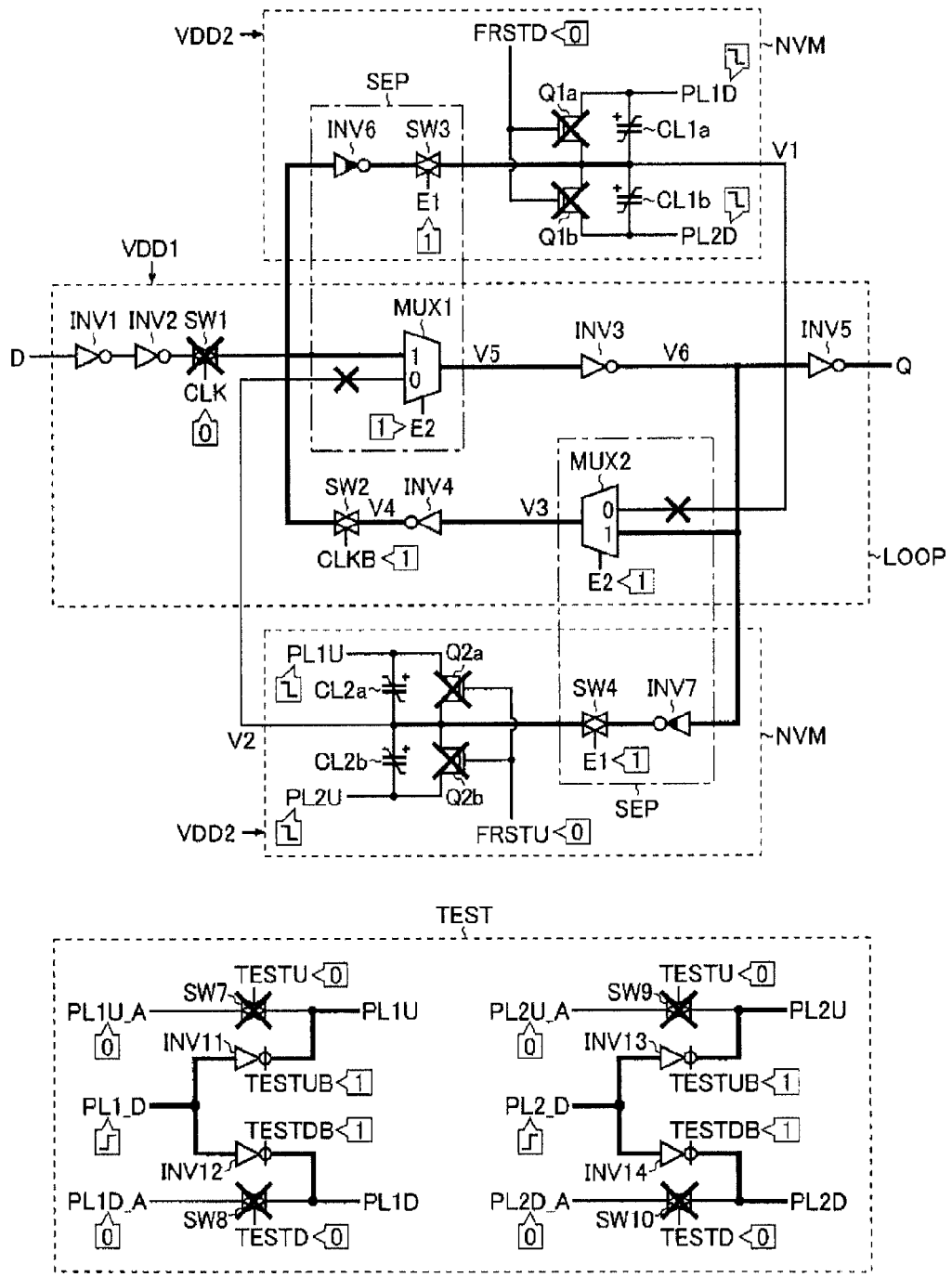
FIG. 41 illustrates a circuit diagram showing action state of each portion of the device during data writing action of the seventh embodiment.

Then, the data writing-in action of the data hold device (action of storing data to the non-volatile storage portion) is illustrated. FIG. 41 is a circuit diagram showing the action states of portions of the device during data writing-in action.

During the data writing-in action of the data hold device, the clock signal CLK and the reverse clock signal CLKB input to the loop structure portion LOOP are fixed respectively at low level (0) and high level (1). Thus, the input path of the data signal D can be switched off in a way that the content of the storage data (i.e., the data should be stored in the non-volatile storage portion NVM) of the loop structure portion LOOP is constant, the stability of the action of writing data (data storage action) of the non-volatile storage portion NVM can be further improved.

And, during the data writing-in action of the data hold device, the control signal E1 in the circuit separating portion SEP is set to be high level (1), the switches SW3 and SW4 are switched on; Further, the control signal E2 is set to be high level (1); the first input ends (1) of the multiplexer MUX1 and MUX2 are selected. Hence, the loop structure portion LOOP and the non-volatile storage portion NVM are electrically broken over at the state of forming the normal loop of the loop structure portion LOOP.

Moreover, during the data writing-in action of the data hold device, the F reset signal FRSTD, FRSTU of low level (0) is input to the non-volatile storage portion NVM. Thus, the transistors Q1a, Q1b, Q2a and Q2b are switched off; every two ends of the ferroelectric elements CL1a, CL1b, CL2a and CL2b are in open state (non-short circuit state), therefore data writing-in voltage can be applied to the ferroelectric element. Further, at this time, the same pulse voltage signal (for example, from high level to low level) is applied to the data writing voltages in the first plate lines PL1D, PL1U and the second plate lines PL2D, PL2U. By applying such pulse voltage signal, the residual polarization state in the ferroelectric element is set as any one of reverse state/non-reverse state. This is the same as the content, so repeated description is omitted.

Furthermore, during the data writing-in action of the data hold device, the analog enable signals TESTD, TESTU of low level (0) are input to the testing circuit portion TEST as in the normal action. Thus, the switches SW7-SW10 are switched off; the 3-state inverters INV11-INV14 are switched on. Further, at this time, the same pulse voltage signal (for example, from low level to high level) is applied to the first digital plate line PL1_D and the second digital plate line PL2-D. Hence, the same pulse voltage signal (for example, from high level to low level) is respectively applied to the first plate lines PL1D, PL1U and the second plate line PL2D, PL2U. Further, at this time, the voltage signal at low level (0) is applied to the first analog plate lines PL1D_A, PL1U_A and the second analog plate lines PL2D_A, PL2U_A.

Figure 42:
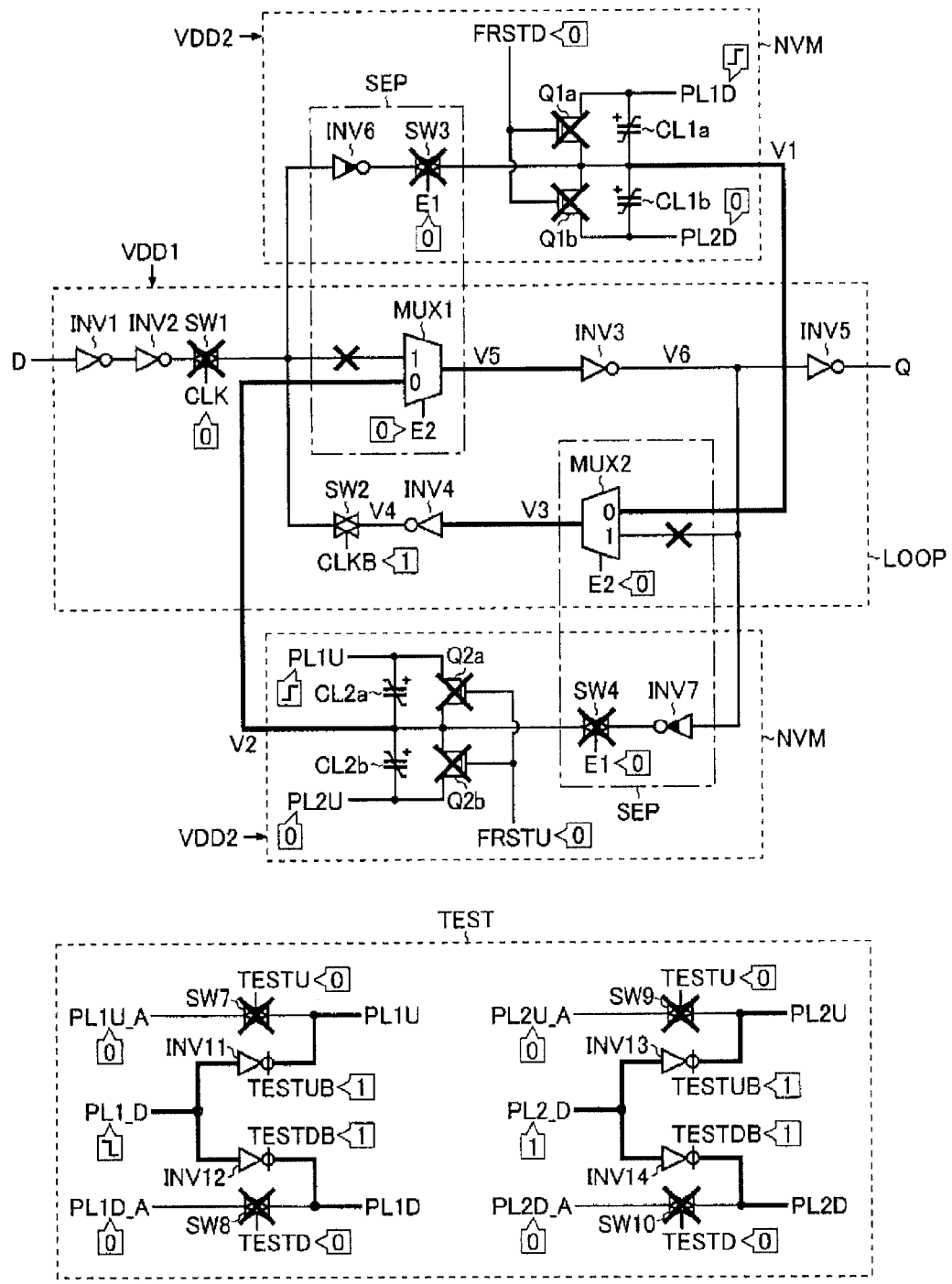
FIG. 42 illustrates a circuit diagram showing action state of each portion of the device during data readout action of the seventh embodiment.

Then, the data readout action of the data hold device (action of recovering data of the loop structure portion LOOP) is illustrated. FIG. 42 is a circuit diagram showing the action states of portions of the device during data readout action.

During the data readout action of the data hold device, the clock signal CLK and the reverse clock signal CLKB input to the loop structure portion LOOP are fixed respectively at low level (0) and high level (1) as in the data writing-in action. Further, after the data readout action, the pulse driving of the clock signal CLK and the reverse clock signal CLKB is restarted.

And, during the data readout action of the data hold device, the control signal E1 is set to be low level (0) in the circuit separating portion SEP, the switches SW3 and SW4 are switched off; further, the control signal E2 is low level (0), and the second input ends (0) of the multiplexers MUX1 and MUX2 are selected. Thus, the loop structure portion LOOP and non-volatile storage portion NVM are electrically broken over in the connection form that data can be read out from the non-volatile storage portion NVM to the loop structure portion.

Moreover, during the data readout action of the data hold device, the F reset signal FRSTD, FRSTU of low level (0) is input to the non-volatile storage portion NVM. Thus, the transistors Q1a, Q1b, Q2a and Q2b are switched off, every two ends of the ferroelectric elements CL1a, CL1b, CL2a and CL2b are in open state (non-short circuit state), thus data readout voltage can be applied to the ferroelectric element. Further, at this time, as the data readout voltage, the second plate lines PL2D, PL2U maintain at low level so as to apply given pulse voltage signal (for example, from low level to high level) to the first plate lines PL1D, PL1U. By applying such pulse voltage signal, node signals V1 and V2 corresponding to the residual polarization state in the ferroelectric element respectively appear in the D system output end (the connecting node of the negative pole end of the ferroelectric element CL1a and the positive pole end of the ferroelectric element CL1b), and the U system output end (the connecting node of the negative pole end of the ferroelectric element CL2a and the positive end of the ferroelectric element CL2b) of the non-volatile storage portion NVM. Through this way, the recovering voltage signal (level difference between the node voltage V1 and the node voltage V2) read out from the non-volatile storage portion NVM is amplified by the loop structure portion LOOP when the control signal E2 is increased from low level (0) to high level (1), so as to recover the hold data before switching off the supply as the output signal Q. This is the same as the content, so repeated description is omitted.

Furthermore, during the data readout action of the data hold device, the analog enable signals TESTD, TESTU of low level (0) are input to the testing circuit portion TEST as in the normal action. Thus, the switches SW7-SW10 are switched off; the 3-state inverters INV11-INV14 are switched on. Further, at this time, the given pulse voltage signal (for example, from high level to low level) is applied to the first digital plate line PL1_D, the voltage signal at high level (1) is applied to the second digital plate line PL2_D. Hence, the same pulse voltage signal (for example, from low level to high level) is applied to the first plate lines PL2D, PL2U respectively through the 3-state inverters INV11 and INV12; the voltage signal at low level (0) are applied to the second plate lines PL2D, PL2U respectively through the 3-state inverters INV13 and INV14. And, at this time, the voltage signal at low level (0) are applied to the first analog plate lines PL1D_A, PL1U_A and the second analog plate lines PL2D_A, PL2U_A.

Figure 43:
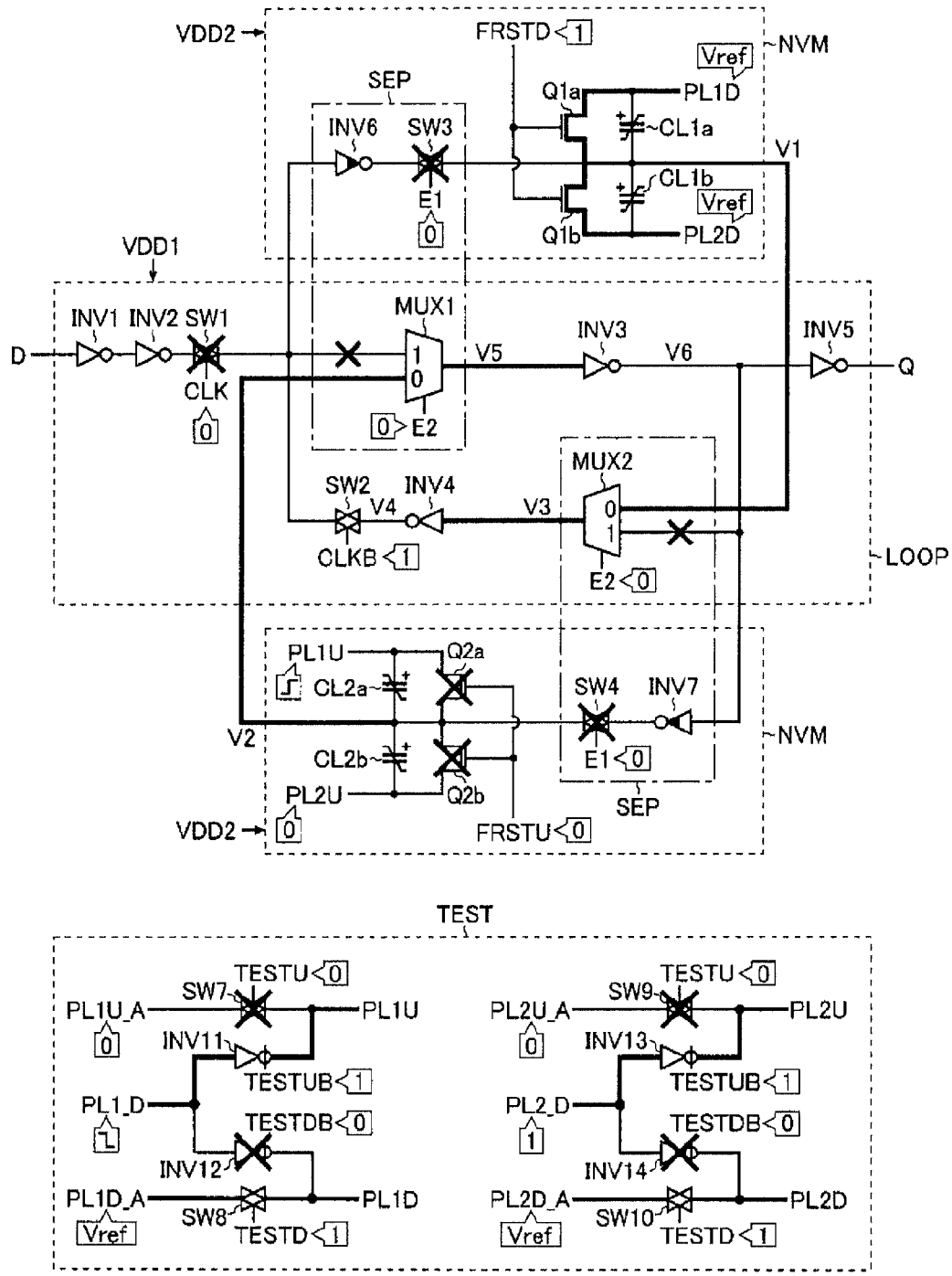
FIG. 43 illustrates a circuit diagram showing action state of each portion of the device during testing action of the seventh embodiment.

Next, the testing action of the data hold device (analog characteristic assessment action of the ferroelectric element) is illustrated. FIG. 43 is a circuit diagram showing action states of portions of the device during testing action (particularly recovering steps of stored data orderly included in a series of testing actions). Further, it is called "U system testing action of non-volatile storage portion NVM" under a condition that analog characteristic assessment of the node voltage V2 appears in the U system output end of the non-volatile storage portion NVM and is illustrated in detail.

During the U system testing action of the non-volatile storage portion NVM, the clock signal CLK and the reverse clock signal CLKB input to the loop structure portion LOOP are fixed respectively at low level (0) and high level (1) as in the data readout action. Further, after finishing the testing action, the pulse driving and testing action of the clock signal CLK and the reverse clock signal are restarted.

And, during the U system testing action of the non-volatile storage portion NVM, the control signal E1 is set to be low level (0); the switches SW3 and SW4 are switched off; moreover, the control signal E2 is low level (0), and the second input ends (0) of the multiplexers MUX1 and MUX2 are selected. Thus, the loop structure portion LOOP and the non-volatile storage portion NVM are electrically broken over in the connection form that data can be read out from the non-volatile storage portion NVM to the loop structure portion LOOP.

Furthermore, during U system testing action of the non-volatile storage portion NVM, the F reset signal FRSTU of low level (0) is input to the U system of the non-volatile storage portion NVM. Thus, the transistors Q2a, Q2b are switched off, every two ends of the ferroelectric elements CL2a, CL2b are in open state (non-short circuit state), thus the data readout voltage can be applied to the ferroelectric element. Further, at this time, as the data readout voltage, the second plate line PL2U maintains at low level and the given pulse voltage signal (for example, from low level to high level) is applied to the first plate line PL1U. By applying such pulse voltage signal, the node voltage V2 corresponding to the residual polarization state in the ferroelectric element appears in the U system output end of the non-volatile storage portion NVM (connecting node of the negative pole end of the ferroelectric element CL2a and the positive pole end of the ferroelectric element CL2b). This is the same as the content, so the repeated description is omitted.

On the other side, during the U system testing action of the non-volatile storage portion NVM, the F reset signal FRSTD of high level (1) is input to the D system of the non-volatile storage portion NVM. Thus, the transistors Q2a, Q2b are switched on; every two ends of the ferroelectric elements CL2a, CL2b are in short circuit. Further, at this time, the reference voltage signal Vref having given analog voltage is applied to the first plate line PL1D and the second plate line PL2D. Hence, the node voltages V1 at the D system output end of the non-volatile storage portion NVM (connecting node of the negative pole end of the ferroelectric element CL1a and the positive pole end of the ferroelectric element CL1b) becomes the reference voltage signal Vref.

And, during U system testing action of the non-volatile storage portion NVM, the analog enable signal TESTU input to the U system of the testing circuit portion TEST is at low level (0). Thus, the switches SW7 and SW9 are switched off, the 3-state inverters INV11, INV13 are switched on. Further, at this time, the given pulse voltage signal (for example, from high level to low level) is applied to the first digital plate line PL1_D, the voltage signal at high level (1) is applied to the second digital plate line PL2_D. Hence, the given pulse voltage signal (for example, from low level to high level) is applied to the first plate line PL1U of the U system through the 3-state inverter INV11, the voltage signal at low level (0) is applied to the second plate line PL2U_A of the U system through the 3-state inverter. Further, at this time, the voltage signal at low level (0) is applied to the first analog plate line PL1U_A of the U system and the second analog plate line PL2U_A of the U system.

On the other side, during the U system testing action of the non-volatile storage portion NVM, the analog enable signal TESTD input to the D system of the testing circuit portion TEST is at high level (1). Thus, the switches SW8, SW10 are switched on; the 3-state inverters INV12, INV14 are switched off. And, at this time, the reference voltage signal Vref having given voltage is applied to the first analog plate line PL1D_A of the D system and the second analog plate line PL2D_A of the D system.

In this way, the node voltage V2 at the U system output end of the non-volatile storage portion NVM is read out, the voltage of the reference voltage signal Vref input as node voltages V1 is orderly changed through step control or scan control, and the logic level of the output signal Q recovered in the loop structure portion LOOP is monitored each time, so that the analog voltage of the node voltage V2 at the U system output end of the non-volatile storage portion NVM is learned. This is the same as the content, so detailed description is omitted. And, control opposite to the content is processed in the condition that the analog voltage of the node voltages V1 at the D system output end of the non-volatile storage portion NVM is expected to be learned, this is the same as the description.

Thus, the data hold device which should stop the clock signal while processing data storage/recover certainly can be configured in the testing circuit portion TEST.

<Data Corruption Preventing Action>

Figure 44:
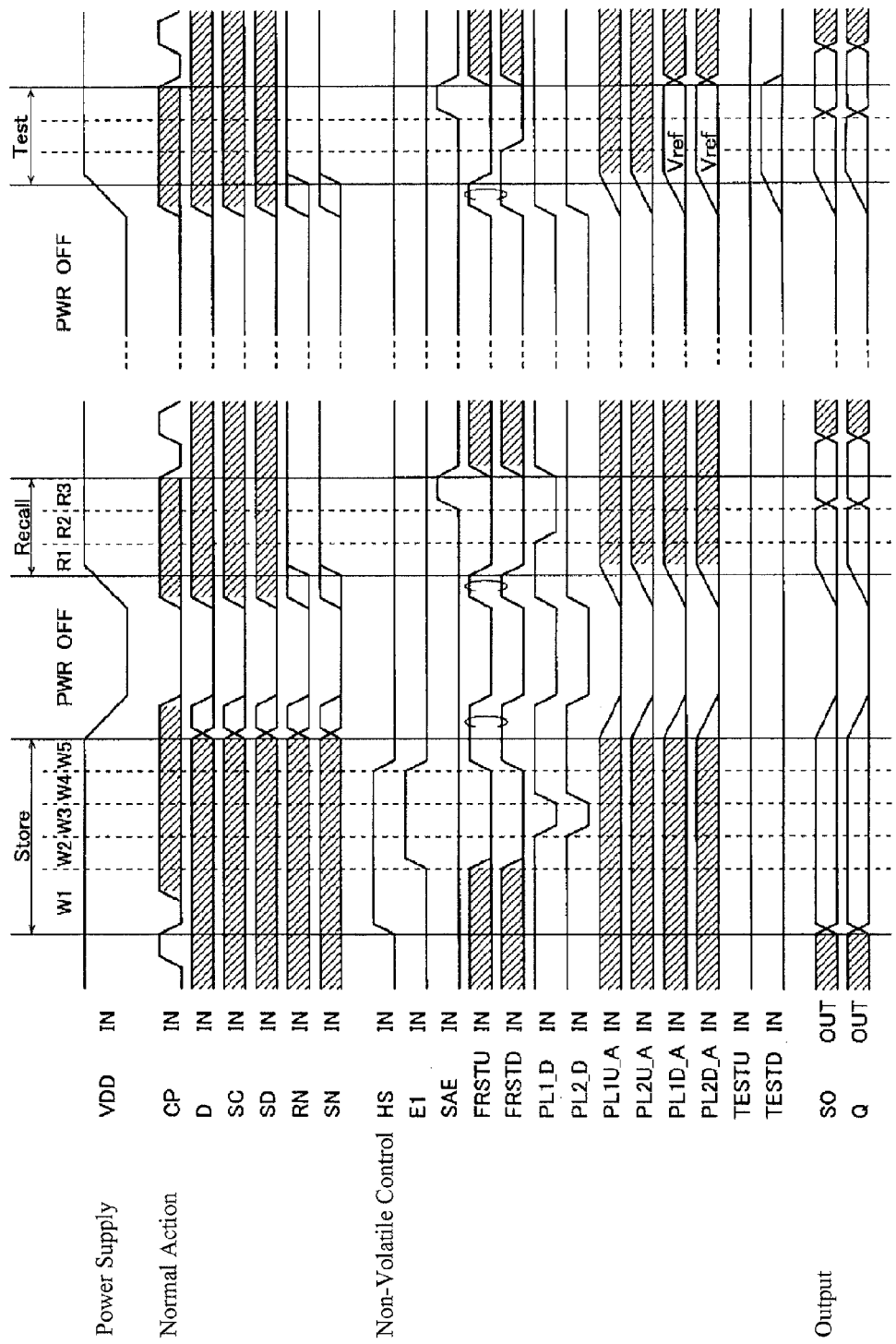
FIG. 44 illustrates a sequence diagram showing data damage prevention when the power is turned on/off.

FIG. 44 is a sequence diagram used for illustrating the data corruption preventing action when the supply is switched on/off, the supply voltage VDD, the external clock signal CP, the data signal D, the scan control signal SC, the scan data SD, the external reset signal RN, the external device signal SN, the data hold control signal HS, the control signal E1, the sense amplifier enable signal SAE, the F reset signal FRSTU of the U system, the F reset signal FRSTD of the D system, the first digital plate line PL1_D, the second digital plate line PL2-D, the first analog plate line PL1U_A of the U system, the second analog plate line PL2U_A of the U system, the first analog plate line PL1D_A of the D system, the second analog plate line PL2D_A of the D system, the analog enable signal TESTU of the U system, the analog enable signal TESTD of the D system, the scanning output data SO and the output signal Q are orderly described from top to bottom.

As shown in the sequence diagram, in the data hold device of the present invention, appropriate order control is processed in the transition state when the supply is switched on/off, even under a condition that a driver (INV) for applying voltage signal to the ferroelectric element wrongly acts, so that high voltage causing corruption degree of the data stored in the non-volatile storage portion NVM will not be applied between two ends of the ferroelectric element. Thus, non-volatile storage with high reliability can be processed.

<Control Circuit>

Then, (for example) a mechanism used for controlling the data storage/recover action of the data hold device illustrates that the control circuit can be suitably utilized.

Figure 46:
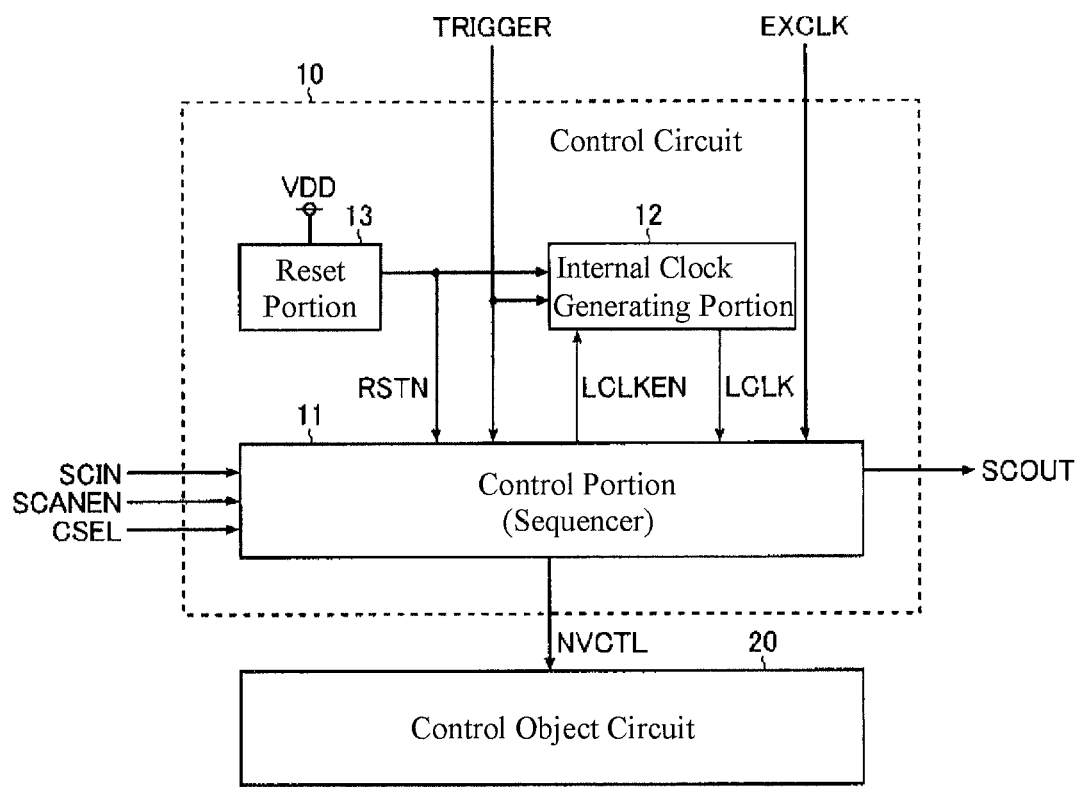
FIG. 46 illustrates a block diagram showing one structure example of the control circuit.

FIG. 46 is a block diagram showing a structure example of the control circuit. The control circuit 10 of this structure example includes a control portion 11, an internal clock generating portion 12 and a reset portion 13.

The control portion 11 is a sequencer synchronous to the internal clock signal LCLK or the external clock signal EXCLK to act, which detects the specific signal pattern (pulse edge in this structure example) included in the trigger signal TRIGGER to generate the control signal NVCTL of the control object circuit 20. Further, besides the trigger signal TRIGGER, the internal clock signal LCLK and the external clock signal EXCLK, the internal reset signal RSTN used for processing control portion 11 initializing, the scanning path input signal SCIN and the scanning path enable signal SCEN used for performing testing action of the control portion 11, and the clock selection signal CSEL which synchronously acts with one selected from the internal clock signal LCLK and the external clock signal EXCLK, are input to the control portion 11. And, the internal clock generating enable signal LCLKEN and the scanning path output signal SCOUT are output from the control portion 11.

The internal clock generating unit 12 starts generating the internal clock signal LCLK required by the action of the control portion when pulse edge appears in the trigger signal TRIGGER, continually generates the internal clock signal LCLK at least before the generation processing of the control signal NVCTRL in the control portion 11 is completed, and then stops generating the internal clock signal LCLK. That is to say, the internal clock generating portion 12 generates the internal clock LCLK only when the control portion 11 is required to act. According to the structure of the internal clock generating portion 12, the clock supply source is not necessary to be set on the external portion of the control portion 10, so that it helps the part decrease and the cost reduction of the device. Further, according to the control circuit 10 of this structure example, the control portion 11 and the internal clock generating unit 12 can omit unnecessary actions, so that the power consumption of the control circuit 10 can be reduced (and the power consumption of the whole device is reduced).

The reset portion 13 monitors the supply voltage VDD to generate the internal reset signal RSTN used for initializing the control portion 11 and the internal clock generating portion 12.

Figure 47:
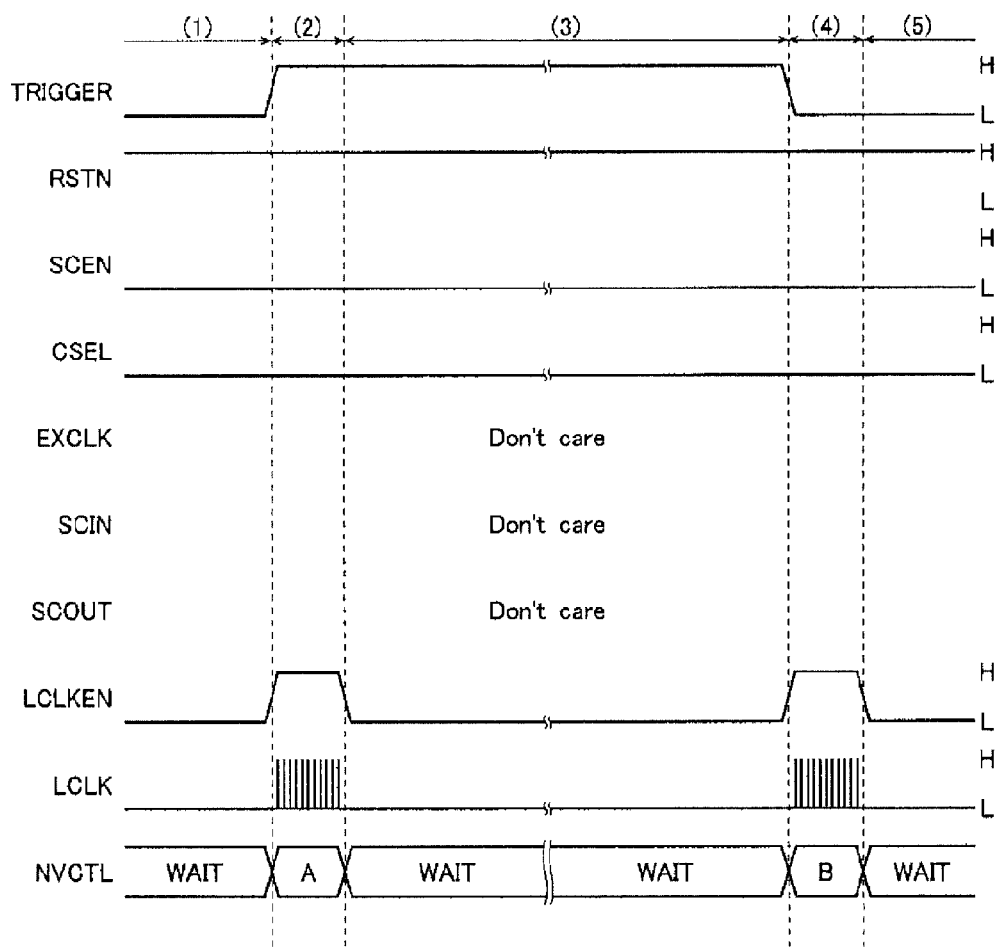
FIG. 47 illustrates a sequence diagram showing an example of using the internal clock signal to perform basic action.

FIG. 47 is a sequence diagram showing the basic action example of the control circuit 10 using the internal clock signal LCLK, the trigger signal TRIGGER, the internal reset signal RSTN, the scanning path enable signal SCEN, the clock selection signal CSEL, the external clock signal EXCLK, the scanning path input signal SCIN, the scanning path output signal SCOUT, the internal clock generating enable signal LCLKEN, the internal clock signal LCLK and the control signal NVCTL are orderly described from top to bottom.

In this action example, the internal reset signal RSTN is always set to be high level (reset release state), the scanning path enable signal SCEN is always set to be low level (scanning path failure state), the clock selection signal CSEL is always set to be low level (internal clock signal selection state). Further, in this action example, the external clock signal EXCLK, the scanning input signal SCIN and the scanning output signal SCOUT are ignored.

During a period (1) of maintaining the trigger signal TRIGGER at low level, the control portion 11 is changed into a state of waiting for edge input of the trigger signal TRIGGER and the internal clock signal LCLK. At this time, the control signal NVCTL maintains at logic level used for setting the control object circuit 20 into wait state (WAIT), and the internal clock generating enable signal LCLKEN maintains at low level (internal clock generating failure state). Further, the so-called wait state (WAIT) of the control object circuit 20 is a state that the control object circuit 20 does not perform the following processing A or processing B; the control object circuit 20 can perform processing except the processing A and the processing B. And, the internal clock generating portion 12 is changed into a state of waiting for the edge input of the trigger signal TRIGGER. At this time, the internal clock signal maintains at low level.

During a period (2), the internal clock generating portion 12 starts generating the internal clock signal LCLK when the trigger signal TRIGGER is increased to high level and stops generating the internal clock signal LCLK when the internal clock generating enable signal LCLKEN falls to low level. The control portion 11 is synchronous to the internal clock signal LCLK to generate the control signal NVCTL. At this time, the control portion 11 identifies the trigger signal TRIGGER as high level, and generates the control signal NVCTL used for performing predetermined processing A to the control object circuit 20. And, the control portion 11 receives the first pulse of the internal clock signal LCLK to increase the internal clock generating enable signal LCLKEN to high level (internal clock generating valid state) and decreases the internal clock generating enable signal LCLKEN to low level after completing the sequence action of the processing A.

During a period (3) of maintaining the trigger signal TRIGGER at high level, the control portion 11 is changed into a state of waiting for the edge input of the trigger signal TRIGGER and the internal clock signal LCLK. At this time, the control signal NVCTL maintains at logic level used for setting the control object circuit 20 into wait state (WAIT); the internal clock generating enable signal LCLKEN maintains at low level. And, the internal clock generating portion 12 is changed into a state of waiting for the edge input of the trigger signal TRIGGER. Meanwhile, the internal clock signal LCLK maintains at low level.

During a period (4), the internal clock generating portion 12 starts generating the internal clock signal LCLK when the trigger signal TRIGGER falls to low level and stops generating the internal clock signal LCLK when the internal clock generating enable signal LCLKEN falls to low level. The control portion 11 and the internal clock signal LCLK are synchronous to generate control signal NVCTL. At this time, the control portion 12 identifies the trigger signal TRIGGER as low level, and generates control signal NVCTL used for performing predetermined processing B to the control object circuit 20. And, the control portion 11 receives the first pulse of the internal clock signal LCLK to increase the internal clock generating enable signal LCLKEN to high level and decreases the internal clock generating enable signal LCLKEN to low level after completing the sequence action of the processing B.

During a period (5) of maintaining the trigger signal TRIGGER at low level, the control portion 11 is changed into a state of waiting for the edge input of the trigger signal TRIGGER and the internal clock signal LCLK. At this time, the control signal NVCTL maintains at logic level used for setting the control object circuit 20 into wait state (WAIT); the internal clock generating enable signal LCLKEN maintains at low level. And, the internal clock generating portion 12 is changed into a state of waiting for the edge input of the trigger signal TRIGGER. Meanwhile, the internal clock signal LCLK maintains at low level.

As mentioned above, the control portion 11 controls the control signal NVCTL and performs different processing A, B to the control object circuit 20 according to the increase/decrease of the pulse edge appearing in the trigger signal TRIGGER.

Then, a condition of using the control circuit 10 of this structure example to control the data storage/recover action of the data hold device is illustrated. In this condition, the loop structure portion LOOP, non-volatile storage portion NVM and the circuit separating portion SEP and so on are equivalent to the control object circuit 20; the F reset signal FRST, control signal E1 and E2, the first plate line PL1 and the second plate line PL2 are equivalent to the control signal NVCTL. Further, a general external reset IC used for monitoring the supply voltage VDD and so on can be used for generating trigger signal TRIGGER. For instance, a system reset signal, capable of being changed into high level if 90% higher than the standard value and to low level if 90% lower than the standard value, can be used as the trigger signal TRIGGER.

If the supply voltage VDD is 90% higher than the predetermined value due to the switch-on of the supply, the trigger signal TRIGGER is changed into high level, the rising edge is taken as the trigger to start generating the internal clock signal LCLK. Moreover, the data recovering processing (=processing A) corresponding to the control signal NVCTL is processed in the control object circuit 20. After completing the data recovering processing, the generation of the internal clock signal LCLK is stopped. Then, during a period that the supply voltage VDD is higher than the predetermined value, normal logic action is processed in the control object circuit 20.

If the supply voltage VDD is 90% lower than the predetermined value due to the switch-off of the supply, the trigger signal TRIGGER is changed into low level, the falling edge is taken as the trigger to start generating the internal clock signal LCLK. Moreover, the data storing processing (=processing B) corresponding to the control signal NVCTL is processed in the control object circuit 20. After completing the data storing processing, the generation of the internal clock signal LCLK is stopped. Then, during a period that the supply voltage VDD is lower than the predetermined value, data hold is processed in the control object circuit 20 by using the non-volatile logic.

Figure 48:
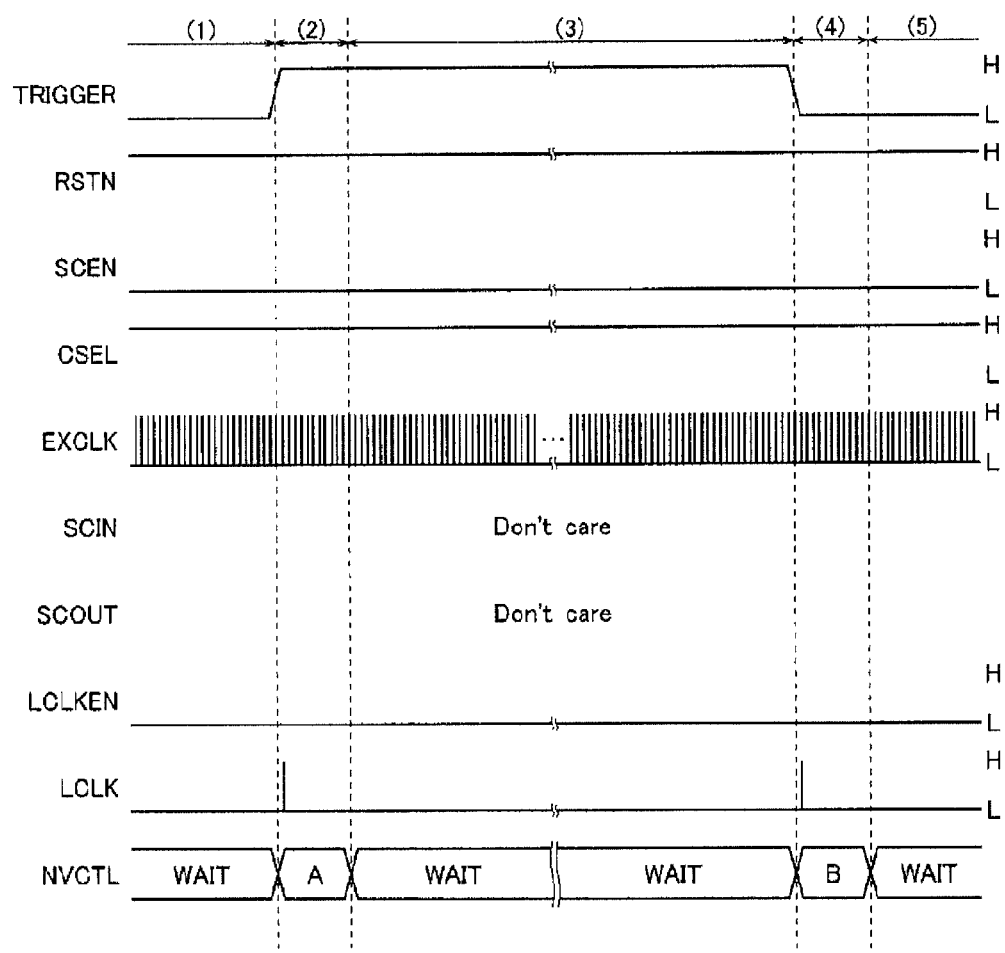
FIG. 48 illustrates a sequence diagram showing an example of using the external clock signal to perform basic action.

FIG. 48 is a sequence diagram showing the basic action example of the control circuit 10 using the external clock signal EXCLK, the trigger signal TRIGGER, the internal reset signal RSTN, the scanning path enable signal SCEN, the clock selection signal CSEL, the external clock signal EXCLK, the scanning path input signal SCIN, the scanning path output signal SCOUT, the internal clock generating enable signal LCLKEN, the internal clock signal LCLK and the control signal NVCTL are orderly described from top to bottom.

In this action example, the internal reset signal RSTN is always set to be high level (reset release state), the scanning path enable signal SCEN is always set to be low level (scanning path failure state), the clock selection signal CSEL is always set to be low level (internal clock signal selection state). Moreover, the internal clock generating enable signal LCLKEN is always at low level (internal clock generation failure state), the external clock signal EXCLK is always input. Further, in this action example the scanning input signal SCIN and the scanning output signal SCOUT are ignored.

During a period (1) of maintaining the trigger signal TRIGGER to low level, the control portion 11 is changed into a state of waiting for edge input of the trigger signal TRIGGER. At this time, the control signal NVCTL maintains at logic level used for setting the control object circuit 20 into wait state (WAIT). Moreover, the internal clock generating portion 12 is changed into the state of waiting for the edge input of the trigger signal TRIGGER. At this time, the internal clock signal LCLK maintains at low level.

During a period (2), the internal clock generating portion 12 starts generating the internal clock signal LCLK when the trigger signal TRIGGER is increased to high level. However, the internal clock generating enable signal LCLKEN is always maintained to low level, thus the generating action of the internal clock signal LCLK is stopped but not continued. The control portion 11 and the external clock signal EXCLK are synchronous to generate control signal NVCTL. At this time, the control portion 11 identifies the trigger signal TRIGGER as high level, and generates the control signal NVCTL used for performing predetermined processing A to the control object circuit 20.

During a period (3) of maintaining the trigger signal TRIGGER to high level, the control portion 11 is changed into a state of waiting for the edge input of the trigger signal TRIGGER and the internal clock signal LCLK. At this time, the control signal NVCTL maintains at logic level used for setting the control object circuit 20 into wait state (WAIT). Moreover, the internal clock generating portion 12 is changed into a state of waiting for the edge input of the trigger signal TRIGGER. Meanwhile, the internal clock signal LCLK maintains at low level.

During a period (4), the internal clock generating portion 12 starts generating the internal clock signal LCLK when the trigger signal TRIGGER falls to low level. However, the internal clock generating enable signal LCLKEN is always maintained to low level, thus the generating action of the internal clock signal LCLK is stopped but not continued. The control portion 11 and the internal clock signal LCLK are synchronous to generate control signal NVCTL. At this time, the control portion 12 identifies the trigger signal TRIGGER as low level, and generates control signal NVCTL used for performing predetermined processing B to the control object circuit 20.

During a period (5) of maintaining the trigger signal TRIGGER to low level, the control portion 11 is changed into a state of waiting for the edge input of the trigger signal TRIGGER. At this time, the control signal NVCTL maintains at logic level used for setting the control object circuit 20 into wait state (WAIT). Furthermore, the internal clock generating portion 12 is changed into a state of waiting for the edge input of the trigger signal TRIGGER. Meanwhile, the internal clock signal LCLK maintains at low level.

As mentioned above, the control circuit 10 of this structure example performs actions by using external clock signal EXCLK input externally as well as the internal clock signal LCLK. Through this structure, the internal clock signal LCLK and the external clock signal EXCLK can be randomly selected according to the use of the user. In particular, in order to realize the following testing action, the action synchronous to the external clock signal EXCLK becomes the required condition.

Furthermore, under a condition that the external clock signal EXCLK is selected by using the clock selection signal CSEL, the internal reset generating enable signal LCLKEN is always at low level, thus the internal clock signal LCLK will not be continually generated even though pulse edge appears in the trigger signal TRIGGER. Hence, the power waste of the internal clock generating portion 12 can be avoided.

Figure 49:
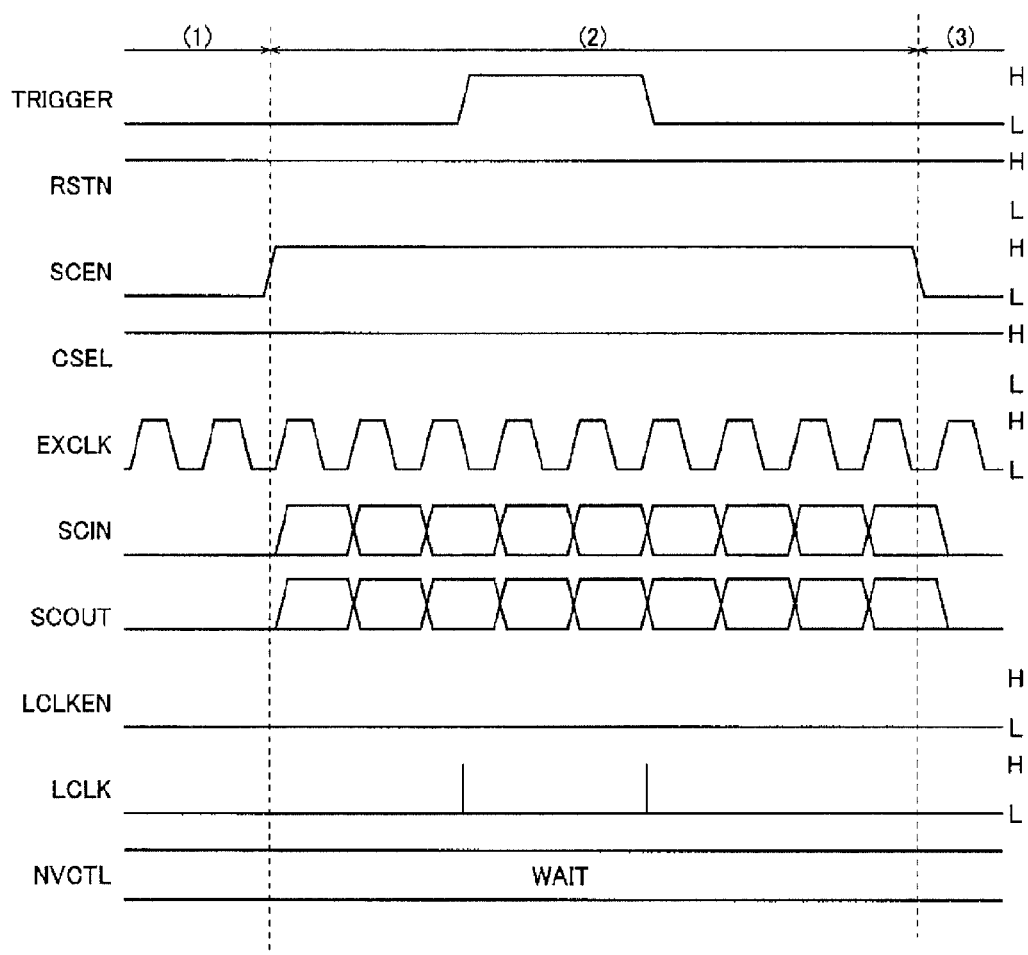
FIG. 49 illustrates a sequence diagram showing an example of using the external clock signal to perform testing action.

FIG. 49 is a sequence diagram showing the testing action example of the control circuit 10 using the external clock signal EXCLK, the trigger signal TRIGGER, the internal reset signal RSTN, the scanning path enable signal SCEN, the clock selection signal CSEL, the external clock signal EXCLK, the scanning path input signal SCIN, the scanning path output signal SCOUT, the internal clock generating enable signal LCLKEN, the internal clock signal LCLK and the control signal NVCTL are orderly described from top to bottom.

In this action example, the internal reset signal RSTN is always set to be high level (reset release state), the clock selection signal CSEL is always set to be low level (internal clock signal selection state). Moreover, the internal clock generating enable signal LCLKEN is always at low level (internal clock generation failure state), the external clock signal EXCLK is always input.

During a period (1) of maintaining the trigger signal TRIGGER to low level, the control portion 11 is changed into a state of waiting for edge input of the trigger signal TRIGGER. At this time, the control signal NVCTL maintains at logic level used for setting the control object circuit 20 into wait state (WAIT). Moreover, the internal clock generating portion 12 is changed into the state of waiting for the edge input of the trigger signal TRIGGER. At this time, the internal clock signal LCLK maintains at low level.

During a period (2) of maintaining the scanning path enable signal SCEN to high level, the control portion 11 and the external clock signal EXCLK are synchronous to process testing action using scanning path (input and output of scanning input signal SCIN and the scanning output signal SCOUT). At this time, the control signal NVCTL maintains at logic level used for setting the control object circuit 20 into wait state (WAIT). That is to say, the control portion 11 has an action mode (testing mode) of outputting control signal NVCTL with fixed value to the control object circuit 20 unrelated to the internal state thereof. Through this structure, the control object circuit 20 will not process actions but the assumed in testing action. Furthermore, under a condition that the trigger signal TRIGGER is increased to high level in the testing action, the internal clock generating portion 12 starts generating internal clock signal LCLK. However, the internal clock generating portion 12 will also not process action but the assumed in the testing action using the scanning path.

After completing the testing action, during a period (3) of maintaining the scanning path enable signal SCEN to low level, the control portion 11 is changed into a state of waiting for the edge input of the trigger signal TRIGGER. At this time, the control signal NVCTL maintains at the logic level used for setting the control object circuit 20 into wait state (WAIT). Furthermore, the internal clock generating portion 12 is changed into a state of waiting for the edge input of the trigger signal TRIGGER. Meanwhile, the internal clock signal LCLK maintains at low level.

As mentioned above, the control circuit 10 of this structure example is provided with a testing mode synchronous to the external clock signal EXCLK. Through this structure, the testing of the control circuit 10 can be processed under the control of being synchronous to the external clock signal EXCLK, so that the internal clock generating portion 12 can be imported without reducing the testability of the control circuit 10.

<Internal Clock Generating portion>

Figure 50:
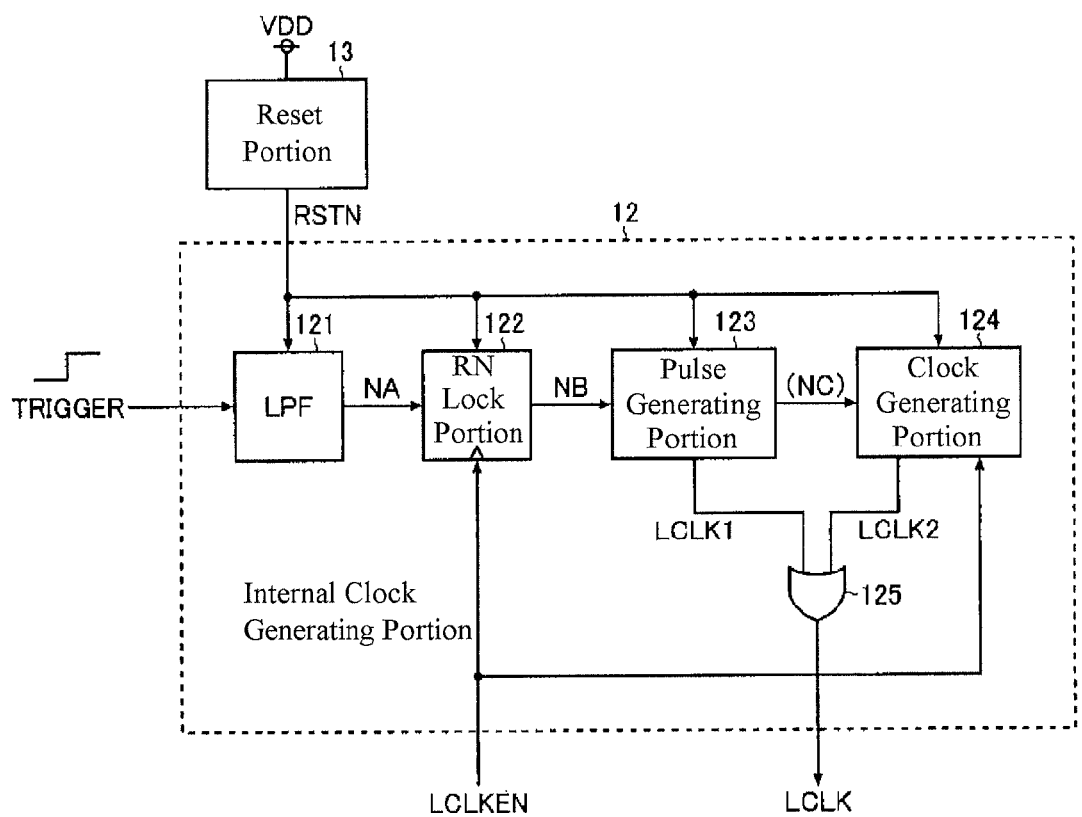
FIG. 50 represents a block diagram showing one structure example of the internal clock generating portion 12.

FIG. 50 is a block diagram showing a structure example of the internal clock generating portion 12. The internal clock generating portion 12 of this structure example includes a filter 121, a lock portion 122, a pulse generating portion 123, a clock generating portion 124 and an OR operator 125.

A low-pass filter 121 removes the high frequency component (noise component) overlapped with the trigger signal TRIGGER to generate factor signal NA. Wrong action caused by noise component can be reduced according to the structure including such low-pass filter 121. Furthermore, the low-pass filter 121 has a function of initializing its action state according to the internal reset signal RSTN.

The lock portion 122 enables the factor signal NA to pass through directly as the factor signal NB when the internal clock generating enable signal LCLKEN is at low level (internal clock generating failure state); on the other side, when the internal clock generating enable signal LCLKEN is at high level (internal clock generating valid state), the factor signal NA at the time point when the internal clock generating enable signal LCLKEN reaches the rising edge is locked and output as the factor signal NB. That is to say, the lock portion 122 is used as the signal transmission control circuit for processing transmission control of the trigger signal TRIGGER in the internal clock generating portion 12. According to the structure including such signal transmission control circuit, the clock generating action will not cause abnormity even when reaching the pulse edge of the trigger signal TRIGGER in the generating action of the internal clock signal LCLK. Further, the lock portion 122 has a function of initializing its action state according to the internal reset signal RSTN. Moreover, examples of using the lock portion 122 as the signal transmission control circuit is given in this structure example, yet the structure of the present invention is not limited to this; the lock portion 122 can be replaced by an OR operator which generates the factor signal NB through the OR operation of the factor signal NA and the internal clock generating enable signal LCLKEN.

Every time the factor signal NB reaches the pulse edge, a pulse generating portion 123 generates a one-shot pulse of the first internal clock signal LCLK1. Besides, the pulse generating portion 123 outputs factor signal NC obtained by giving the factor signal NB given delay to the clock generating portion 124 according to the circuit structure of the clock generating portion 124. Also, the pulse generating portion 123 has a function of initializing its action state according to the internal reset signal RSTN.

The clock generating portion 124 receives the input of the internal clock generating enable signal LCLKEN (or factor signal NC) to generate the second internal clock signal LCLK2. Also, the clock generating portion 124 has a function of initializing its action state according to the internal reset signal RSTN.

An OR operator 125 processes the OR operation of the internal clock signal LCLK1 and the second internal clock signal LCLK2 to generate the internal clock signal LCLK.

Figure 51:
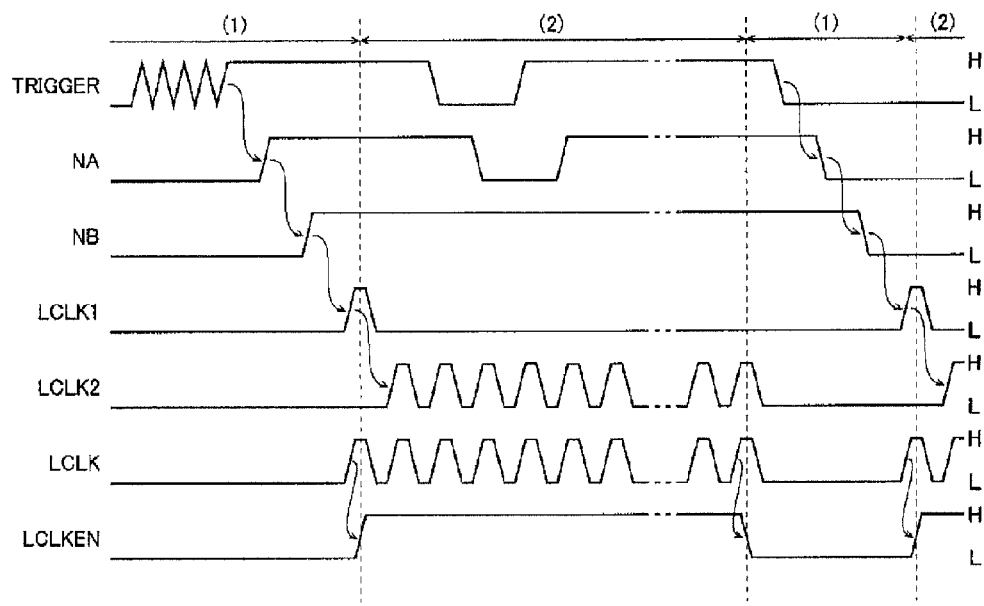
FIG. 51 represents a time diagram showing an example of the internal clock generating action.

FIG. 51 is a sequence diagram showing an example of the internal clock generating action, the trigger signal TRIGGER, the factor signals NA and NB, the first internal clock signal LCLK1, the second internal clock signal LCLK2, the internal clock signal LCLK and the internal clock generating enable signal LCLKEN are orderly described from top to bottom. Besides, sign (1) shown in the figure represents that the internal clock generating portion 12 is in a state of waiting for the edge of the trigger signal TRIGGER; sign (2) represents that the internal clock generating portion 12 is in a generating action state of the internal clock signal LCLK.

Firstly, the noise component included in the trigger signal TRIGGER is removed by using the low-pass filter 121. The rising edge of the trigger signal TRIGGER is transmitted to the lock portion 122 as the rising edge of the factor signal NA and further to the pulse generating portion 123 as the rising edge of the factor signal NB. Besides, the pulse generating portion 123 generates the one-shot pulse of the first internal clock signal LCLK1 according to the rising edge of the factor signal NB. Thus, the internal clock signal LCLK is improved to the first-shot pulse; the internal clock generating enable signal LCLKEN is set to be high level through the control portion 11. In this way, the lock portion 122 is changed into a state of using the factor signal NA at the time point when the internal clock generating enable signal LCLKEN reaches the rising edge as the factor signal NB; then, the pulse edge of the trigger signal TRIGGER is ignored till the generating action of the internal clock signal LCLK is completed.

In addition, in the clock generating portion 124, the second internal clock signal LCLK2 (further as the internal clock signal LCLK) is continually generated during a period of setting the internal clock generating enable signal LCLKEN to high level. Then, the control portion 11 sets the internal clock generating enable signal LCLKEN to low level at the time point of receiving the final pulse required by the predetermined processing. Thus, the internal clock signal LCLK is generated in the subsequent condition of appearing the falling edge of the trigger signal TRIGGER by performing an action as same as the action.

Figure 52:
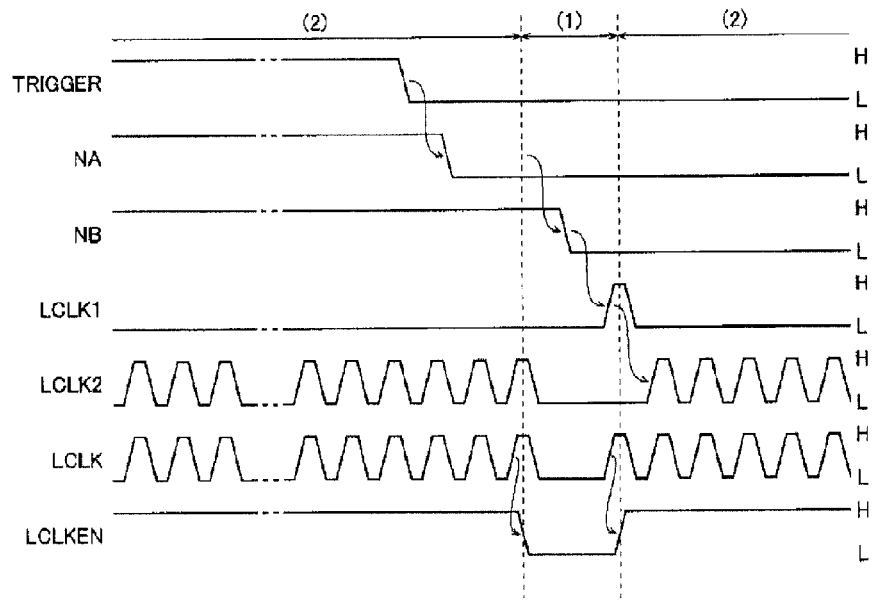
FIG. 52 represents a time diagram showing another example of the internal clock generating action.

Furthermore, as shown in FIG. 52, in the generating action of the internal clock signal LCLK corresponding to the rising edge of the trigger signal TRIGGER (that is, the high level period of the internal clock generating enable signal LCLKEN), under a condition that the trigger signal TRIGGER reaches the falling edge and then the trigger signal TRIGGER (further as the factor signal NA) maintains at low level, the falling edge is generated in the factor signal NB fundamentally without delay at the time point when the generating action of the internal clock signal LCLK is completed and the internal clock generating enable signal LCLKEN falls to low level. Hence, after the generating action of the internal clock signal LCLK corresponding to the rising edge of the trigger signal TRIGGER is completed, the generating action of the internal clock signal LCLK corresponding to the falling edge of the trigger signal TRIGGER is processed essentially without idle period.

<Low-Pass Filter>

Figure 53A:
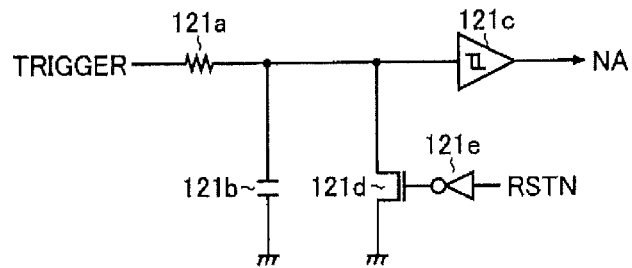
FIG. 53A represents a circuit diagram showing the first structure example of low path filter 121.

FIG. 53A is a circuit diagram showing the first structure example of the low-pass filter 121. The low-pass filter 121 of this structure example is a passive low-pass filter including a resistor 121a, a capacitor 121b, a Schmitt trigger 121c, an N-channel field effect transistor 121d and an inverter 121e. Besides, when the internal reset signal RSTN is at low level, the transistor 121d turns to be switched on, thus the capacitor 121b is discharged, and the action state of the low-pass filter 121 is initialized.

Figure 53B:
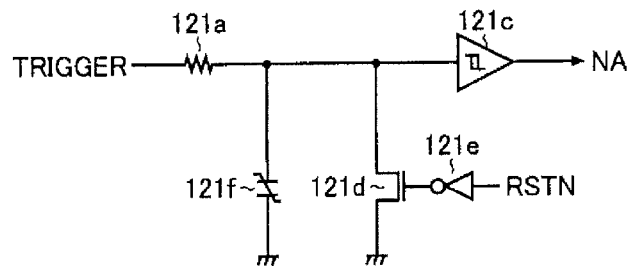
FIG. 53B represents a circuit diagram showing the second structure example of low path filter 121.

FIG. 53B is a circuit diagram showing the second structure example of the low-pass filter 121. The structure of the low-pass filter 121 of this structure example is substantially the same as that of the first structure example, including a ferroelectric capacitor 121f with large capacitance of each unit area to replace the capacitor 121b. The capacitor occupied area in the low-pass filter 121 can be reduced through this structure.

Figure 54A:
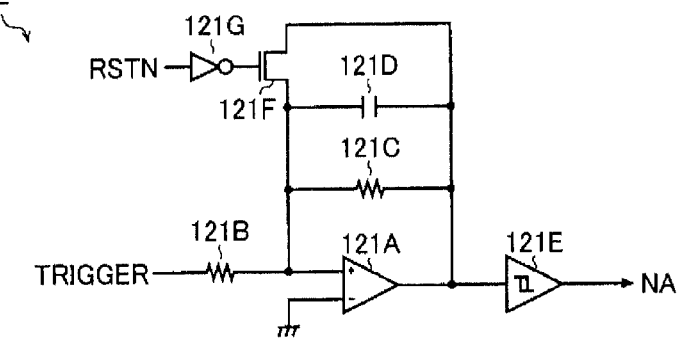
FIG. 54A represents a circuit diagram showing the third structure example of low path filter 121.

FIG. 54A is a circuit diagram showing the third structure example of the low-pass filter 121. The low-pass filter 121 of this structure example is an active low-pass filter including an operational amplifier 121A, resistors 121B and 121C, a capacitor 121D, a Schmitt trigger 121E, an N-channel field effect transistor 121F and an inverter 121G.

Figure 54B:
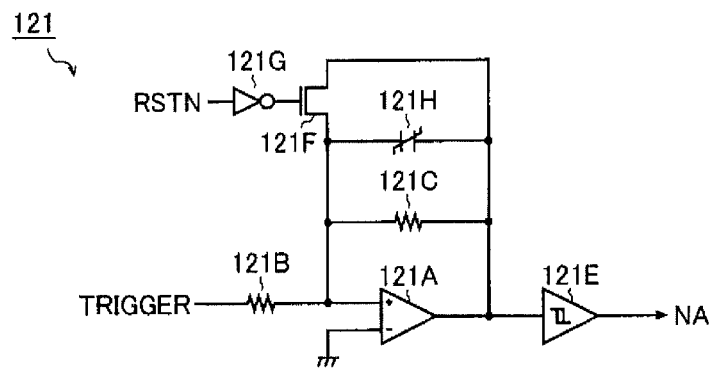
FIG. 54B represents a circuit diagram showing the fourth structure example of low path filter 121.

FIG. 54B is a circuit diagram showing the fourth structure example of the low-pass filter 121. The structure of the low-pass filter 121 of this structure example is substantially the same as that of the third structure example, including a ferroelectric capacitor 121H with large capacitance of each unit area to replace the capacitor 121D. The capacitor occupied area in the low-pass filter 121 can be reduced through such structure.

<Pulse Generating Portion>

Figure 55:
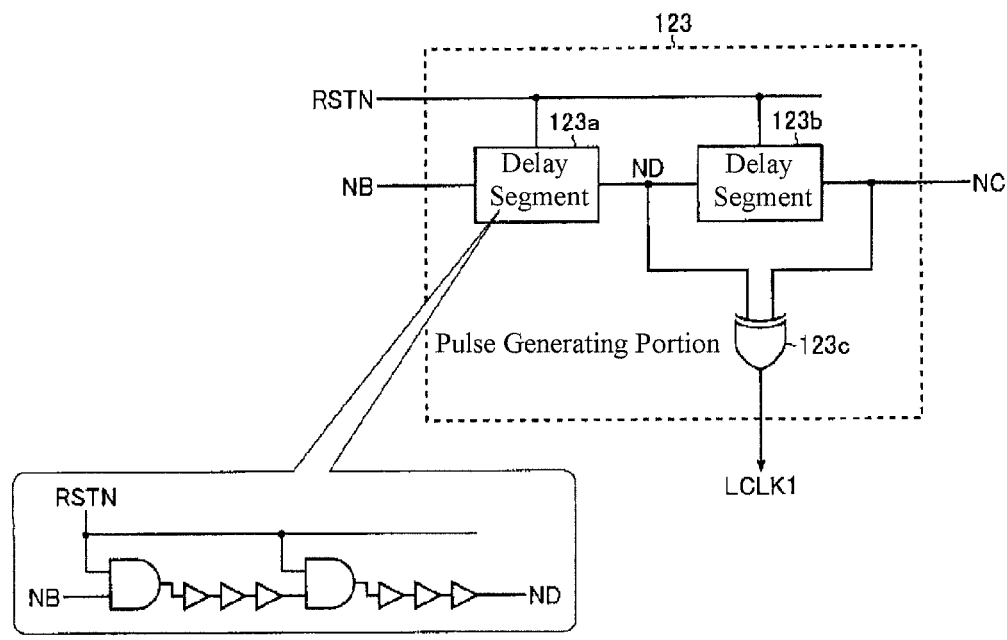
FIG. 55 represents a block diagram showing one structure example of the pulse generating portion.

FIG. 55 is a block diagram showing a structure example of the pulse generating portion 123. The pulse generating portion 123 of this structure example includes delay segments 123a and 123b and an exclusive-OR operator 123c. The delay segment 123a gives the factor signal NB the given delay to generate the factor signal ND. The delay segment 123b gives the factor signal ND the given delay to generate the factor signal NC. The exclusive-OR operator 123c processes the exclusive-OR operation of the factor signal ND and the factor signal NC to generate the first internal clock signal LCLK1.

Figure 56:
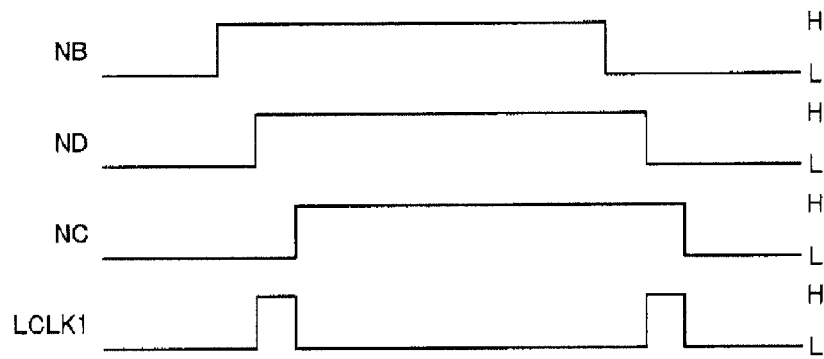
FIG. 56 represents a sequence diagram showing an example of the pulse generating action.

If the pulse edge of the factor signal NB is constantly transmitted through the delay segments 123a and 123b, the logic level of the factor signal ND and the factor signal NC temporarily becomes different; pulse (referring to FIG. 56) is generated in the first internal clock signal LCLK1. That is to say, if the pulse edge of the factor NB (further trigger signal TRIGGER) is transmitted to the pulse generating portion 123, the first internal clock signal LCLK1 will generate the one-shot pulse. Thus, if it is constituted to generate the first internal clock signal LCLK1 by using the transmission delay of the pulse edge appearing in the factor signal NB (further trigger signal TRIGGER), other system clock signals are no longer unnecessary to start the generating action of the internal clock signal CLK.

In addition, the pulse width (frequency) of the first internal clock signal LCLK1 can be properly adjusted according to the connecting segments (delay time) of the buffer forming the delay segments 123a and 123b. Besides, an AND operator for AND operation of the buffer output signal and the internal reset signal RSTN can be properly inserted in the delay segments 123a and 123b. In accordance with such structure, the action state of the pulse generating portion 123 can be initialized by setting the internal reset signal RSTN to low level.

<Clock Generating Portion>

Figure 57:
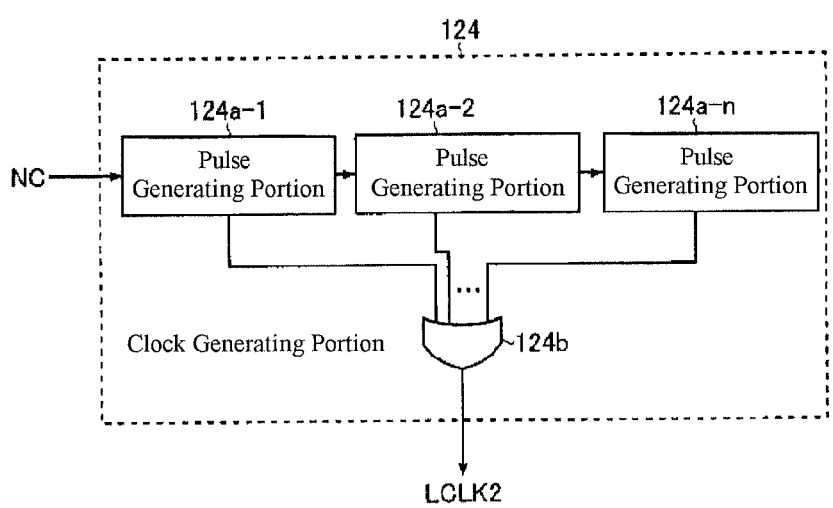
FIG. 57 represents a block diagram showing the first structure example of the clock generating portion 124.

FIG. 57 is a block diagram showing the first structure example of the clock generating portion 124. The clock generating portion 124 of this structure example includes n pulse generating portions 124a-1-124a-n and an OR operator 124b. Besides, n pulse generating portions 124a-1-124a-n are constituted to be the same as the previous pulse generating portion 123. Thus, when the second internal clock signal CLK2 is generated, the second internal clock signal LCLK2 of required pulse can be easily generated if using multi-segment connecting structure (n pulse generating portions 124a-1-124a-n here) of the logic element. Furthermore, the pulses n of the second internal clock signal LCLK2 are determined according to the connecting segments n of the pulse generating portions 124a-1-124a-n. Hence, the pulse generating portion 124 of this structure example is valid if the pulses of the internal clock signal LCLK required by the control portion to perform action. Moreover, as mentioned above, the pulse width (frequency) of the second internal clock signal LCLK2 can be properly adjusted according to the connecting segments (delay time) of the buffer forming the delay segments.

Figure 58:
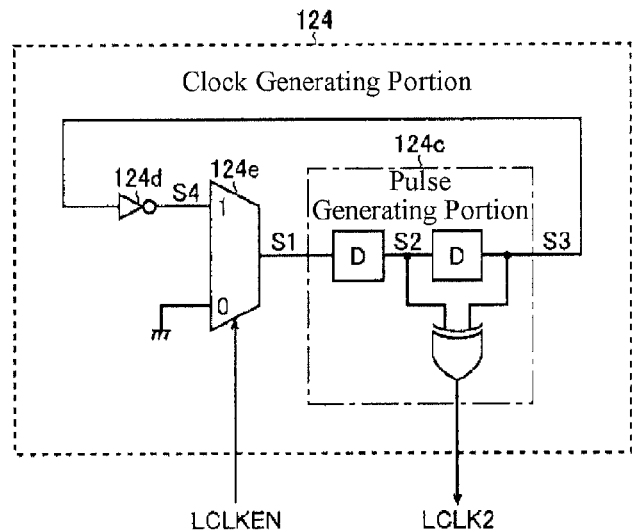
FIG. 58 represents a block diagram showing the second structure example of the clock generating portion 124.
Figure 59:
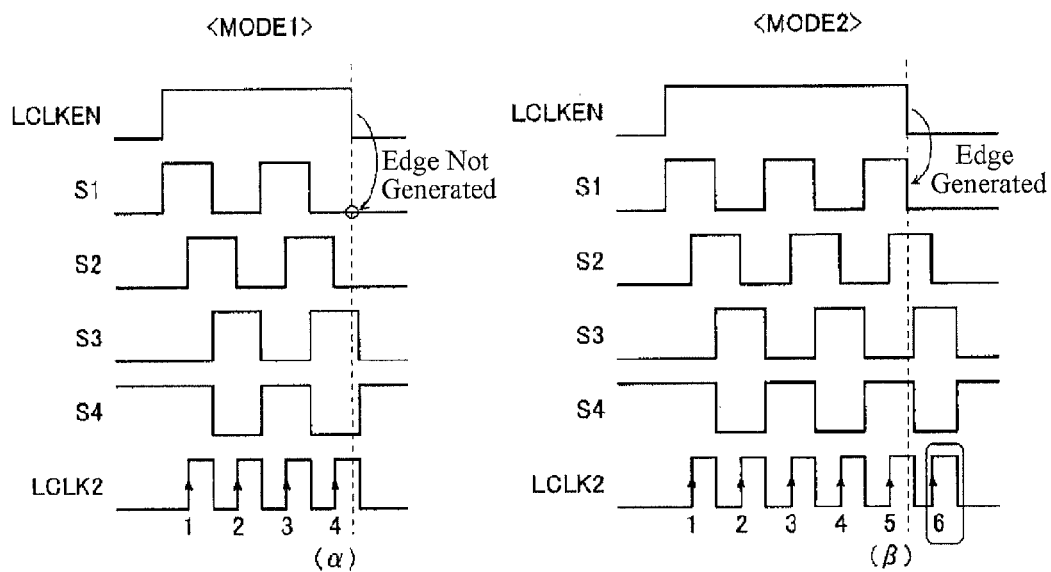
FIG. 59 represents a sequence diagram showing the clock generating action of the second structure example.

FIG. 58 is a block diagram showing the second structure example of the clock generating portion 124. The clock generating portion 124 of this structure example includes a pulse generating portion 124c, an inverter 124d and a selector 124e. The structure of the pulse generating portion 124c is the same as that of the previous pulse generating portion 123. That is to say, when the logic level of the factor signal S2 delaying the factor signal S1 input by the selector 124e is inconsistent with the logic level of the factor signal S3 delaying the factor signal S2, the pulse generating portion 124c enables the second internal clock signal LCLK2 to generate pulse (referring to FIG. 59). The inverter 124d generates the factor signal S4 to logically reverse the factor signal S3. The selector 124e loops the factor signal S4 as the factor signal S1 when the internal clock generating enable signal LCLKEN is at high level, and fixes the factor signal S1 at low level when the internal clock generating enable signal LCLKEN is at low level. Thus, when the second internal clock signal CLK2 is generated, it can be constituted by small-scale circuit to generate the required second internal clock signal LCLK2 if the loop structure of the logic element is used.

Also, the pulse width (frequency) of the second internal clock signal LCLK2 can be properly adjusted according to the connecting segments (delay time) of the buffer forming the delay segment of the pulse generating portion 124c. Besides, the pulses of the second internal clock signal LCLK2 is determined according to the high level period of the internal clock generating enable signal LCLKEN.

The generating pulses of the second internal clock signal LCLK2 will be illustrated in detail below. Even-shot (α shot) pulses generated in the second internal clock signal LCLK2 are taken as the shot event, under a condition that the internal clock generating enable signal LCLKEN falls (referring to <MODE1> in FIG. 59), the factor signal S1 (=factor signal S4) is changed into original low level at the time point (the time point when the internal clock generating enable signal LCLKEN reaches the falling edge) when the selector 124e switches off the loop). Therefore, even the selector 124e fixes the factor signal S1 at low level, the factor signal S1 will not generate pulse edge; the second internal clock signal LCLK2 will not generate additional pulse, thus the final generated pulse becomes even-shot (a shot).

On the other hand, odd-shot (β shot) pulses generated in the second internal clock signal LCLK2 are taken as the shot event, under a condition that the internal clock generating enable signal LCLKEN falls (referring to <MODE2> in FIG. 59), the factor signal S1 (=factor signal S4) is changed into high level at the time point when the selector 124e switches off the loop. Therefore, while the selector 124e fixes the factor signal S1 at low level, the pulse edge (falling edge) is generated in the factor signal S1, one-shot sized additional pulses are generated in the second internal clock signal LCLK2, thus the final generated pulse becomes even-shot ((β+1) shot).

In other words, the clock generating portion 124 of this structure example can be applied when the required pulse of the second internal clock signal LCLK2 is even-shot or it is possible to input additional pulse to the control portion 11.

Figure 60:
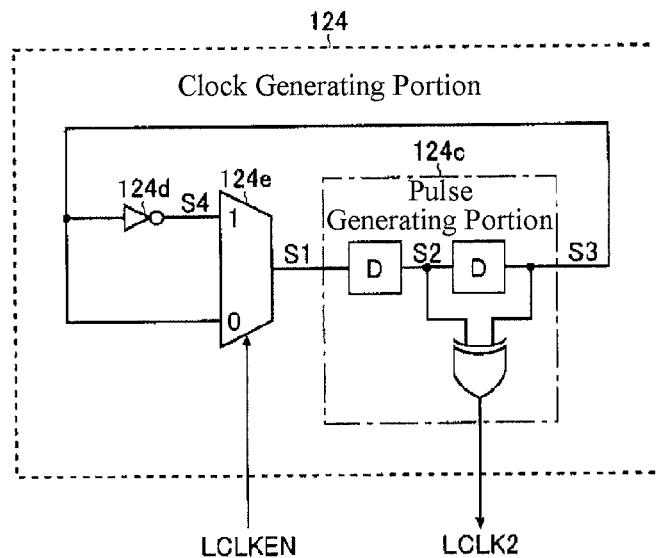
FIG. 60 represents a block diagram showing the third structure example of the clock generating portion 124.

FIG. 60 is a block diagram showing the third structure example of the clock generating portion 124. The structure of the clock generating portion 124 of this structure example is substantially the same as that of the second structure example, what is changed is, the selector 124e does not fix the factor signal S1 at low level but loops the factor signal S3 as the factor signal S1 when the internal clock generating enable signal LCLKEN is at low level. In the clock generating portion 124 of the third structure example, the pulses of the second internal clock signal LCLK2 is determined according to the high level period of the internal clock generating enable signal LCLKEN, yet the behavior is different from that of the second structure example.

Figure 61:
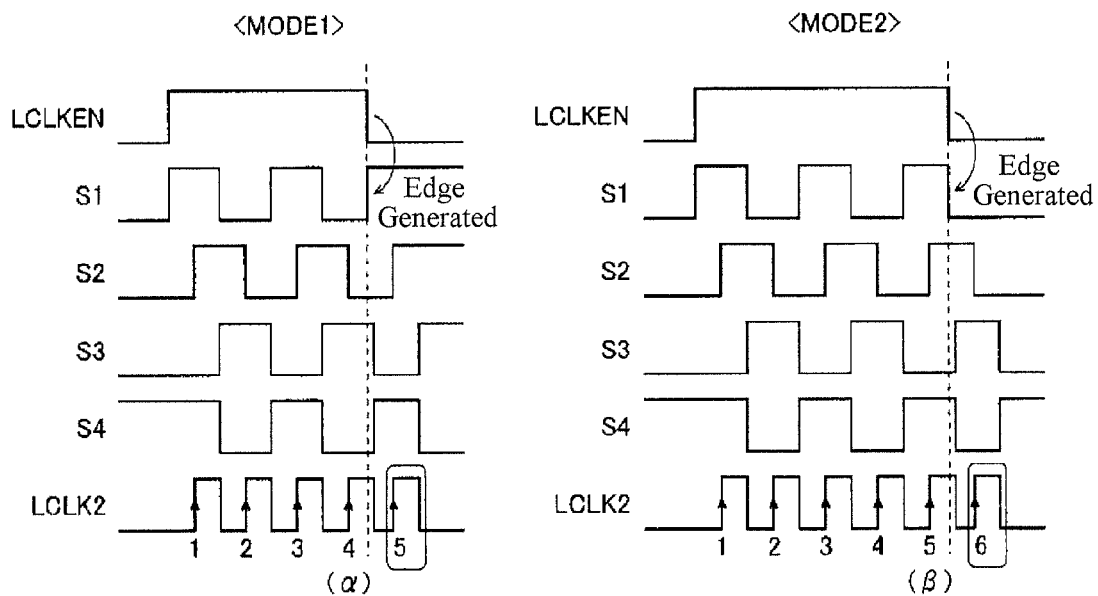
FIG. 61 is a sequence diagram showing the clock generating action of the third structure example.

The generated pulses of the second internal clock signal LCLK2 will be described in detail below. Even-shot (α shot) pulses generated in the second internal clock signal LCLK2 are taken as the shot event, under a condition that the internal clock generating enable signal LCLKEN falls (referring to <MODE1> in FIG. 61), the state of looping the factor signal S4 of low level as the factor signal S1 is switched to the state of looping the factor signal S3 of high level as the factor signal S1. Therefore, the pulse edge (rising edge) is generated in the factor signal S1, one-shot sized additional pulses are generated in the second internal clock signal LCLK2, thus the final generated pulse becomes odd-shot ((α+1) shot).

On the other hand, odd-shot (β shot) pulses generated in the second internal clock signal LCLK2 are taken as the shot event, under a condition that the internal clock generating enable signal LCLKEN falls (referring to <MODE2> in FIG. 61), the state of looping the factor signal S4 of high level as the factor signal S1 is switched to the state of looping the factor signal S3 of low level as the factor signal S1. Therefore, the pulse edge (falling edge) is generated in the factor signal S1, one-shot sized additional pulses are generated in the second internal clock signal LCLK2, thus the final generated pulse becomes even-shot ((β+1) shot).

That is to say, in accordance with the clock generating portion 124 of this structure example, it is possible to be applied no matter the number of the required pulses of the second internal clock signal LCLK2 is even number or odd number.

<POLH Circuit>

Then, the power on low hold circuit (be referred to as POLH [Power On Low Hold] circuit) is illustrated in detail, which is suitable for being used as (for example) the power on reset circuit (the reset portion 13 and so on) generating the reset signal used for initializing the electronic circuit when the supply is cut off.

In the power on reset circuit, during a period after the supply voltage VDD reaches the operable voltage (value determined by the threshold of the MOS transistor, e.g. 0.4-0.7 V) of the CMOS circuit till the initializing of the CMOS circuit is completed, the reset signal is required to be maintained at low level, while before the supply voltage VDD reaches the actual action voltage, the reset signal is required to be switched to high level. Therefore, in the previous power on reset circuit, it is constituted that the supply voltage VDD and the given reference voltage Vref are compared to switch the logic level of the reset signal. However, in the previous power on reset circuit, in order to compare the supply voltage VDD and the reference voltage Vref, the requirement of a comparator has trouble of large circuit area and power consumption.

In the exploration of the solution of the trouble, for the purpose of realizing the required characteristic of the power on reset circuit and not comparing the supply voltage VDD and the reference voltage Vref necessarily, after aggressive research, the inventor of this application and others creates the following POLH circuit.

FIG. 62 is a circuit diagram showing a structure example of the POLH circuit. The POLH circuit 30 of this structure example includes an inverter 31, P-channel field effect transistors 32 and 33, an N-channel field effect transistor 34, a capacitor 35 and a buffer 36.

The input end of the inverter 31 is connected to the input end of the input signal IN. The output end of the inverter 31 is connected to the gates of the transistors 32 and 34. The source of the transistor 32 is connected to the applying end of the supply voltage VDD. The drain of the transistor 32 is connected to the source and the gate of the transistor 33. The drains of the transistors 33 and 34 are connected to the output end of the output signal OUT through the buffer 36. The source of the transistor 34 is connected to the ground end. The capacitor 35 is connected between the input end and the ground end of the buffer 36.

In other words, the POLH circuit 30 of this structure example can be described as being structured by inserting the transistor 33 connected via the diode between the transistor 32 and the transistor 34 forming the buffer segment. Moreover, the transistor 33 can be replaced by the diode.

FIG. 63 is a diagram used for illustrating the first application example of the POLH circuit 30. In the first application example, the supply voltage VDD is input as the input signal IN, the reset signal RSTN is output as the output signal OUT. The node voltage net1 applied to the input end of the buffer 36 becomes the voltage lower than the supply voltage VDD by the forward decreasing voltage VF of the transistor 33. Therefore, when the supply voltage VDD increases, after the supply voltage VDD reaches the operable voltage of the CMOS circuit, the buffer 36 will generate a period of continually outputting low level, thus the low level output period can be used as reset signal RSTN to realize the required characteristic of the power on reset circuit without using the comparator.

Also, during the low level output period, the input end of the buffer 36 is changed into high impedance state, yet in the POLH circuit 30 of this structure example, the capacitor 35 is arranged between the input end and the ground end of the buffer 36, thus the influence caused by external noise can be reduced to maintain the reset signal RSTN at low level. Furthermore, during the low level output period, proper adjustment can be processed according to the segments of the diode connection-type transistor 33 or the capacitance of the capacitor 35.

Moreover, the POLH circuit 30 of the structure example performs action as the normal buffer after the low level output period, thus except inputting the supply voltage VDD as the input signal IN, various application examples can be considered.

FIG. 64 is a diagram used for illustrating the second application example of the POLH circuit 30. In the second application example, the first reset signal RSTN1 generated by the electronic circuit is input as the input signal IN, the second reset signal RSTN2 is output as the output signal OUT. That is to say, it is considered as being structured by inserting the POLH circuit 30 on the signal transmission path of the first reset signal RSTN1. Through such structure, when the supply voltage VDD increases, the second reset signal RSTN2 is maintained at low level in the period of passing through the given low level output period independent of the logic level of the first reset signal RSTN1; on the other hand, after the low level output period, the first reset signal RSTN1 is directly output as the second reset signal RSTN2 to realize any reset action of the electronic circuit.

Figure 65:
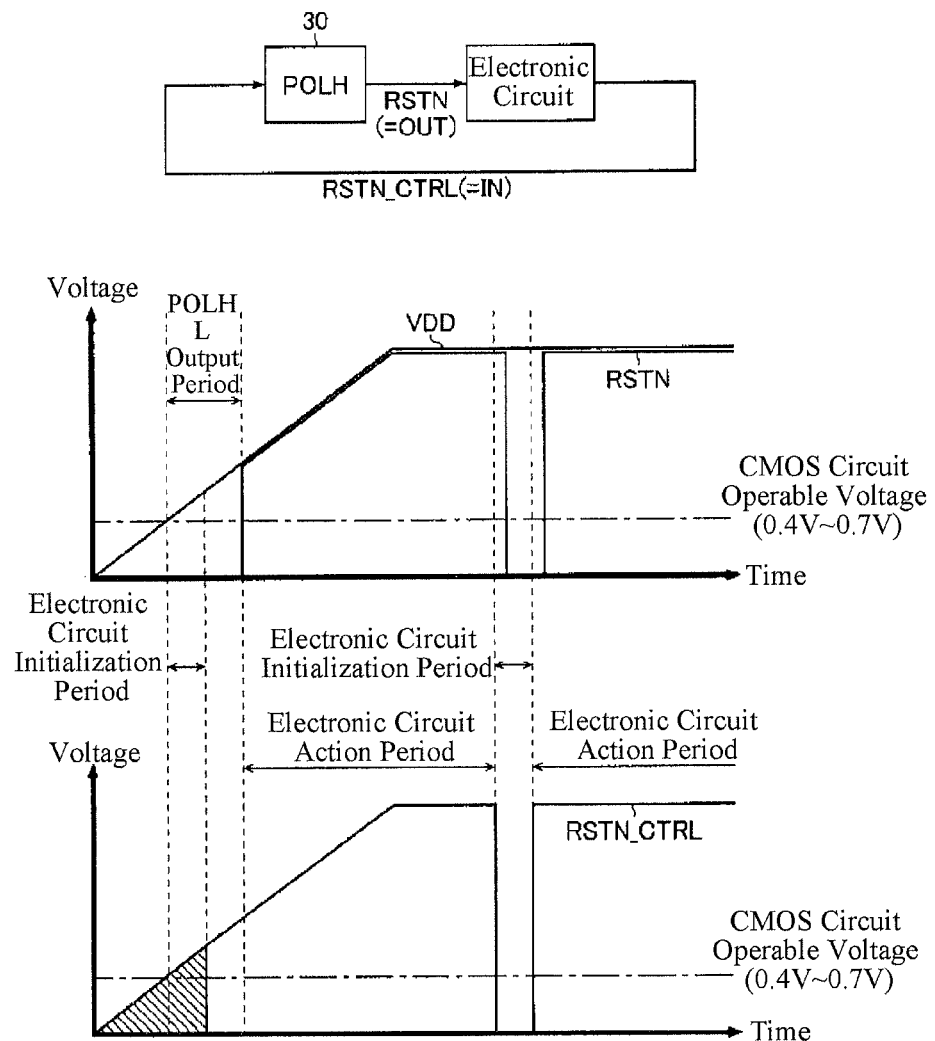
FIG. 65 is a diagram showing the third application example of the POLH circuit 30.

FIG. 65 is a diagram used for illustrating the third application example of the POLH circuit 30. In the third application example, the reset control signal RSTN_CTRL generated by the electronic circuit is input as the input signal IN; the reset signal RSTN used for initializing the electronic circuit is output as the output signal OUT. When the supply voltage VDD increases, during a period that starts from the supply voltage VDD reaching the operable voltage of the electronic circuit and ends with completing initializing of the electronic circuit, the electronic circuit is changed into an action unstable state, the reset control signal RSTN_CTRL is also changed into an unstable state (referring to the shadow part shown in the diagram). Then, if the initializing of the electronic circuit is ended by using the reset signal RSTN (low level) output by the POLH circuit 30, the reset control signal RSTN_CTRL is set to be initial value (high level). As mentioned above, the POLH circuit 30 performs action as the buffer after the low level output period, thus the reset control signal RSTN_CTRL directly reflects the reset signal RSTN. Therefore, (for example) after completing the processing of the electronic circuit, the electronic circuit decreases the reset signal RSTN to low level for initializing thereof by decreasing the reset control signal RSTN_CTRL to low level.

Figure 66:
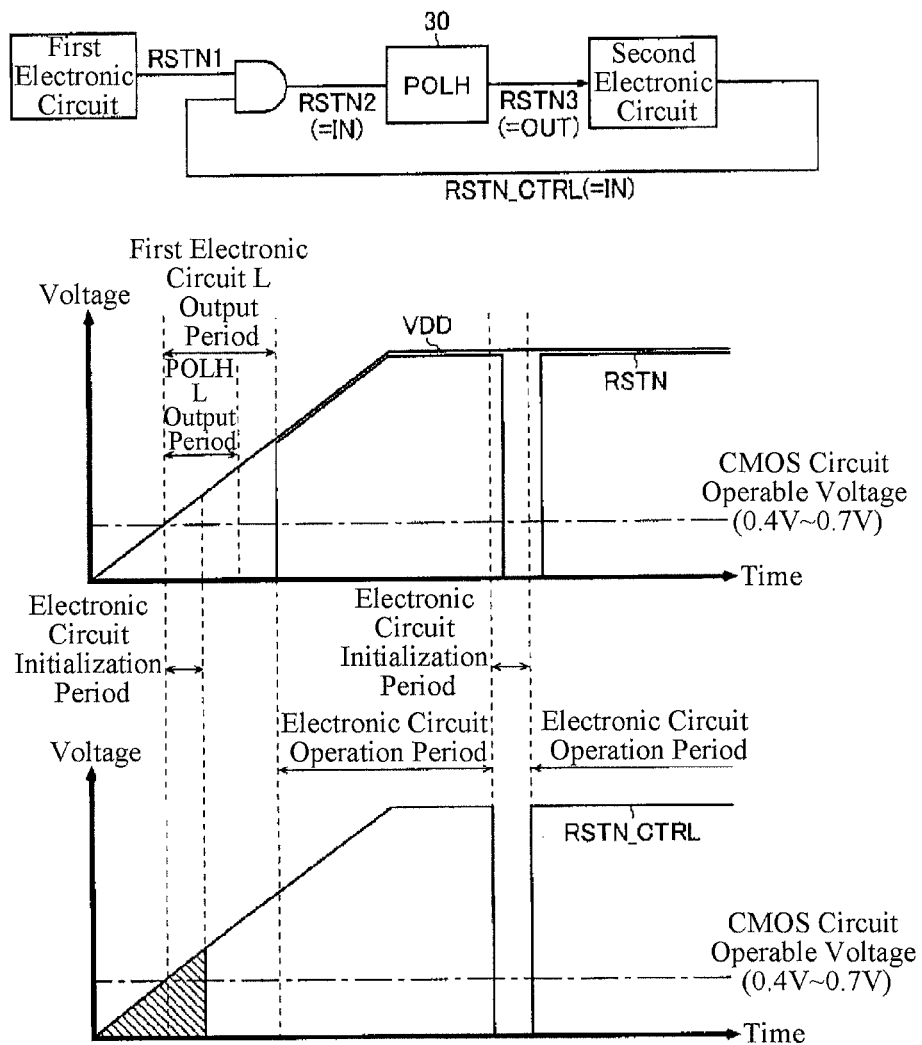
FIG. 66 is a diagram showing the fourth application example of the POLH circuit 30.

FIG. 66 is a diagram used for illustrating the fourth application example of the POLH circuit 30. In the fourth application example, the first reset signal RSTN1 generated by the first electronic circuit and the OR signal RSTN2 of the reset control signal RSTN_CTRL generated by the second electronic circuit are input as the input signal IN; the reset signal RSTN3 used for initializing the second electronic circuit is output as the output signal OUT. That is to say, the fourth application example can be considered as being structured through the second application example and the third application example. Through such structure, the reset action of the second electronic circuit can process power on reset when the supply voltage VDD increases, process any reset by using the first electronic circuit and process any reset by using the second electronic circuit.

The Eighth Embodiment

Figure 67:
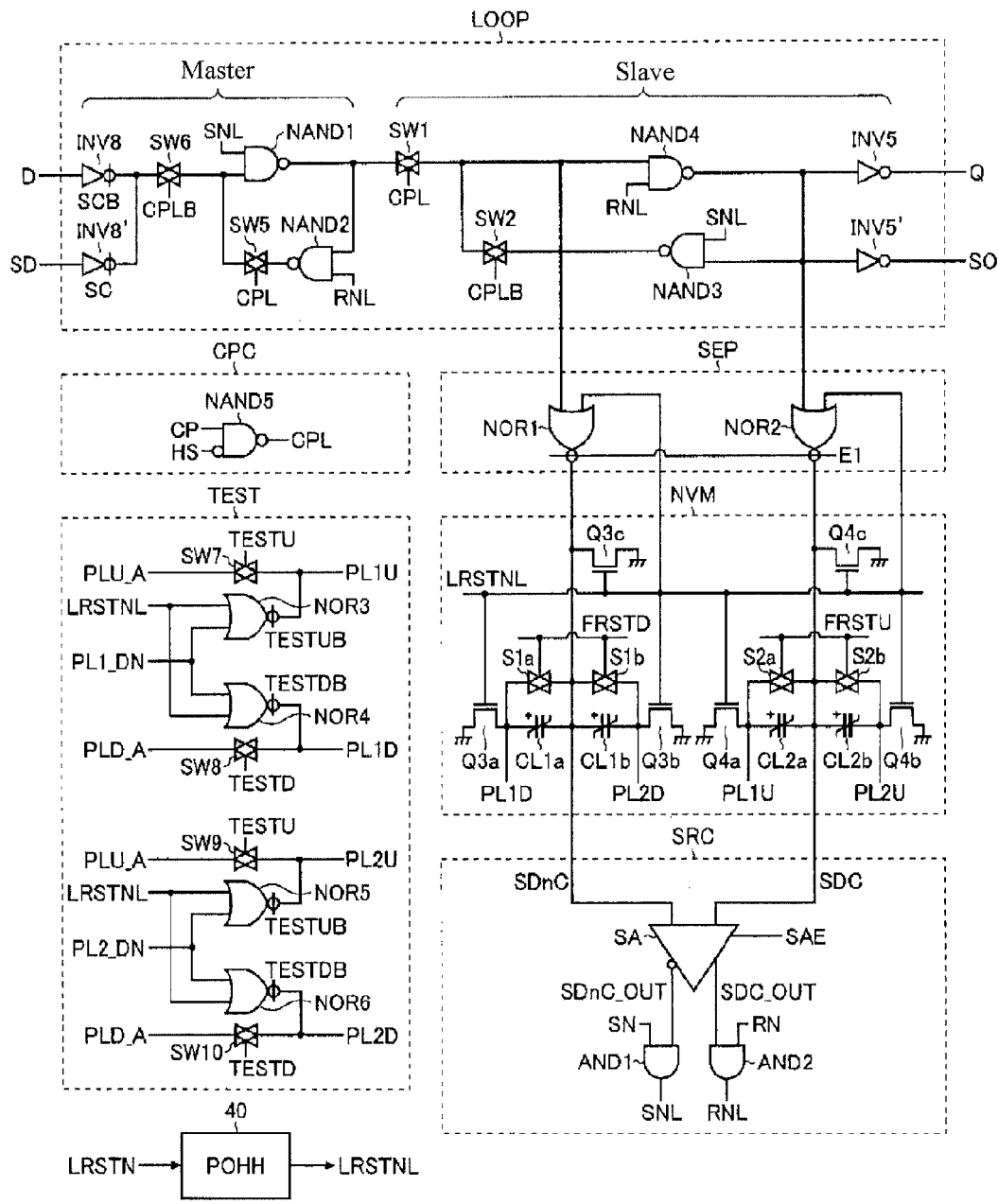
FIG. 67 is a circuit diagram showing the eighth embodiment of the data hold device of the present invention.

FIG. 67 is a circuit diagram showing the eighth embodiment of the data hold device of the present invention. Besides, the structure of the present embodiment is almost the same as that of the previous fifth embodiment, it is characterized in a power on high hold circuit 40 (it is referred as POHH [Power On High Hold] circuit 40 below.) which is used to generate protection signal LRSTNL for protecting the storage data in the non-volatile storage portion NVM, beside the modification applied on the structure of the non-volatile storage portion NVM, circuit separating portion SEP and testing circuit portion TEST.

The non-volatile storage portion NVM includes path switch S1a, S1b, S2a and S2b which are replacement of the transistor Q1a, Q1b, Q2a and Q2b. Through such modification, it is more accurate to short out the two sides of the ferroelectric element CL 1a, 1b, 2a and 2b to protect the storage data.

Moreover, the non-volatile storage portion NVM is switched on/off according to the protection signal transmitted to each gate and includes the N-channel field effect transistor Q3a, Q3b, Q3c, Q4a, Q4b and Q4c which make each of the ferroelectric element CL1a, CL1b, CL2a and CL2b and the ground end short-out when the power of the data hold device is turned on/off. By applying such modification, the protection of storage data can be further enhanced by the short-out of the two sides of the ferroelectric element CL1a, CL1b, CL2a and CL2b.

Circuit separating portion SEP includes 3-state NOR amplifier NOR1 and NOR2 which replace the 3-state inverter INV9 and INV10. The NOR amplifier NOR1 and the NOR2 output the storage data of the loop structure portion LOOP and the NOR signal of the protection signal LRSTNL. Furthermore, the NOR amplifier NOR1 and NOR2 set each output end at high-impedance state according to the control signal E1.

Testing circuit TEST includes 3-state NOR amplifier NOR3~NOR6 in replacement of the 3-state inverter IV11~INV14. NOR amplifier NOR3 and NOR4 output digital signal applied to the first digital plate line PL1_DN and NOR signal applied to the protection signal LRSTNL. NOR amplifier NOR5 and NOR6 output digital signal applied to the second digital plate line PL2_DN and NOR signal applied to the protection signal LRSTNL. And the NOR amplifier NOR3~NOR6 set each output end at high-impedance state according to the reverse analog enable signal TESTUB of the U system or the D system.

<POHH Circuit>

Figure 68:
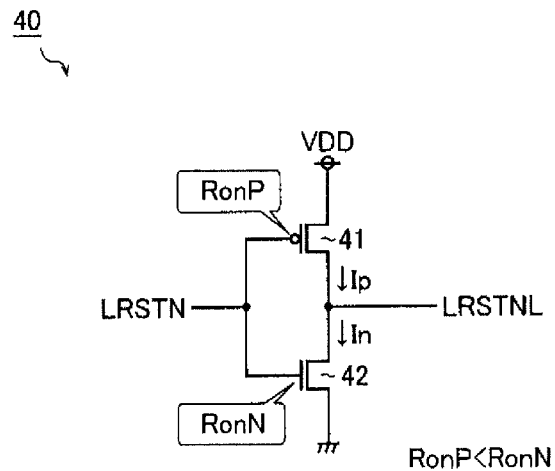
FIG. 68 is a circuit diagram showing one structure example of the POHH circuit 40.

FIG. 68 is a circuit diagram showing one structure example of the POHH circuit. The POHH circuit of the present structure example includes P-channel field effect transistor 41 and N-channel field effect transistor 42.

The source of transistor is connected to the applying end of the supply voltage. Each drain of the transistor 41 and 42 is connected to the output end of the protection signal LRSRNL. The source of transistor 42 is connected to the ground end. Each gate of the transistor 41 and 42 is connected to the input end of internal reset signal LRSTN. That is, the basic circuit structure of POHH circuit 40 is the same as the general inverter section.

In the POHH circuit 40, it is required that the protection signal LRSTNL be set at high level even the internal reset signal LRSTN is at high level (VDD) when the supply voltage VDD is asked to rise.

Therefore, the POHH of the present structure is designed in the manner of the on-resistance RonP of the transistor smaller than the on-resistance RonN of the transistor 42. In some specific example, the gate width of the transistor 41 is designed 5 times of that of the transistor 42, with the gate length of the transistor 41 the same as that of the transistor 42.

Figure 69:
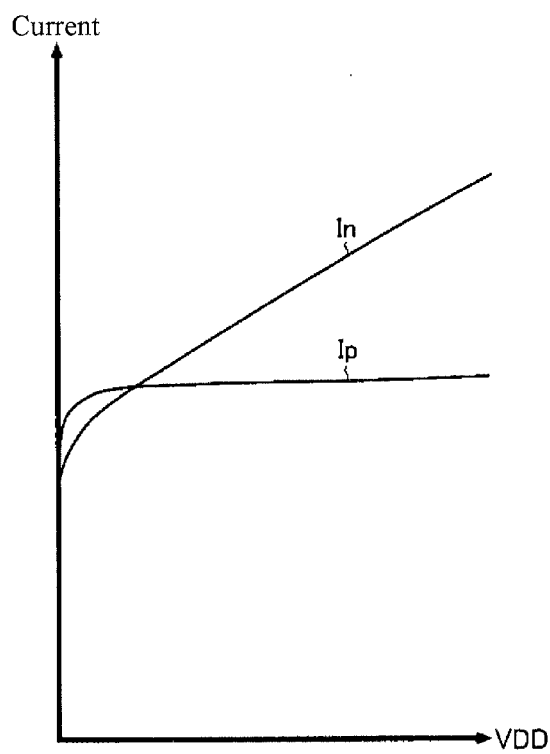
Figure 70:
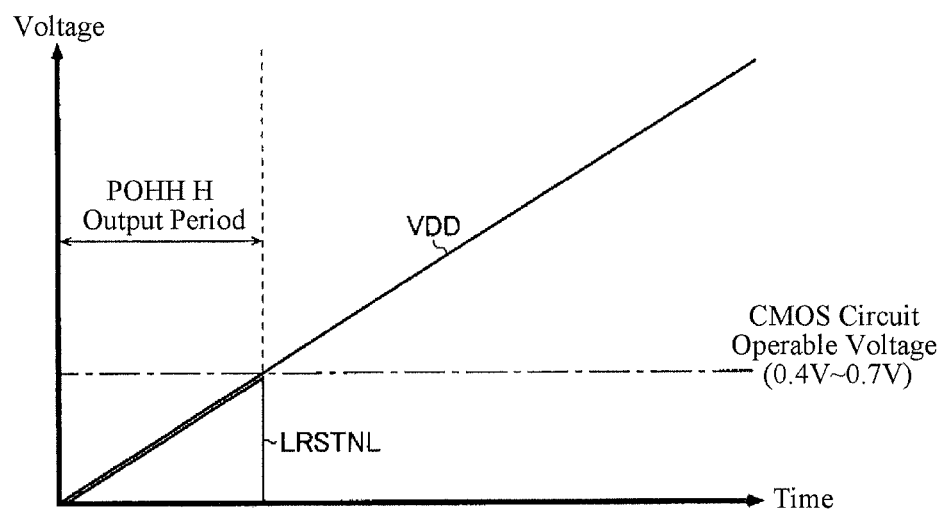
FIG. 70 is an oscillogram showing the interrelationship of the power voltage VDD and the protection signal LRSTNL.
Figure 71:
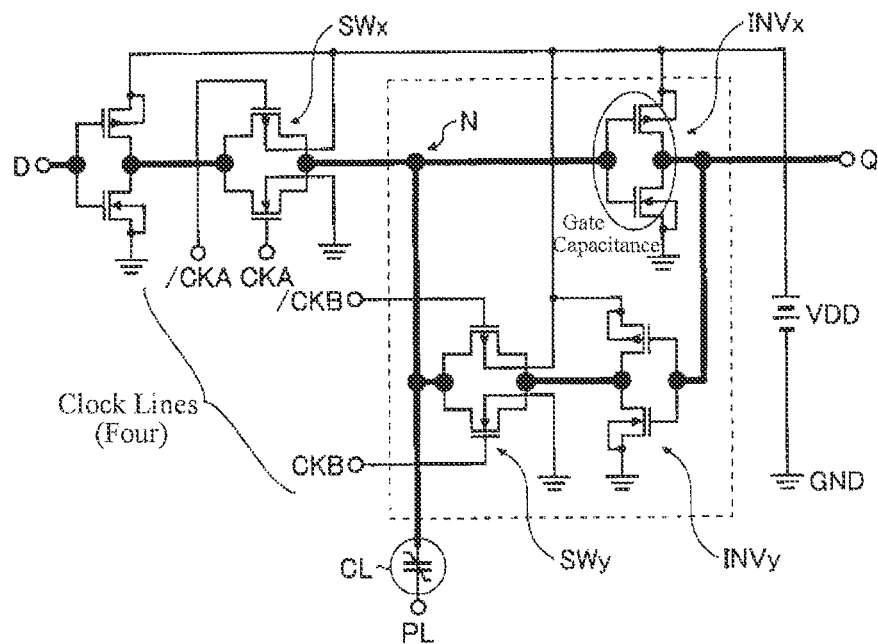
FIG. 71 is a circuit diagram showing one conventional example of the data hold device.
Figure 72:
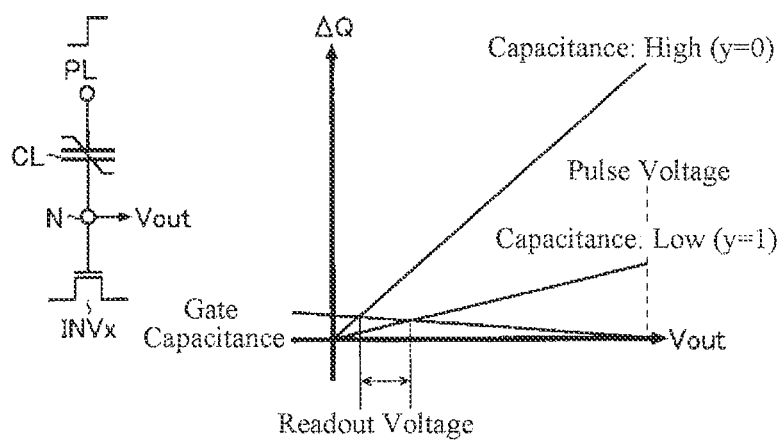
FIG. 72 is a diagram showing conventional way of data readout.

By such design, even under the state that each gate of the transistor 41 and 42 is applied with the supply voltage VDD (that is, the worst situation of power rising), with respect to the transition period when the supply voltage is rising till it reaches the established value, the current Ip in the transistor 41 is bigger than the current In in the transistor 42 (referring to FIG. 69). Thus, according to the POHH circuit 40 of the present structure, the protection signal LRSTNL can maintained at high level without dependence on the logic level of the internal reset signal LRSTN during the period when the supply voltage VDD is rising to the operable voltage for the CMOS circuit (referring to FIG. 70).

Besides, after the supply voltage VDD rising, the POHH circuit 40 can perform action as a normal inverter. Therefore, the protection action for storage data when the power is switched off can be achieved by setting the internal reset signal LRSTN at low level while setting the protection signal LRSTNL at high level.

Other Embodiments

Beside the embodiment of the structure of the present invention, different embodiments can be applied without depart the theme scope of the present invention. That is, it should be understood that all aspects of the present embodiment is an example but not a limit. The technical category of the present invention is not expressed by the embodiment but by the claims. And it should be appreciated that all embodiments equal or belong to the meaning of the claims shall belong to the present invention.

For example, in the embodiment, the inverter or the NAND operator is enumerated to illustrate the structure example of the logic gate of the loop structure portion LOOP. But the structure of the present invention is not limited to this, logic gates like NOR amplifier can be used.

Besides, in the drawings like FIG. 1, the combination of inverter INV6, INV7 and the path switch SW3 and SW4 is enumerated to illustrate the structure of the structure elements of the circuit separating portion SEP of the non-volatile storage portion NVM electrical separating. But the present invention is not limited to this, as shown in drawings like FIG. 7, 3-state inverter INV6' and INV7' (the output is set to be floating inverter) can be the structure elements of the circuit separating portion SEP.

Besides, the key point of the circuit separating portion SEP is that the ferroelectric element cannot be applied with voltage during normal action. Except for the structure of the embodiment (namely the structure of maintaining the applying voltage applied to the ferroelectric element as a fixed voltage during the normal action), the structure for maintaining at least one of the electrodes of the ferroelectric element for applying voltage at a floating state shall be considered. Such means that when the transistor Q1a, Q1b, Q2a and Q2b are switched off during normal action, the first plate line PL1 and the second plate line PL2 are set at floating state shall be specific examples considered in FIG. 1. Moreover, if the circuit structure itself is to be changed, a preferred new transistor shall be structured between the draw out ends of the ferroelectric element and the node voltage V1 (V2) or between the ferroelectric element and the plate line PL1 (PL2), and the circuit's on/off is controlled.

Besides, performing normal action or data readout action, when the applying voltage applied to the ferroelectric element is maintained fixed, can be done by the connection of the transistors of both side of the ferroelectric element with the voltage applied to the plate line does not have to be set at low level.

Besides, in the drawings like FIG. 1, the structure of the voltage level that the second supply voltage VDD2 applied to the non-volatile storage portion NVM is higher than the first supply voltage VDD1 applied to the loop structure portion LOOP is enumerated to illustrate. But the structure of the present invention is not limited to this, the structure of the voltage level that the second supply voltage VDD2 is lower than the first voltage VDD1 is further considered.

As described above, in the non-volatile logic techniques, the storage/recovery of the register data is performed by such drive ferroelectric element when the power is switched on/off, but the electricity consumption of the drive ferroelectric element can be decreased as much as possible by only declining the voltage level for the drive ferroelectric element.

For example, when the first supply voltage VDD1 is driven by the loop structure portion LOOP with 3.3 [V], if the second supply VDD2 is driven by the non-volatile storage portion NVM with 1.5 [V], it is enough to drive the ferroelectric element without consuming large unnecessary electricity.

Figure 45:
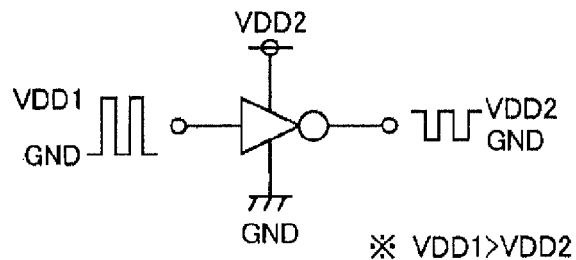
FIG. 45 illustrates a diagram showing an example of the using inverter INV6, INV7 when the second supply voltage VDD2 is lower than the first supply voltage VDD1.

Thus, in the situation where the loop structure portion LOOP is driven by high voltage while the non-volatile driven by low voltage, it's not necessary to make the inverter INV6 and INV7 forming the circuit separating portion SEP have a level shifting function (referring to FIG. 2 or FIG. 8), as shown in FIG. 45, a simple inverter driven by the second supply voltage VDD2 lower than the first supply voltage VDD1 can be used.

Besides, new structures by flexibly combining the different embodiments described can easily come to the mind of the technicians of this field; these structures also belong to the technical category of the present invention.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. All such modifications are intended to be within the scope of the claims appended hereto.

INDUSTRIAL APPLICABILITY

The present invention is useful for the non-volatility of the processors for achieving logic operation circuit, logic operating device, CPU, MPU and DSP and the data hold devices carried on portable device.

What is claimed is:

1. A data hold device, comprising:
   a loop structure portion, holding data by using a plurality of logic gates connected in a loop form;
   a non-volatile storage portion, storing data held in the loop structure portion in a non-volatile manner by using hysteresis characteristics of a ferroelectric element; and
   a circuit separating portion, electrically separating the loop structure portion and the non-volatile storage portion;
   wherein the data hold device comprises a control circuit comprising:
      an internal clock generating portion and a control portion, wherein the internal clock generating portion starts generating an internal clock signal required by the control portion to perform action when a specific signal pattern appears in a trigger signal, continually generates the internal clock signal until the control portion completes predetermined processing, and then stops generating the internal clock signal;
   wherein the control portion uses the internal clock signal to perform the predetermined processing, and the control circuit serves as a mechanism for generating the control signals for the loop structure portion, the non-volatile storage portion and the circuit separating portion.

2. The data hold device according to claim 1, wherein the non-volatile storage portion comprises a switch element, and the switch element causes short circuit between two ends of the ferroelectric element when a supply voltage of the data hold device is switched on/off.

3. The data hold device according to claim 2, further comprising a protection signal generating circuit, wherein the protection signal generating circuit generates a protection signal switching on the switch element when the supply voltage of the data hold device is switched on/off.

4. The data hold device according to claim 3, wherein the switch element is an N-channel field effect transistor; and the protection signal generating circuit maintains the protection signal at a high level until a period that the supply voltage at least reaches an operable voltage of a CMOS circuit.

5. The data hold device according to claim 4, wherein the protection signal generating circuit comprises: a P-channel field effect transistor, having a source connected to an applying end of the supply voltage, a gate connected to an input end of an input signal, and a drain connected to an output end of the protection signal; and an N-channel field effect transistor, having a source connected to the ground end, a gate connected to the input end of the input signal, and a drain connected to the output end of the protection signal; wherein a connecting resistance of the P-channel field effect transistor is less than that of the N-channel field effect transistor.

* * * * *